(12) United States Patent
Nakamura et al.

(10) Patent No.: US 7,116,348 B2
(45) Date of Patent: Oct. 3, 2006

(54) MEMBER TO BE RECOGNIZED FOR ALIGNMENT; HEAD UNIT AND ELECTRONIC DEVICE PROVIDED THEREWITH; METHOD OF MANUFACTURING LCD, ORGANIC EL DEVICE, ELECTRON EMISSION DEVICE, PDP DEVICE, ELECTROPHORETIC DISPLAY DEVICE, COLOR FILTER, AND ORGANIC EL; METHOD OF FORMING SPACER, METALLIC WIRE, LENS, RESIST, AND LIGHT DIFFUSION MEMBER, EACH OF SAID METHODS USING SAID HEAD UNIT

(75) Inventors: Shinichi Nakamura, Okaya (JP); Yoshiaki Yamada, Shimosuwa-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/150,104

(22) Filed: Jun. 13, 2005

(65) Prior Publication Data

US 2005/0231555 A1 Oct. 20, 2005

Related U.S. Application Data

(62) Division of application No. 10/268,895, filed on Oct. 11, 2002, now Pat. No. 6,933,958.

(30) Foreign Application Priority Data

Oct. 19, 2001 (JP) ............................. 2001-322827

(51) Int. Cl.
*B41J 27/00* (2006.01)
*B41J 23/00* (2006.01)

(52) U.S. Cl. ........................................ 347/256; 347/37
(58) Field of Classification Search ................... 347/5, 347/7, 9, 12, 54, 37, 44–47, 49, 67, 241, 347/256; 349/155
See application file for complete search history.

(56) References Cited

U.S. PATENT DOCUMENTS

| 5,946,584 | A | 8/1999 | Ishikiriyama |
| 6,501,527 | B1 * | 12/2002 | Hirose et al. ............... 349/155 |
| 6,702,419 | B1 | 3/2004 | Stoessel et al. |
| 2003/0013340 | A1 | 1/2003 | Martin et al. |
| 2003/0063154 | A1 | 4/2003 | Goto |

FOREIGN PATENT DOCUMENTS

JP A-03-183116 8/1991

* cited by examiner

*Primary Examiner*—Hai Pham
(74) *Attorney, Agent, or Firm*—Oliff & Berridge, plc

(57) ABSTRACT

A method of manufacturing a device includes introducing each color of material into a plurality of liquid droplet ejection heads and scanning the plurality of liquid droplet ejection heads relative to a substrate through a head unit to selectively eject the material, wherein the head unit includes a carriage with two members recognized for alignment, each member being disposed in an object set in position and having formed therein a mark for image-wise recognition, each member comprising a member main body formed substantially in a columnar shape and having a mirror-finished front end surface, wherein the marks are formed into a depressed shape in a substantially central part of the front end surface of each member main body and the marks are disposed at a distance from each other, and the plurality of liquid droplet ejection heads mounted on the carriage.

19 Claims, 67 Drawing Sheets

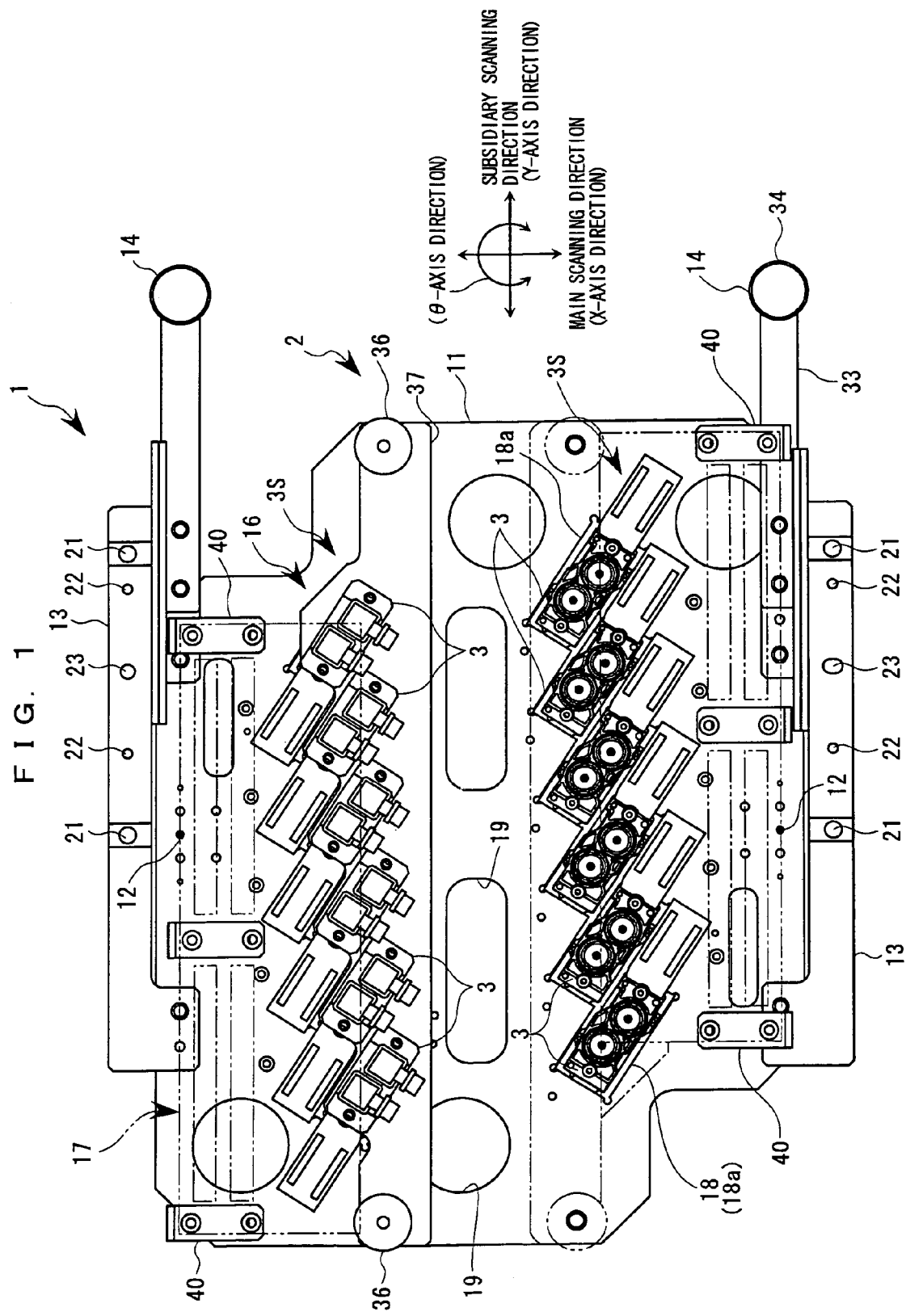

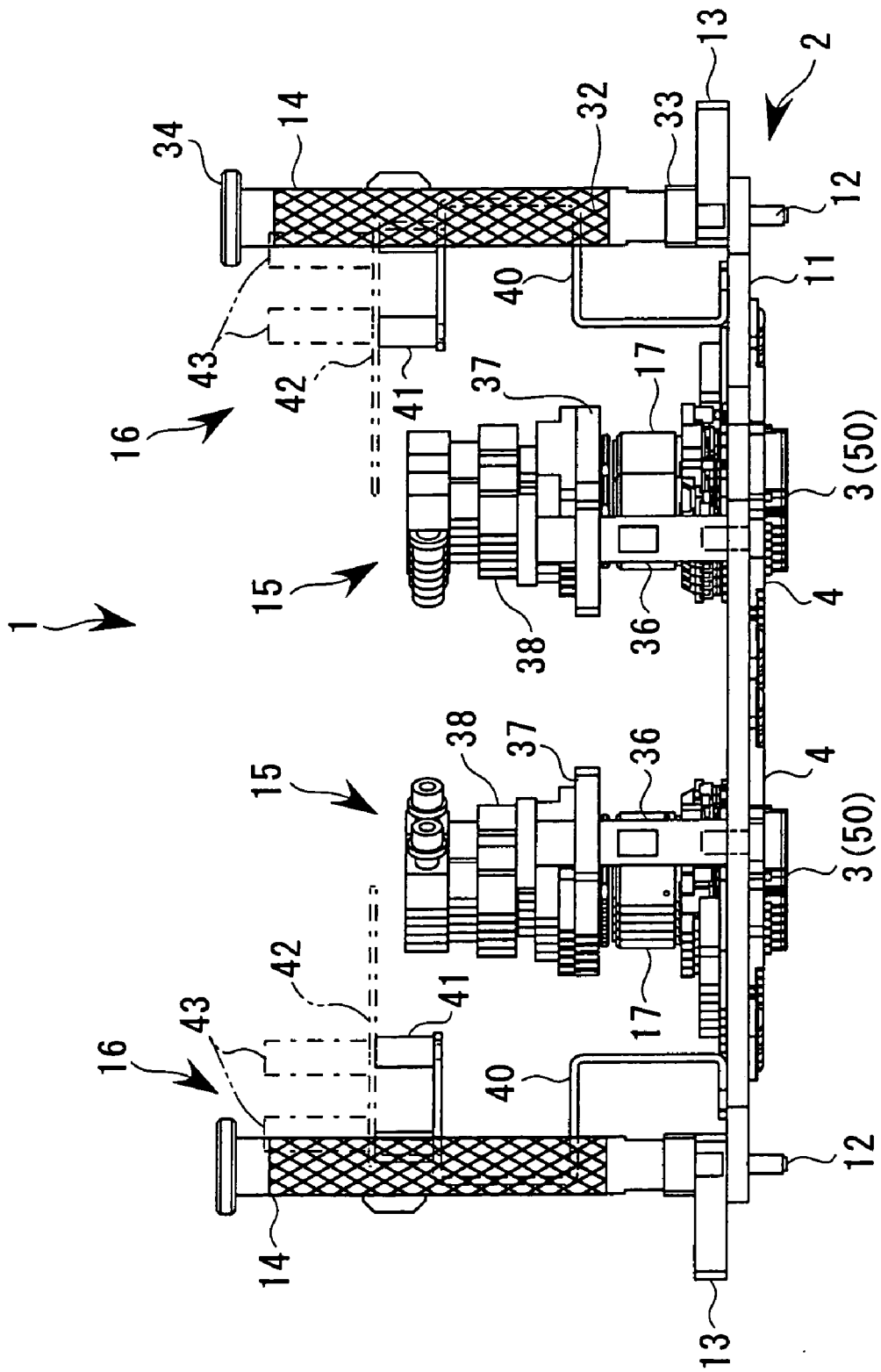

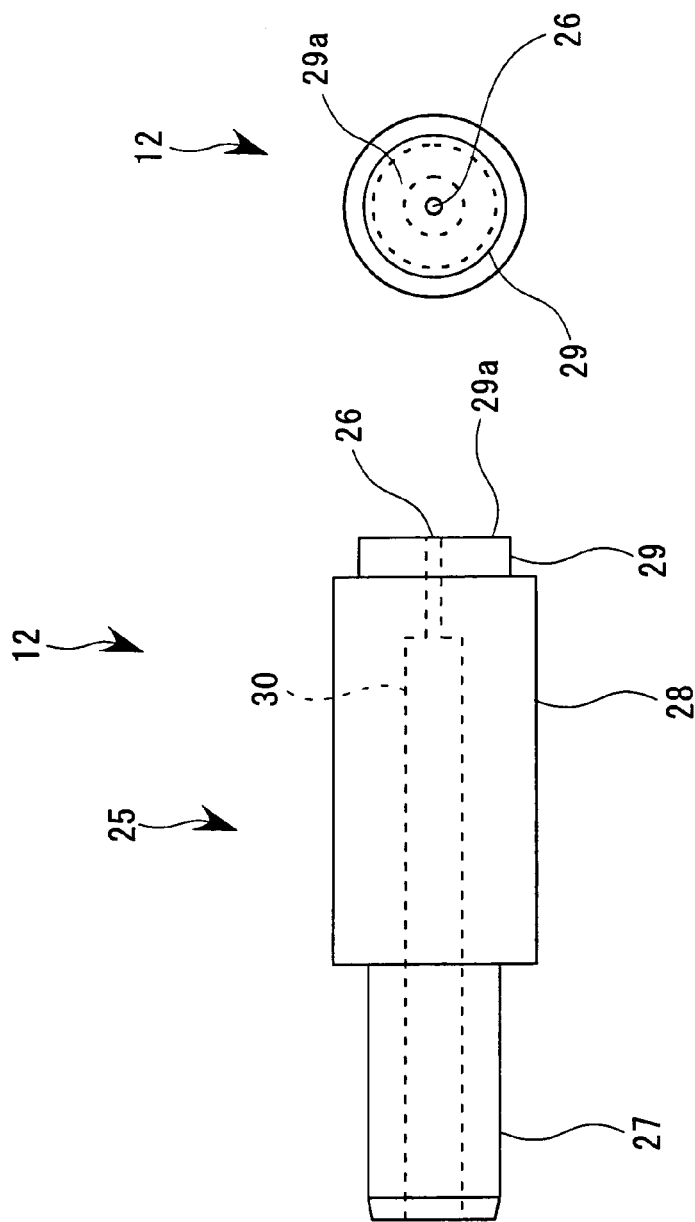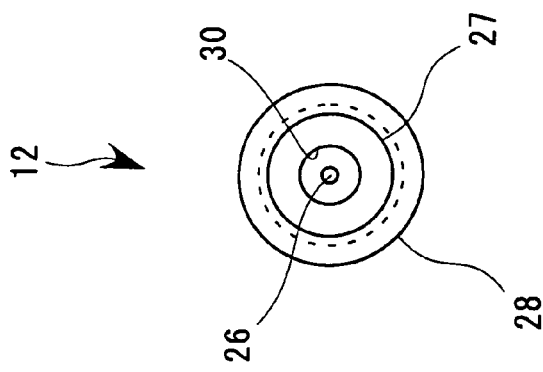

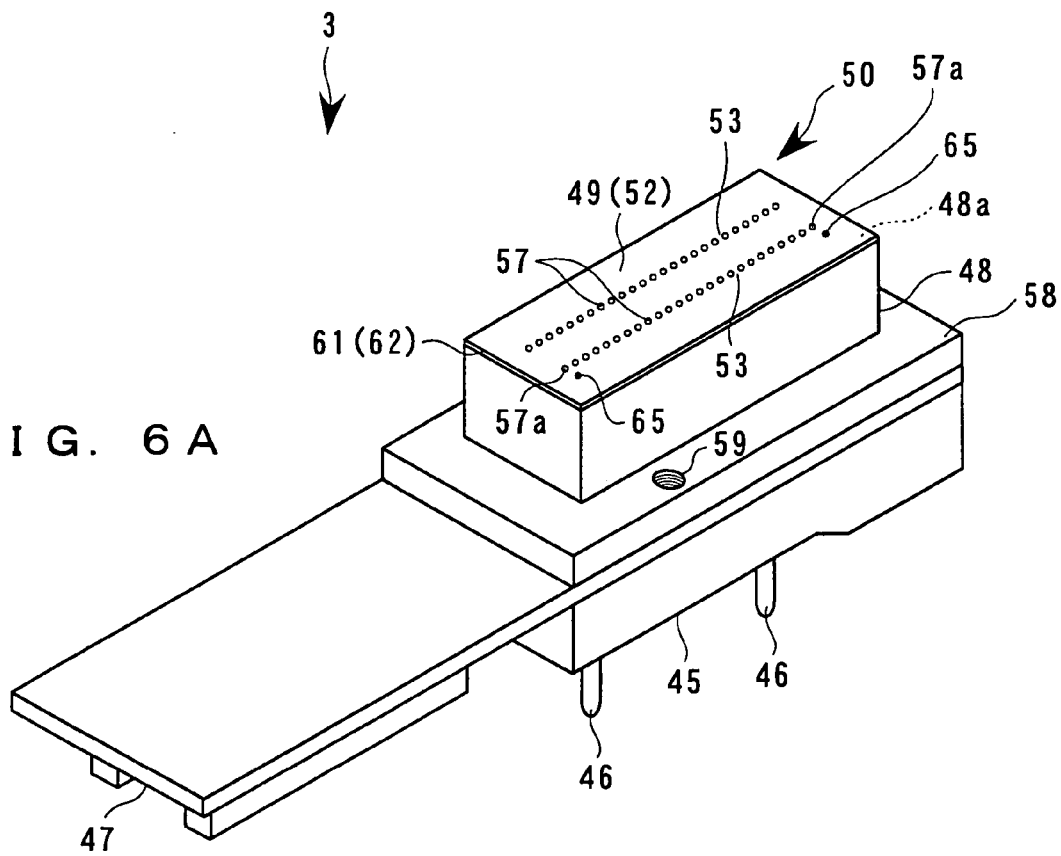
F I G. 6A
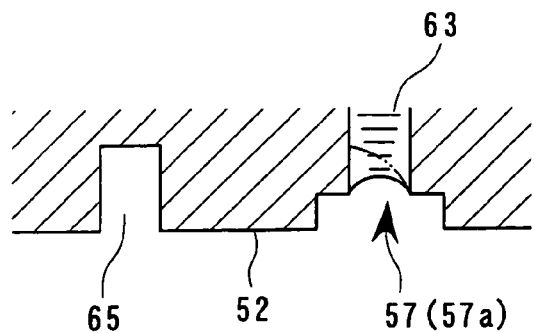
F I G. 6B

F I G. 1 5
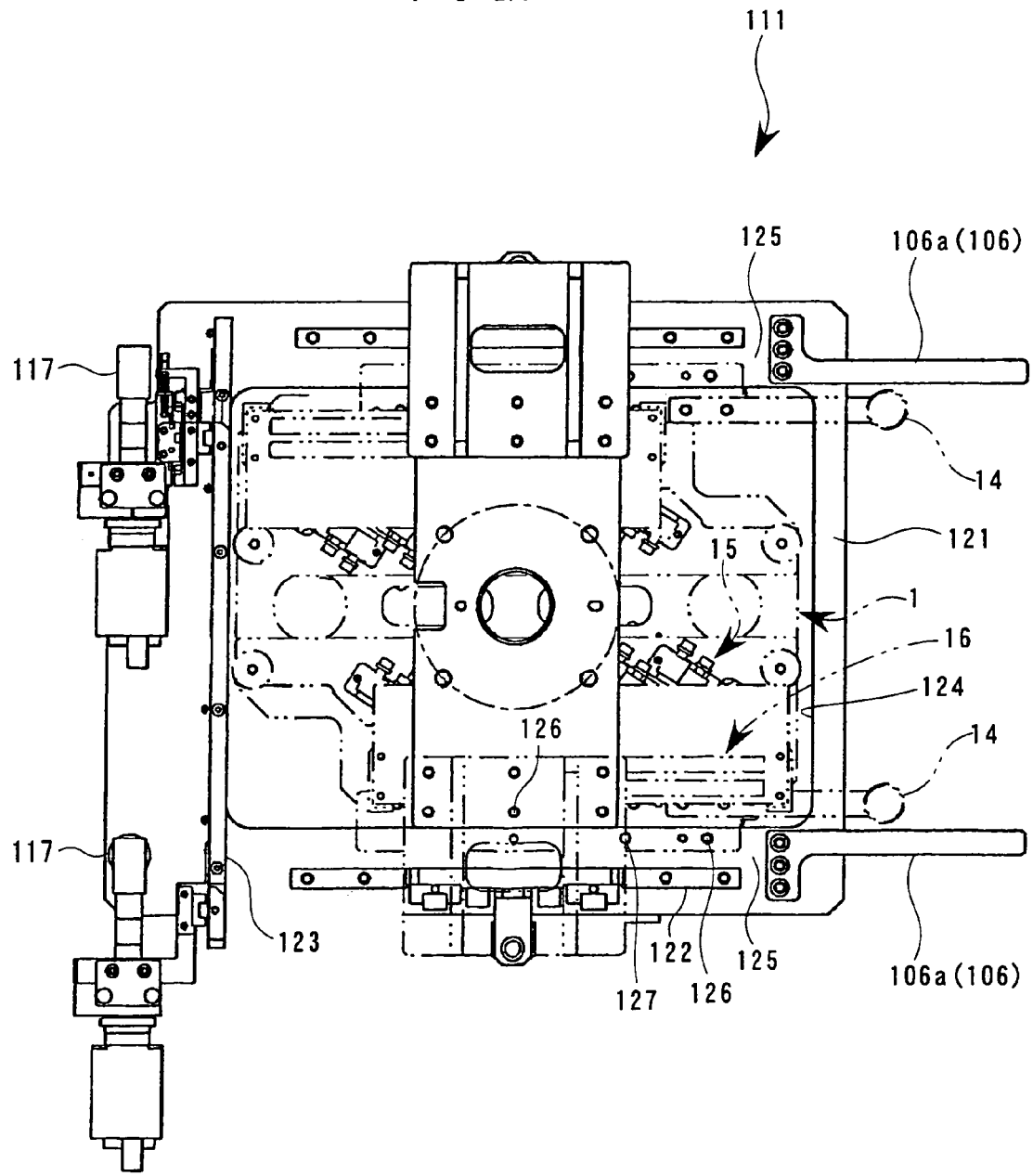

X-AXIS DIRECTION

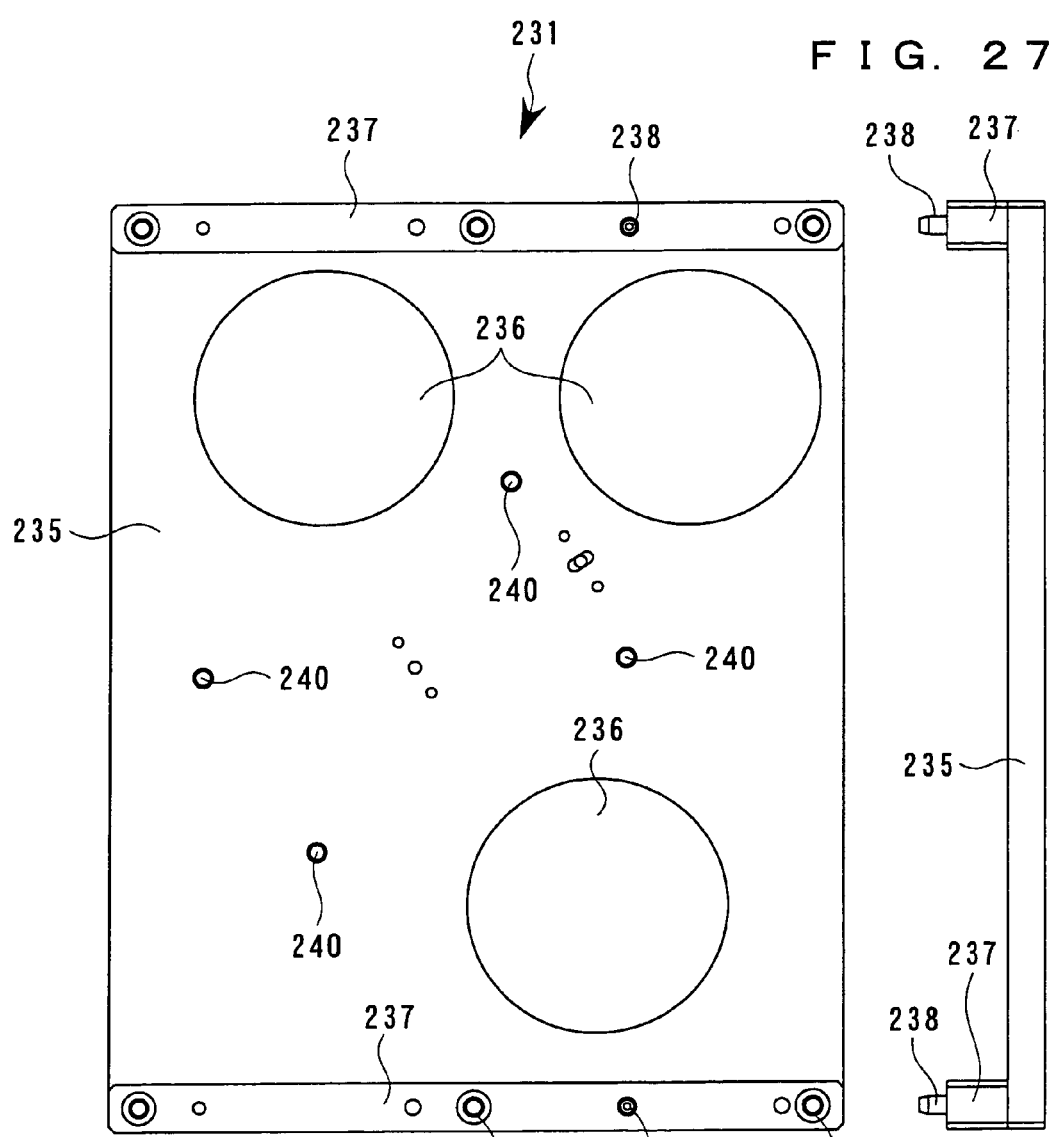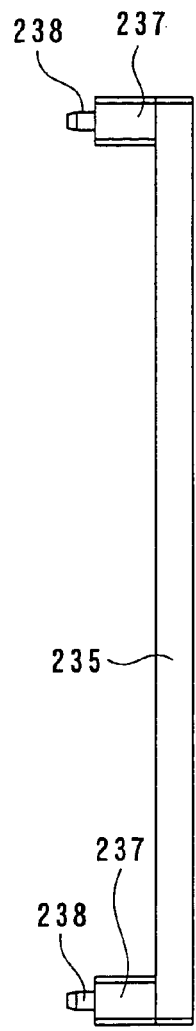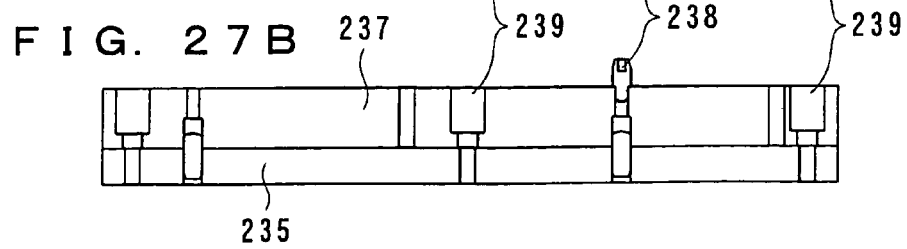

F I G. 4 8
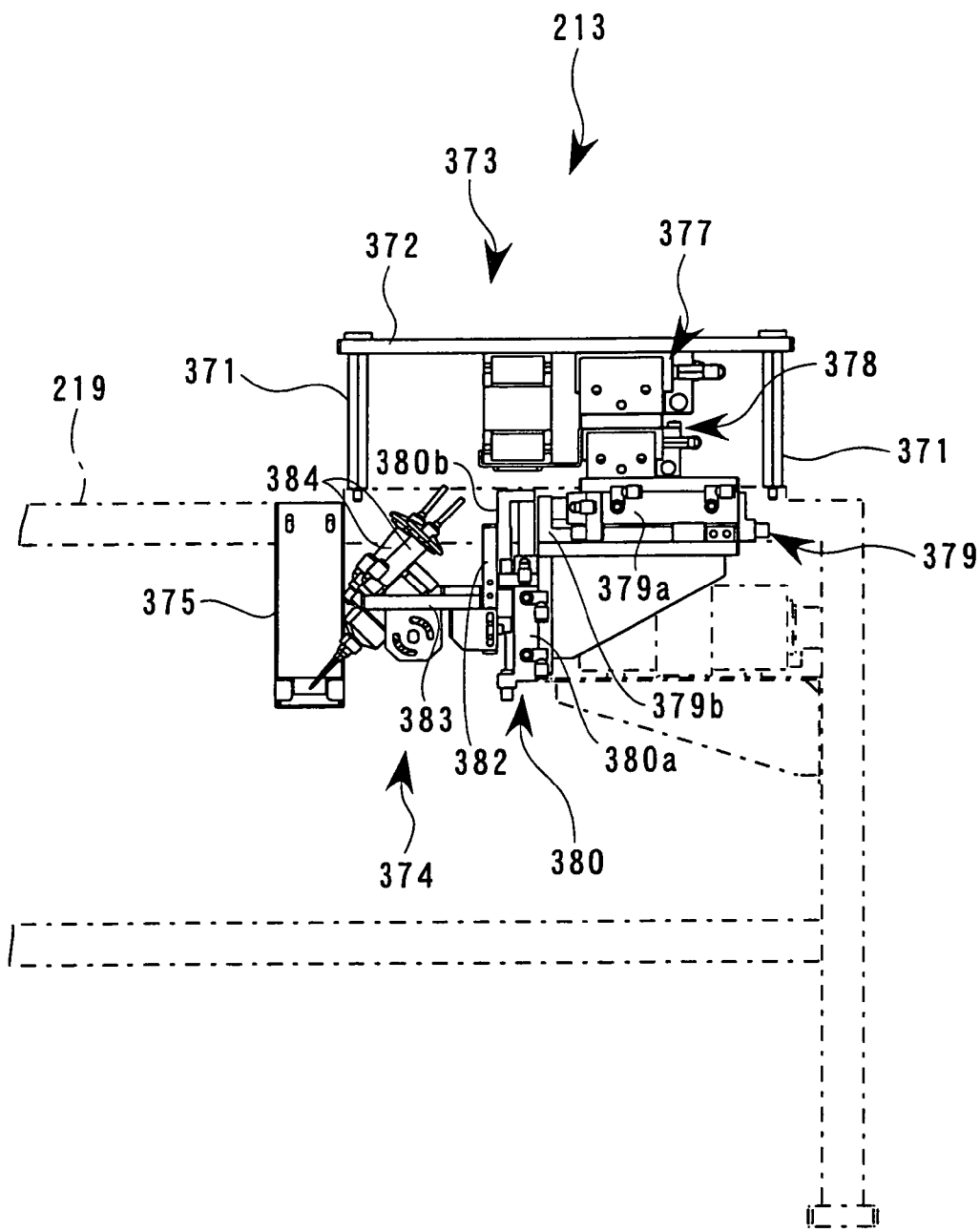

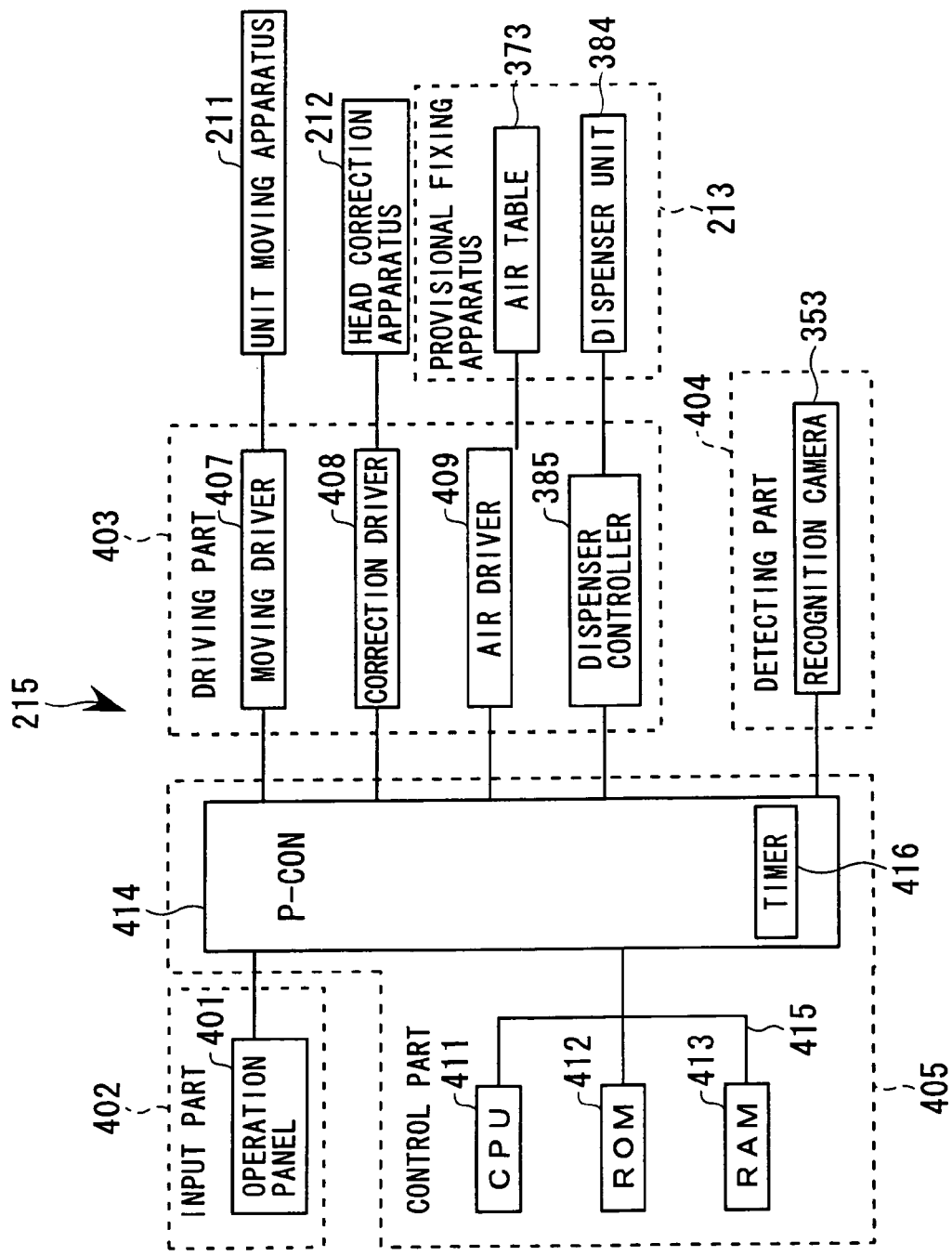

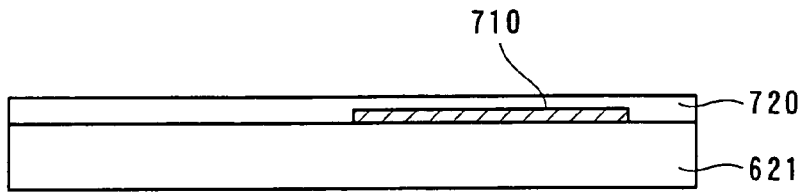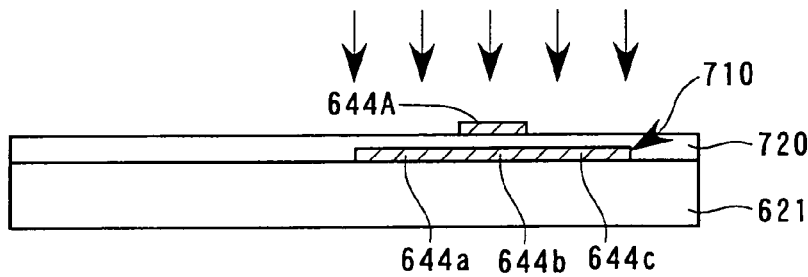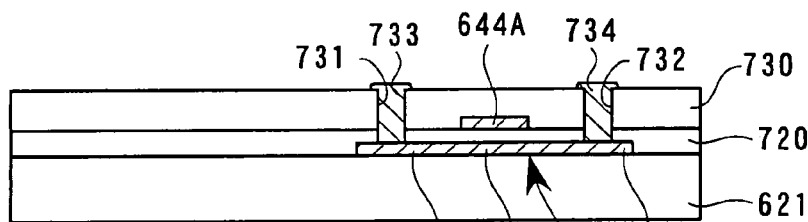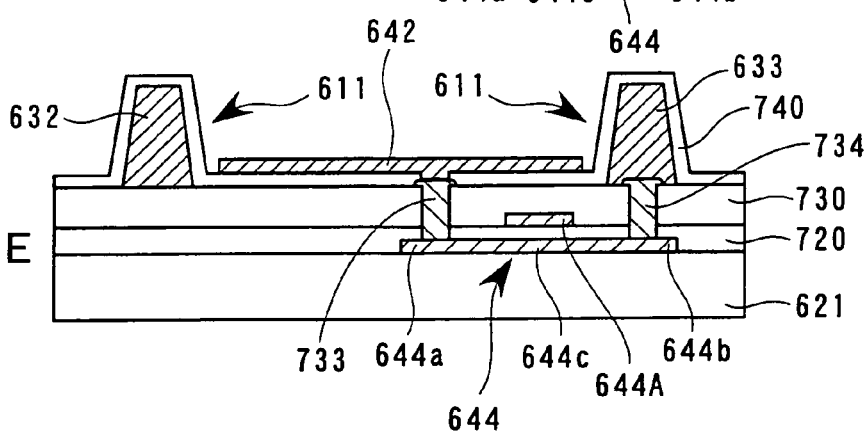

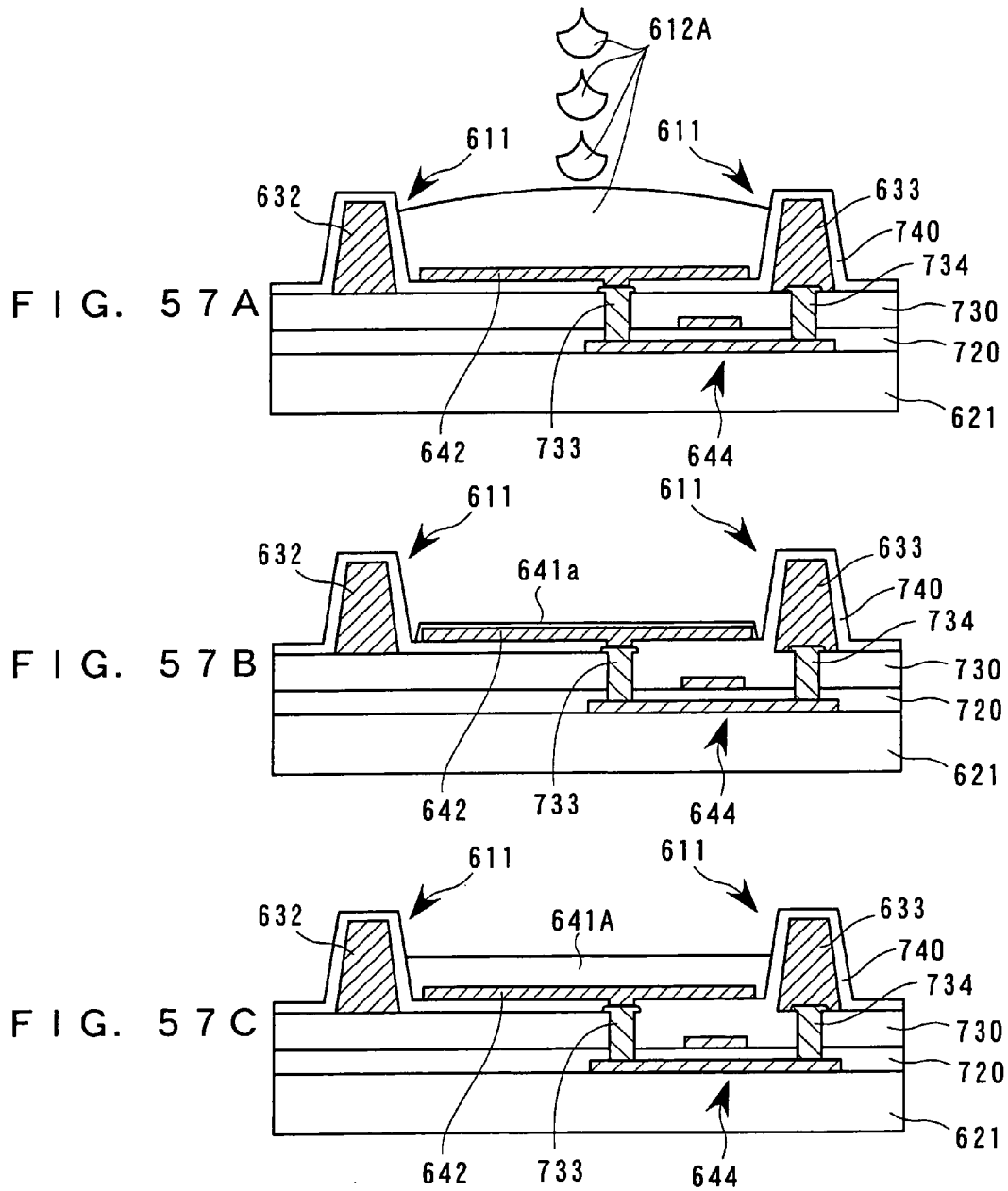

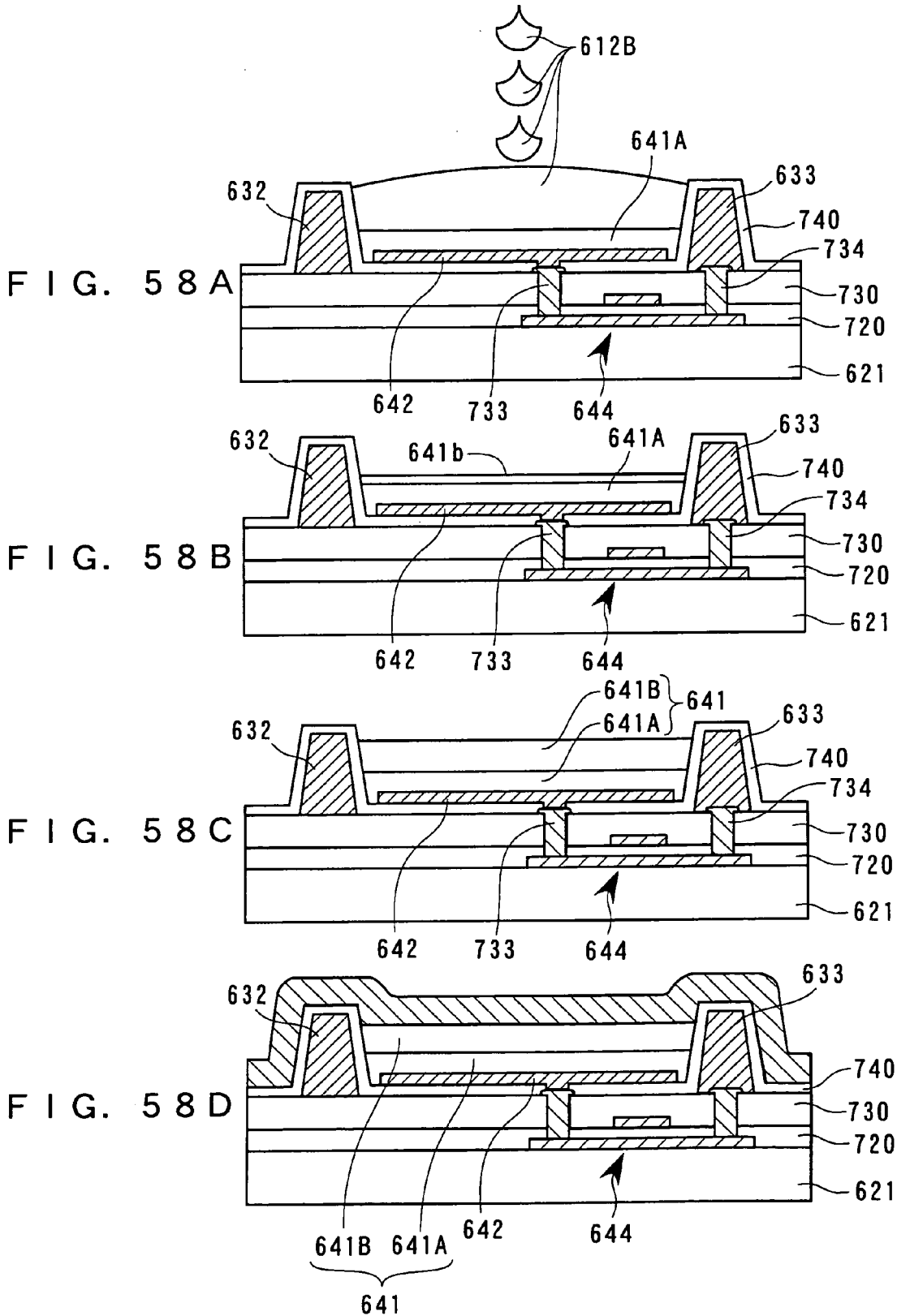

MEMBER TO BE RECOGNIZED FOR ALIGNMENT; HEAD UNIT AND ELECTRONIC DEVICE PROVIDED THEREWITH; METHOD OF MANUFACTURING LCD, ORGANIC EL DEVICE, ELECTRON EMISSION DEVICE, PDP DEVICE, ELECTROPHORETIC DISPLAY DEVICE, COLOR FILTER, AND ORGANIC EL; METHOD OF FORMING SPACER, METALLIC WIRE, LENS, RESIST, AND LIGHT DIFFUSION MEMBER, EACH OF SAID METHODS USING SAID HEAD UNIT

This is a Division of application Ser. No. 10/268,895 filed Oct. 11, 2002, now U.S. Pat. No. 6,933,958. The entire disclosure of the prior application is hereby incorporated by reference herein in its entirety.

BACKGROUND OF THE INVENTION

1. Field of the Invention

This invention relates to a member to be recognized for alignment which has formed therein a mark for use in image-wise recognition (i.e., recognition by means of an image), a head unit and an electronic device provided with the member to be recognized for alignment; as well as a method of manufacturing a liquid crystal display device, a method of manufacturing an organic electroluminescence (EL) device, a method of manufacturing an electron emission device, a method of manufacturing a plasma display panel (PDP) device, a method of manufacturing an electrophoretic display device, a method of manufacturing a color filter, a method of manufacturing an organic EL, a method of forming a spacer, a method of forming a metallic wire, a method of forming a lens, a method of forming a resist, and a method of forming a light diffusion member, all these methods using the above-described member to be recognized for alignment.

2. Description of Related Art

Conventionally, as this kind of member to be recognized for alignment, i.e., a member to be used for the purpose of recognition in the course of alignment, there is used a mark, or the like, which is printed on a corner portion of, e.g., a substrate. On the other hand, in case a liquid droplet ejection head as represented by an ink jet head, is set in position (or aligned) on a carriage on which the ink jet head is mounted, there is required a predetermined positioning accuracy. The method of positioning by means of image recognition (also referred to as positioning by "image-wise" recognition) has, however, been not practiced so far.

This kind of liquid droplet ejection head can accurately and selectively eject or discharge minute (extremely small) droplets from the nozzle array. Therefore, it is applicable to the manufacturing of color filters of the liquid crystal display device, an organic electroluminescence (EL) display device, or the like. It is also expected to apply it to the manufacturing of various kinds of electronic devices, optical devices, or the like.

When this kind of applied technologies are considered, the positioning accuracy of the liquid droplet ejection head (nozzle array), and also the positioning accuracy of a carriage on which the liquid droplet ejection head is mounted becomes an important factor. The technology of image recognition thus becomes necessary.

For example, in performing the positional recognition of the carriage (i.e., recognition of the position of the carriage), if the above-described recognition technology for the substrate is applied, it is difficult to secure the contrast between a part (corner portion) of the carriage or a mark and the background thereof. There is thus a possibility of wrong recognition. In addition, when a recognition camera to be used for the image recognition is moved, there is a problem in that the liquid droplet ejection head mounted on the carriage becomes a hindrance to the movement.

This invention has an object of providing: a member to be recognized for alignment which is simple in construction and is surely capable of image-wise recognition; a head unit and an electronic device provided with the member to be recognized for alignment; as well as a method of manufacturing a liquid crystal display device, a method of manufacturing an organic EL device, a method of manufacturing an electron emission device, a method of manufacturing a PDP device, a method of manufacturing an electrophoretic display device, a method of manufacturing a color filter, a method of manufacturing an organic EL, a method of forming a spacer, a method of forming a metallic wire, a method of forming a lens, a method of forming a resist, and a method of forming a light diffusion member, all using the above-described member to be recognized for alignment.

SUMMARY OF THE INVENTION

According to this invention, there is provided a member to be recognized for alignment, the member being disposed in an object to be set in position and having formed therein a mark for image-wise recognition. The member comprises a member main body formed substantially in a columnar shape and having a mirror-finished front end surface, and the mark is formed into a depressed shape in substantially central part of the front end surface of the member main body.

According to this arrangement, since the front end surface of the member main body which is formed substantially in a columnar shape is subjected to mirror finishing, the depressed mark at the front surface is image-wise recognized as a dark color and the mirror-finished portion as a light color due to light reflection, whereby the contrast (dark and light) between the two becomes clear. Therefore, the wrong recognition can be prevented at the time of image recognition. Particularly, when pattern recognition is performed, the failure in recognition can be prevented. In addition, since the member main body is formed into a columnar shape, a sufficient distance can be secured between the object for positioning on which the object is disposed and the recognition camera. It is therefore possible to prevent the recognition camera from interfering with other parts which are provided on the object to be aligned (positioned). Still furthermore, due to a simple construction in which a depressed mark is formed inside the surface subjected to mirror-finishing such as lapping, a sufficient contrast can be obtained, whereby an alignment mark can be simply formed.

Preferably, the member main body is formed substantially in a circular column, an elliptic column, or a square column, and the mark is formed by minute drilling work.

According to this arrangement, a dark-color mark is recognized in substantially the white central portion of circular, elliptical, or polygonal shape. In pattern recognition, in particular, a sure recognition becomes possible. Further, since the mark is formed by minute drilling work, it can be formed simply and at a higher accuracy.

Preferably, the front end surface of the member main body is formed into a size capable of falling within a scope of view of a recognizing camera which image-wise recognizes the mark.

This arrangement is particularly effective in pattern recognition, so that the recognition can be made in a sure manner.

Preferably, the head unit comprises: a carriage in which two of the members to be recognized for alignment as set forth above are disposed at a distance from each other; and a liquid droplet ejection head which is mounted on the carriage.

According to this arrangement, at the time of positioning of the liquid droplet ejection head to the carriage, or the positioning of the carriage to the apparatus on which it is mounted, the positional recognition of the carriage can be adequately and accurately made. Especially, since there are provided two members to be recognized for alignment at a distance from each other, the position of the carriage can be accurately recognized not only in the X-axis direction and Y-axis direction, but also in Θ-axis direction (inclination angle).

As the liquid droplet ejection head, there is a system in which voltage is applied to a piezoelectric element and its deformation is utilized to thereby eject a liquid droplet, a system in which a liquid droplet is instantly heated by a heater so that the evaporation (volume expansion) is utilized to thereby eject the liquid droplet, or the like. Any one of them will do the purpose.

Preferably, the marks in the two members to be recognized for alignment are disposed on a plane which is substantially parallel with a nozzle forming surface of the liquid droplet ejection head.

According to this arrangement, when the positional recognition of the carriage is performed by using the recognition camera, the positional recognition of the liquid droplet ejection head becomes also possible in succession thereto. Therefore, in case it is necessary to perform the positional recognition of the liquid droplet ejection head in addition to the positional recognition of the carriage, the recognition work can be performed efficiently and quickly.

Preferably, the carriage is formed substantially into a rectangle, and the two members to be recognized for alignment are positioned substantially in an intermediate position in a direction of a long side of the carriage and are disposed at a distance from each other in a direction of a short side thereof.

According to this arrangement, since the two members to be recognized can be recognized by the movement of the carriage or the recognition camera in one direction, the recognition work can be performed quickly.

Preferably, the liquid droplet ejection head projects from the nozzle forming surface and the member to be recognized for alignment are disposed such that a front end surface of the member main body is positioned in substantially the same plane as the nozzle forming surface of the liquid droplet ejection head.

According to this arrangement, it is possible to effectively prevent the interference between the liquid droplet ejection head and the recognition camera which relatively moves for the image recognition. In case it is necessary to perform the positional recognition of the liquid droplet ejection head, in addition to the positional recognition of the carriage, it is not necessary to move the position of focal point of the recognition camera.

According to another aspect of this invention, there is provided an electronic device comprising: a head unit as set forth above; a recognition camera for image-wise recognizing both marks of the two members to be recognized for alignment; and moving means for relatively moving the head unit and the recognition cameras.

According to this arrangement, even if the scope of view of the recognition camera is narrow, both the marks of the two members to be recognized which are separate apart from each other can be adequately image-wise recognized by relatively moving the head unit and the recognition camera by the moving means.

The electronic device referred to above includes: various kinds of electronic devices on which are mounted printers and the liquid droplet ejection heads (ink jet heads); an apparatus for manufacturing a part or parts of display device such as an liquid crystal, an organic EL, an electron emission device, a PDP, an electrophoresis (so-called E-ink), or the like, to which the liquid droplet ejection heads can be applied; as well as an apparatus for manufacturing various kinds of electronic devices, photo devices, or the like. In other words, this term "electronic device" means all kinds of apparatuses in which the liquid droplets, minute capsules, or the like, are required to be ejected in the form of dots.

Preferably, the electronic device comprises: holding means for holding the head unit, wherein the holding means holds the head unit such that, by a relative movement of the recognizing camera in one of X-axis direction and Y-axis direction by the moving means, the two marks can be respectively taken into scopes of view.

According to this arrangement, the image-wise recognition of the head unit (carriage) can be made by the simple relative movement of either in the X-axis direction or in the Y-axis direction, whereby the image recognition can be surely and quickly made. Further, the failure in recognition in the pattern recognition can be prevented.

Preferably, the electronic device further comprises correction means for correcting the position of the head unit based on a result of recognition by the recognition camera.

According to this arrangement, subsequent to the positional recognition of the head unit (carriage), the positional correction of the head unit (carriage) based on the result of the recognition can be efficiently performed in succession.

According to another aspect of this invention, there is provided a method of manufacturing a liquid crystal display device in which a multiplicity of filter elements are formed on a substrate by using the head unit as set forth above, comprising the steps of: introducing each color of filter material into the plurality of liquid droplet ejection heads; and scanning the plurality of liquid droplet ejection heads relative to the substrate through the head unit to selectively eject the filter material, whereby the multiplicity of the filter elements are formed.

According to another aspect of this invention, there is provided a method of manufacturing an electronic emission device in which a multiplicity of fluorescent members are formed on a substrate by using the head unit as set forth above, comprising the steps of: introducing each color of fluorescent material into the plurality of liquid droplet ejection heads; and scanning the plurality of liquid droplet ejection heads relative to the substrate through the head unit to selectively eject the fluorescent material, whereby the multiplicity of the fluorescent members are formed.

According to another aspect of this invention, there is provided a method of manufacturing a PDP device in which fluorescent members are formed in a multiplicity of depressed portions on a back substrate by using the head unit as set forth above, comprising the steps of: introducing each color of fluorescent material into the plurality of liquid droplet ejection heads; and scanning the plurality of liquid droplet ejection heads relative to the substrate through the head unit to selectively eject the fluorescent material, whereby the multiplicity of the fluorescent bodies are formed.

According to another aspect of this invention, there is provided a method of manufacturing an electophoretic display device in which electrophoretic members are formed in a multiplicity of depressed portions on a substrate by using the head unit as set forth above, comprising the steps of: introducing each color of electrophoretic material into the plurality of liquid droplet ejection heads; scanning the plurality of liquid droplet ejection heads relative to the substrate through the head unit to selectively eject the electrophoretic material, whereby the multiplicity of the electrophoretic members are formed.

By applying the above-described head unit to the method of manufacturing a liquid display device, the method of manufacturing an organic EL, a method of manufacturing an electron emission device, a method of manufacturing a PDP device, and a method of manufacturing an electrophoretic display device, a filter material, a luminescent material, or the like, which is required of each of the devices can be selectively supplied to an appropriate position in an appropriate amount. The scanning of the liquid droplet ejection heads is generally made up of the main scanning and the subsidiary scanning. In case a so-called single line is constituted by a single liquid droplet ejection head, only the subsidiary scanning applies. The electronic device includes the idea of the so-called field emission display (FED).

According to another aspect of this invention, there is provided a method of manufacturing a color filter in which a multiplicity of filter elements are arrayed on a substrate by using the head unit as set forth above, comprising the steps of: introducing each color of filter material into the plurality of liquid droplet ejection heads; and scanning the plurality of liquid droplet ejection heads relative to the substrate through the head unit to selectively eject the filter material, whereby the multiplicity of the filter elements are formed.

Preferably, the multiplicity of filter elements are contained in a depressed portion formed by projected banks provided on the substrate. The method of manufacturing a color filter further comprises the steps of: introducing a bank material into the plurality of liquid droplet ejection heads before forming the filter elements; and scanning the plurality of liquid droplet ejection heads relative to the substrate through the head unit to selectively deject the bank material, whereby the banks are formed.

Preferably, an overcoat film is formed to coat the multiplicity of filter elements and the banks. The method of manufacturing a color filter further comprises the steps of: introducing a translucent coating material into the plurality of liquid droplet ejection heads after forming the filter elements; and scanning the plurality of liquid droplet ejection heads relative to the substrate through the head unit to selectively eject the coating material, whereby the overcoat film is formed.

According to another aspect of this invention, there is provided a method of manufacturing an organic EL in which a multiplicity of pixels inclusive of EL light emitting layers are arrayed on a substrate by using the head unit as set forth above, comprising the steps of: introducing each color of light emitting material into the plurality of liquid droplet ejection heads; and scanning the plurality of liquid droplet ejection heads relative to the substrate through the head unit to selectively eject the light emitting material, whereby the EL light emitting layers are formed.

Preferably, the multiplicity of EL light emitting layers are contained in a depressed portion formed by a projecting bank provided on the substrate, and the method of manufacturing an organic EL further comprises the steps of: introducing a bank material into the plurality of liquid droplet ejection head before forming the EL light emitting layers; and scanning the plurality of liquid droplet ejection heads relative to the substrate through the head unit to selectively eject the bank material, whereby the bank is formed.

Preferably, a multiplicity of pixel electrodes are formed corresponding to the EL light emitting layers between the multiplicity of EL light emitting layers and the substrate. The method of manufacturing an organic EL further comprises the steps of: introducing a liquid electrode material into the plurality of liquid droplet ejection head before forming the banks; and scanning the plurality of liquid droplet ejection heads relative to the substrate through the head unit to selectively eject the liquid electrode material, whereby the multiplicity of pixel electrodes are formed.

Preferably, an opposite electrode is formed so as to cover the multiplicity of EL light emitting layers and the banks. The method of manufacturing an organic EL further comprises the steps of: introducing a liquid electrode material into the plurality of liquid droplet ejection heads after forming the light emitting layers; and scanning the plurality of liquid droplet ejection heads relative to the substrate through the head unit to selectively eject the liquid electrode material, whereby the opposite electrode is formed.

According to another aspect of this invention, there is provided a method of forming a spacer in which a multiplicity of particulate spacers are formed to constitute minute cell gaps between two substrates by using the head unit as set forth above. The method comprises the steps of: introducing a particulate material constituting the spacers into the plurality of liquid droplet ejection heads; and scanning the plurality of liquid droplet ejection heads relative to at least one of the substrates through the head unit to selectively eject the particulate material, whereby the spacers are formed on the substrates.

According to another aspect of this invention, there is provided a method of forming a metallic wire on a substrate by using the head unit as set forth above. The method comprises the steps of: introducing a liquid metallic material into the plurality of liquid droplet ejection heads; and scanning the plurality of liquid droplet ejection heads relative to the substrate through the head unit to selectively eject the metallic material, whereby the metallic wire is formed on the substrate.

According to another aspect of this invention, there is provided a method of forming a multiplicity of microlenses on a substrate by using the head unit as set forth above. The method comprises the steps of: introducing a lens material into the plurality of liquid droplet ejection heads; and scanning the plurality of liquid droplet ejection heads relative to the substrate through the head unit to selectively eject the lens material, whereby the large number of microlenses are formed.

According to another aspect of this invention, there is provided a method of forming a resist of an arbitrary shape on a substrate by using the head unit as set forth above. The method comprises the steps of: introducing a resist material into the plurality of liquid droplet ejection heads; and scanning the plurality of liquid droplet ejection heads relative to the substrate through the head unit to selectively eject the resist material, whereby the resist is formed.

According to another aspect of this invention, there is provided a method of forming a multiplicity of light diffusion members on a substrate by using the head unit as set forth above. The method comprises the steps of: introducing a light diffusion material into the plurality of liquid droplet ejection heads; and scanning the plurality of liquid droplet ejection heads relative to the substrate through the head unit to selectively eject the light diffusing material, whereby the multiplicity of light diffusing members are formed.

As described above, by applying the above-described head unit to the method of manufacturing a color filter, the method of manufacturing an organic EL, the method of forming a spacer, the method of forming a metallic wire, the method of forming a lens, the method of forming a resist, and the method of forming a light dispersion member, the filter material, the light emitting material, or the like, to be required of each of the electronic devices and teach of the optical devices can be selectively supplied in an appropriate position in an appropriate amount. The term "bank" is an idea which includes a partition wall, a rib, or the like, inclusive of projected shape of side walls irrespective of whether the side surfaces are inclined surfaces or vertical surfaces. In other words, the term "bank" refers to the portion which forms a relative projection as seen from the substrate.

BRIEF DESCRIPTION OF THE DRAWINGS

The above and other objects and the attendant advantages of this invention will become readily apparent by reference to the following detailed description when considered in conjunction with the accompanying drawings wherein:

FIG. 1 is a plan view of a head unit relating to this invention;

FIG. 3 is a side view of the head unit;

FIGS. 4A through 4C are structural representations of a standard pin;

FIGS. 6A and 6B are schematic perspective views of the liquid droplet ejection head;

FIG. 15 is a plan view of a main carriage in the picturing apparatus;

FIG. 27A though 27C are structural representations of a set table in the unit moving apparatus;

FIG. 48 is a side view of the provisional fixing apparatus;

FIG. 50 is a block diagram of a control apparatus;

FIGS. 56A through 56E are sectional views of the manufacturing step (1) schematically showing the manufacturing method of an organic EL according to first embodiment;

FIGS. 57A through 57C are sectional views of the manufacturing step (2) schematically showing the manufacturing method of the organic EL according to first embodiment;

FIGS. 58A through 58D are sectional views of the manufacturing step (3) schematically showing the manufacturing method of the organic EL according to first embodiment;

DESCRIPTION OF THE PREFERRED EMBODIMENTS

Figure 2:
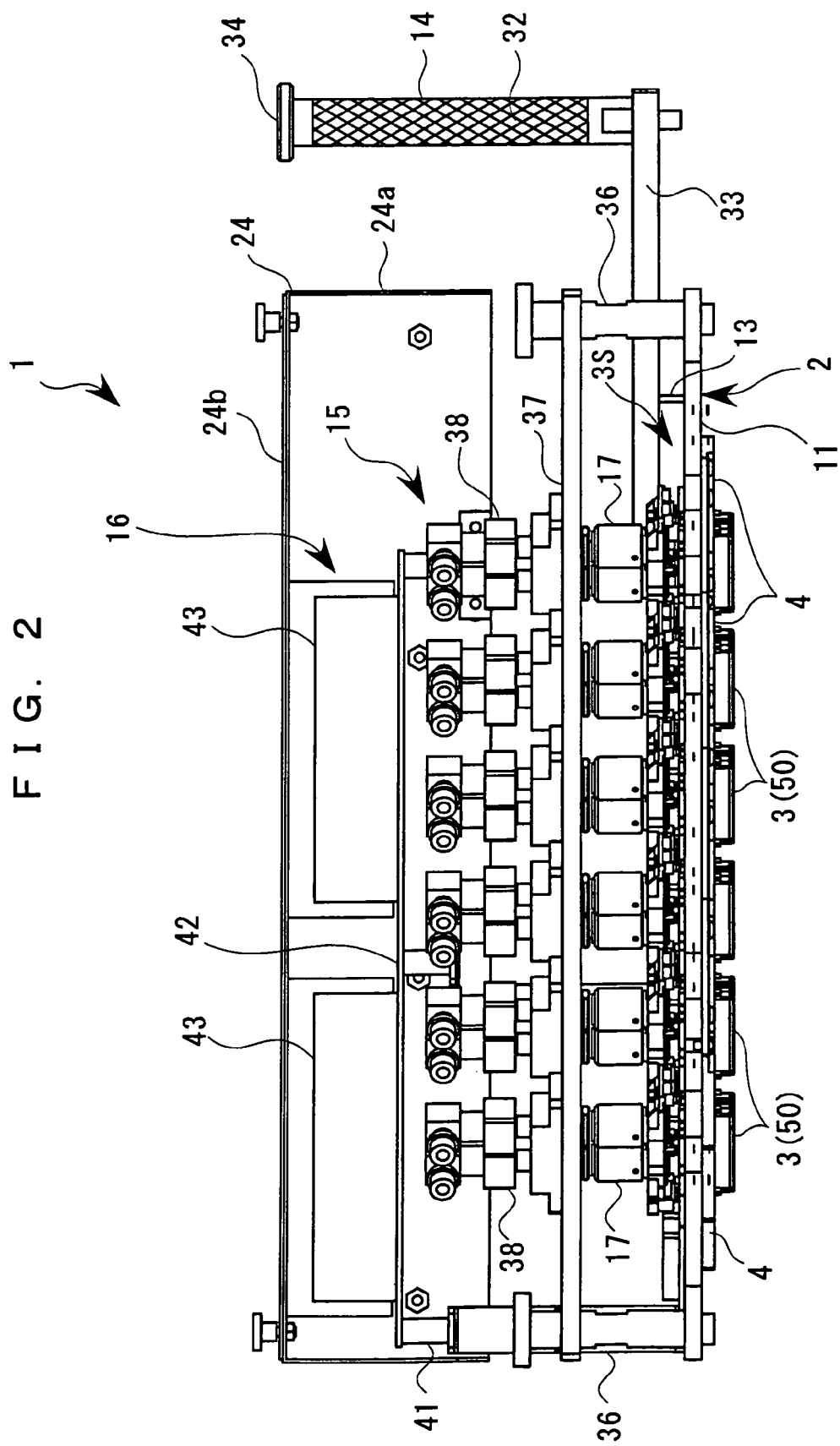
FIG. 2 is a front view of the head unit.
Figure 5:
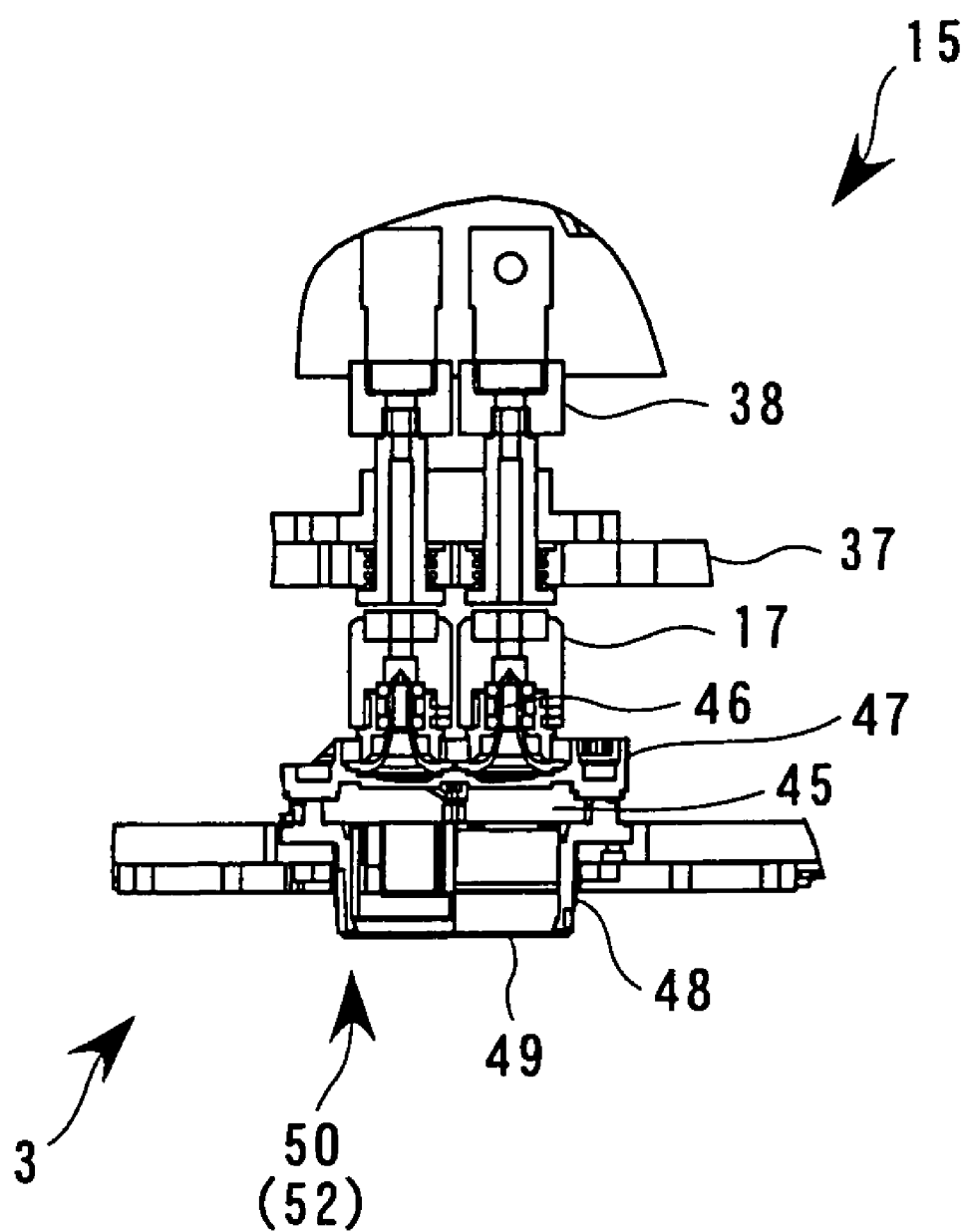
FIG. 5 is a sectional view of a liquid droplet ejection head.

A description will now be made about the preferred embodiments of this invention with reference to the accompanying drawings. An ink jet head (a liquid droplet ejection head) of an ink jet printer is capable of discharging minute or extremely small liquid ink droplets (liquid droplets) in the form of dots at a high accuracy. Therefore, by using special inks, photosensitive resins, or the like, as the liquid droplets (the liquid to be ejected from the nozzle), the ink jet head is expected to be utilized in the field of manufacturing various parts. In this kind of applied technologies, it is estimated that a large effect is sometimes given to the durability of the droplet ejection head for discharging liquids such as a highly viscous liquid to be ejected. Therefore, it is necessary to be able to readily supply a head unit in which a plurality of liquid droplet ejection heads are built at a high accuracy.

An apparatus for assembling a head unit (also referred to as a head unit assembly apparatus) according to this embodiment is disposed side by side with an apparatus for manufacturing a color filter (this apparatus is hereinafter also referred to as "a picturing apparatus"). This color filter is to be built into a flat display of a crystal liquid display device, or the like. The head unit is arranged to be readily supplied any time to this picturing apparatus. This picturing apparatus is provided with a plurality of liquid droplet ejection heads which eject color filter materials of red (R), green (G), and blue (B) in color to filter elements of a color filter. The head unit assembly apparatus is arranged such that the plurality of liquid droplet ejection heads are built into a carriage at a high accuracy, thereby assembling a head unit so that the head unit can be supplied to the picturing apparatus where necessary.

The procedure of assembling the head unit is as follows. Namely, each of the liquid droplet ejection heads is respectively built into a head holding member in an aligned or positioned state. It is then provisionally mounted on a single carriage. Then, after positioning each of the liquid droplet ejection heads relative to the carriage, it is provisionally fixed, and is then permanently fixed. The step of building the liquid droplet ejection heads into the head holding member, and the steps of provisional and permanent fixing thereof to the carriage are performed by manual work as outside steps (i.e., steps to be performed outside the assembly apparatus of this embodiment), and the step for aligning the plurality of liquid droplet ejection heads onto the carriage and then provisionally fixing them are performed by means of the assembly apparatus according to this embodiment.

In this embodiment, a description is first made about the head unit to be handled in this head unit assembly apparatus, the liquid droplet ejection head which is a constituting element of the head unit, the head holding member, and the carriage. In connection with the above description, a further description is made about the relationship between the head unit and the picturing apparatus, about the method of building the liquid droplet ejection head into the head holding member by means of a jig, and about an alignment mask which serves as a standard or basis for positioning the head unit. Thereafter, a description is made about the apparatus for assembling the head unit. Finally, a description is made about an example in which this head unit is applied to the method of manufacturing a so-called flat display.

Some parts or elements in the following embodiments are provided in a plurality of pieces instead of only one in number. In the following detailed descriptions, they may sometimes be referred to in a singular form instead of in a plural form. It is partly for the purpose of simplicity, or the like, and shall be understood to include a plurality of pieces, where applicable.

FIGS. 1, 2 and 3 are figures showing the construction of the head unit. As shown therein, the head unit 1 is provided with a carriage 2, liquid droplet ejection heads 3, and a plurality of (12 in concrete) head holding members 4 for respectively mounting each of the liquid droplet ejection heads 3 onto the carriage 2. Twelve liquid droplet ejection heads 3 are divided into two on the left and right sides as illustrated, each having 6 heads, and are disposed at an inclination at a predetermined angle relative to the direction of main scanning. Six liquid droplet ejection heads 3 on each side are disposed with a positional deviation from each other relative to the direction of subsidiary scanning. All the ejection nozzles 57 (to be described in detail hereinafter) of the twelve liquid droplet ejection heads 3 are arranged to be continuous (partly overlapped) in the direction of subsidiary scanning. In other words, the arrangement of the heads in this embodiment is made such that the 6 liquid droplet ejection heads 3 disposed at an inclination toward the same direction are divided into two rows on the carriage 2, and that the liquid droplet ejection heads 3 are disposed by rotating them by 180° relative to each other. The pattern of this arrangement is, however, only an example and the following arrangement is also possible. Namely, the adjacent liquid droplet ejection heads 3 in each of the head arrays may be disposed at an angle of 90° relative to the other (i.e., the adjacent heads are disposed in substantially L-shape), or else, the liquid droplet ejection heads 3 in each of the head arrays may be disposed at 90° (i.e., the array heads in each group are disposed in substantially a funnel shape). Anyway, it is sufficient if the dots by all of the 12 liquid droplet heads 3 are made to be continuous as seen in the direction of the subsidiary scanning. Further, if the liquid droplet ejection heads 3 are made to be exclusive parts of each kind of substrate, it is not necessary to take a special care to set in position the liquid droplet ejection heads 3 in an inclined manner. It is sufficient to arrange them in a staggered manner or in a stepped manner. Still furthermore, as long as the nozzle arrays (dot arrays) of a predetermined length can be arranged, they may be constituted by a single liquid droplet ejection head 3 or by a plurality of liquid droplet ejection heads 3. In other words, the number and rows of the liquid droplet ejection heads 3 and the array pattern may be arbitrarily selected.

The carriage 2 is provided with: a substantially rectangular main body plate 11 which is partly notched; a pair of left and right standard or reference pins 12, 12 which are provided in an intermediate position in the direction of longer sides of the rectangle; a pair of left and right supporting members 13, 13 which are mounted on both the longer sides of the main body plate 11; and a pair of left and right handles 14, 14 which are disposed in an end portion of each of the supporting members 13, 13. The pair of left and right handles 14, 14 serve as parts for manually holding the head unit 1 when, e.g., the assembled head unit 1 is mounted in position onto the picturing apparatus B. Further, the left and right supporting members 13, 13 serve as members for fixing the carriage 2 in position into the setting portion of the apparatus A for assembling or the picturing apparatus B (details of each being described hereinafter).

In the carriage 2 there are provided a pair of left and right pipe connection assemblies 15, 15 and a pair of left and right wiring connection assemblies 16, 16 which are positioned on an upper side of the two divided groups 3S of liquid droplet ejection heads and are to be connected to the liquid droplet ejection heads 3. Each of the pipe connection assemblies 15 is connected to the system of supplying the filter materials of the picturing apparatus B. Each of the piping connection assemblies 16 is similarly connected to the control system of the picturing apparatus B. It is to be noted that FIG. 1 is depicted by omitting one (left side) of the pipe connection assembly 15.

The main body plate 11 is constituted by a thick metallic plate such as of stainless steel, or the like, and has a pair of mounting openings or holes 18, 18 for respectively mounting six liquid droplet ejection heads 3 on the left and right sides. The main body plate 11 also has a plurality of openings 19 in suitable locations so as to reduce the weight thereof. Each of the mounting openings 18 is made up of continuation of opening parts 18a into which the six pieces of liquid droplet ejection heads 3 are mounted. An axial line of each of the mounting openings 18 is slightly inclined relative to the axial line of the main body plate 11 so as to follow the array of six liquid droplet ejection heads (liquid droplet ejection head group 3S).

Each of the supporting members 13 is made of thick stainless plate, or the like, and has two fixing holes (loose holes) 21, 21 and two bolt holes 22, 22 for fixing the supporting members 13 in position. Each of the supporting members 13 has also formed, between the fixing holes 21, 21 and the bolt holes 22, 22, a pin hole 23 for inserting thereinto a positioning pin. Although the details are given hereinbelow, when the head unit 1 is set in position into the assembly apparatus A, the pin hole 23 is used in alignment and the two fixing holes 21, 21 are used for fixing in a screwed manner. Similarly, when the picturing apparatus B is set in position in the head unit 1, the pin hole 23 is used in alignment and two bolt holes 22, 22 are used for fixing in a screwed manner.

The pair of left and right standard pins 12, 12 serve as a standard or reference, with image recognition as a prerequisite, in aligning or positioning (positional recognition) the carriage 2 in the X-axis, Y-axis and Θ-axis directions. The standard pins 12, 12 are provided so as to project toward the rear surface of the main body plate 11. As shown in FIG. 4, each of the standard pins 12, 12 is made up of a columnar pin main body 25, and a depressed, or specifically hole-like, standard mark 26 which is formed in the central portion of the front end surface of the pin main body 25. The pin main body 25 is made up of: a base press-fit portion 27 which is fit under pressure into the carriage 2; a body portion 28 which is in continuation of the base press-fit portion 27; and a mark-forming portion 29 which is formed in a projected manner at the front end of the body portion 28. At the front end surface 29a of the mark-forming portion 29, the standard mark 26 is formed.

The front end surface 29a of the mark-forming portion 29 is mirror-finished. A small hole which serves as the standard mark 26 is drilled or formed in the central position of the front end surface 29a. This small hole (standard mark) 26 is of a size of, e.g., about 0.3 mm in diameter, and is in communication with a central axial hole 30 which is formed in the axial central portions of the base press-fit portion 27 through the body portion 28. The standard pin 12 is formed by subjecting it to heat treatment (ion-nitriding) after the small hole 26 is drilled and, thereafter, subjecting the front end surface 29a of the mark-forming portion 29 to mirror-finishing. As an example of mirror-finishing, there can be cited lapping in which polishing is made with minute or fine grinding particles between a polishing tool and the front end surface 29a, but need not be limited to lapping.

As described above, since a white small hole of the standard mark 26 at the front end surface 29a can be easily pictured in a dark color by means of a recognition camera, the alignment accuracy of the carriage 2 can be improved. The standard pin 12 has been described as circular in cross section, but it may be elliptic or polygonal. Further, the small hole standard mark 26 need not be limited to a small hole; it may serve the purpose as long as it is of a recessed or depressed shape with a groove to obtain a sufficient contrast. The planar shape having the depression need neither be limited to circular.

Although the details are described hereinafter, a recognition camera 353 which is mounted on the assembly apparatus A and the picturing apparatus B catches within its scope of view the front end surface 29a of the standard pin 12 in which is formed the standard mark 26, thereby performing image recognition (pattern recognition). Therefore, in the pattern recognition with the recognition camera 353, the mirror-finished front end surface 29a is recognized as a light color and the depressed standard mark 26 which is formed substantially in the center of the front end surface 29a is recognized as a dark color. The standard mark 26 can thus be recognized as an image with a sufficient contrast. The standard mark 26 can therefore be recognized at a high accuracy and a mistake in recognition can surely be prevented.

The standard pin 12 thus formed is press-fit (i.e., fitted under pressure) with the front end surface 29a facing downward into the mounting hole portion which is formed in the carriage 2 (main body plate 11). The standard pin 12 thus press-fit into the carriage 2 projects beyond the back surface of the main body plate 11 so as to attain substantially the same height as that of the liquid droplet ejection head 3 which projects from the carriage 2. In other words, the front end surface 29a which serves as the image recognition surface of the standard pin 12 and the nozzle forming surface 52 (see FIG. 3) which serves as the image recognition surface of the liquid droplet ejection head 3 are positioned in substantially the same plane.

According to the above arrangement, when both the standard pins 12, 12 and subsequently the ejection nozzle 57 of each of the liquid droplet ejection head 3 are detected, the focusing position (i.e., the up and down movements of the recognition camera 353) need not be changed. In addition, when the recognition camera 353 is relatively moved for recognition of the image, the recognition camera 353 can be effectively prevented from interfering with other parts, or the like. It is preferable to dispose the pair of the standard pins 12, 12 in substantially the intermediate position in the direction of the long side of the main body plate 11. They may also be disposed in other positions as long as they are apart from each other.

As shown in FIGS. 1, 2 and 3, the left and right handles 14, 14 are for manually holding the relatively heavy (about 7 kgs) head unit. Each of the handles 14, 14 is formed in L-shape by a handle main body 32 which serves as the grip, and an arm portion 33 which extends at right angle from the lower end of the handle main body 32. The peripheral surface of the handle main body 32 is subjected to knurling-finish for prevention of slipping. Knurling finish of twill shape (see FIGS. 2 and 3) is employed in this embodiment; it may also be of straight-line shape.

The arm portion 33 extends horizontally and is seated by screwing at its front end for fixing to the supporting member 13 of the carriage 2. Namely, each handle 14 is removably attached to the carriage 2. In this manner, the left and right handles 14, 14 are disposed in a position projecting outward from the end portion in a direction of the long sides of the carriage (main body plate 11), i.e., in a position away from the liquid droplet ejection head 3, so as to rise upward.

In this arrangement, when the carriage 2 (head unit 1) is lifted by holding both the handles 14, 14, the carriage 2 will be lifted, due to the balance of force, while maintaining the substantially horizontal posture. In addition, in the course of transporting, the hands holding the handles 14 are prevented from coming into contact with the liquid droplet ejection heads 3. Although the details will be described hereinafter, the handles 14 become particularly useful in setting the head unit 1 into the picturing apparatus B, aside from the transportation of the head unit 1.

Each of the pipe connection assemblies 15 is disposed on an upper side of each of the liquid droplet ejection head groups 3S and is made up of: a pair of spacers 36, 36 which are vertically disposed on both end portions in the direction of the long sides of the main body plate 11; a pair of push plates 37, 37 which are disposed to extend between the pair of spacers 36, 36; and six sets of piping adapters 38 which are mounted on the push plates 37. The six sets of piping adaptors 38 are arranged such that the head side connecting portions on the lower end thereof slightly protrude, thereby being firmly fixed to the push plates 37.

Although described in detail hereinafter, the liquid droplet ejection head 3 is of a so-called twin type, and six sets of the piping adaptors 38 are connected to the liquid droplet ejection heads 3 through twin type of pipe connection members 17, respectively. In other words, while connecting, by fitting, the pipe connection member 7 to each of the liquid droplet ejection heads 3, the push plates 37 having mounted thereon the six sets of piping adaptors 38 are fixed by screws to both the spacers 36, 36. The six sets of the piping adaptors 38 are thus connected to the liquid droplet ejection head 3 through the respective pipe connection members 17. The inlet side of each of the piping adaptors 38 is connected, in a so-called one-touch manner, to the filter material supply system at the time of connection to the picturing apparatus B.

Similarly, each of the wiring connection assemblies 16 is made up of: three articulated supporting members 40, 40, 40 which are vertically disposed on left and right end portions of the carriage 2; a connector base 41 which is fixed to the upper end of the articulated supporting member 40; and four head relay substrates 42 with wiring connectors 43 which are mounted on the connector base 41. The four head relay substrates 42 are respectively connected to the twin type of head substrate 47 of each of the liquid droplet ejection head 3 (to be described in detail hereinafter) through flexible flat cables (not illustrated). Each of the head relay substrates 42 is connected by wiring plugs of control cables at the time of setting to the picturing apparatus B.

As shown only in FIG. 2, this head unit 1 is provided with a relay substrate cover 24 which covers both the wiring connection assemblies 16. This relay substrate cover 24 is made up of: a pair of side covers 24a which cover the side surface through the right-upper portion of each of the wiring connection assemblies 16; and a pair of upper covers 24b which extend between the pair of side covers 24a. The upper covers 24b are arranged to be mounted after the head unit 3 has been set in position into the picturing apparatus B. Though the details are described hereinafter, it is presumed that, at the stage of setting in position the head unit 1 into the assembly apparatus A, both the assemblies 15, 16 as well as the relay substrate cover 24 have not been assembled, unlike the case in which the picturing apparatus B is set in position.

With reference to FIGS. 5–8A through 8C, a description is made about the liquid droplet ejection head 3. This liquid droplet ejection head 3 is of a so-called twin type and is made up of: a liquid introduction part 45 having twin connection needles 46; a head substrate part 47 which is in parallel with the side of the liquid introduction part 45; a twin pump part 48 which is in communication with the bottom of the liquid introduction part 45; and a nozzle forming plate 49 which is in communication with the pump part 48. The liquid introduction part 45 is connected to the piping connecting member 17 and the head substrate 47 is connected to the flexible flat cable. On the other hand, this pump part 48 and the nozzle forming plate 49 constitute a rectangular head main body 50 which project toward the back side of the carriage 2. Two rows of nozzle arrays 53, 53 are formed in the nozzle forming surface 52 of the nozzle forming plate 49 (see FIGS. 6A and 6B).

As shown in FIGS. 6A, 6B and 7A through 7C, the pump part 48 has a pressure chamber 55 and a piezoelectric element 56. Each of the pressure chambers 55 is in fluid flow communication with the corresponding ejection nozzles 57. The base part side of the pump part 48, i.e., the base part side of the head main body 50, is formed into a rectangular flange shape for receiving therein the liquid introduction part 45. This flange part 58 has formed therein a pair of screwed holes 59, 59 (female threads) for screws to fix the liquid droplet ejection head 3 to the head holding member 4. These pair of screw holes 59, 59 are positioned in both the long side portions and are disposed in point-symmetry relative to the center of the nozzle forming surface 52. Though the details are given hereinafter, by means of the two screws 73, 73 which are engaged in a screwed manner with the flange part 58 through the head holding member 4, the liquid droplet ejection head 3 is fixed to the head holding member 4 (see FIG. 9).

Figure 7A:
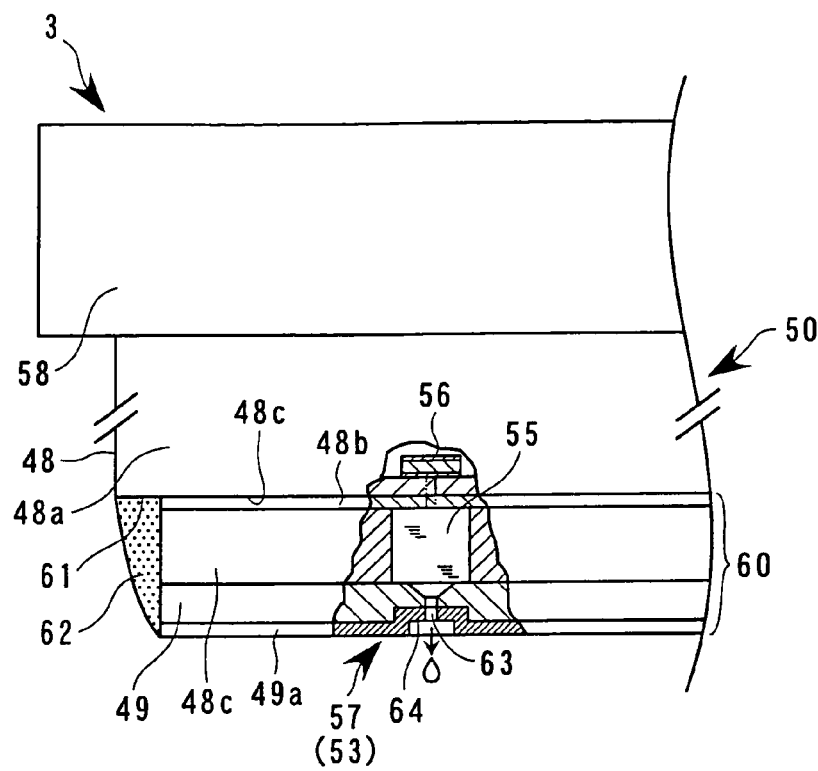
FIGS. 7A through 7C are enlarged sectional views of the liquid droplet ejection head

The nozzle forming plate 49 is formed of a stainless steel plate and is adhered to the ejection side end surface (liquid droplet ejection surface) of the pump part 48. In particular, as schematically shown in FIGS. 6 and 7A, the pump pat 48 has: a mechanism part 48*a* which contains therein the above-described piezoelectric element 56; and a silicon cavity 48*c* which is connected, together with the nozzle forming plate 49, to the mechanism part 48*a* through a resin film 48*b*. In other words, the nozzle forming plate 49 is adhered to the silicon cavity 48*c* and is coupled to the coupling surface 48*d* of the mechanism part 48*a* through the resin film 48*b*, whereby the above-described pressure chamber 55 is formed. When the assembling method is considered in relation to the head main body 50, the resin film 48*b*, the silicon cavity 48*c* and the nozzle forming plate 49 (inclusive of a plated layer 49*a* which is described in more detail hereinafter) constitute a pressure chamber assembly 60 relative to the mechanism part 48*a* of the pump part 48. While the coupling surface 48*d* of the mechanism part 48*a* is formed in a rectangle, the pressure chamber assembly 60 inclusive of the nozzle forming plate 49 is formed into a similar shape which is slightly smaller than the rectangle. The pressure chamber assembly 60 is coupled by overlapping to the coupling surface 48*d* so as to be substantially coaxial with each other.

As a result, between the periphery of the pressure chamber assembly 60 and the periphery of the coupling surface 48*d* of the mechanism part 48*a*, there is constituted a stepped part 61 which serves as a clearance for coupling around the periphery. This stepped part 61 is molded with resin 62. In other words, the stepped part 61 to be constituted by the end edge (peripheral edge part) of the coupling surface 48*d* and the end surface (side surface part) of the pressure chamber assembly 60 is molded with resin 62 so as to fill the stepped part 61. In this manner, the lower end of the head main body 50 is in the form in which the periphery is chamfered by the resin 62.

Figure 7B:
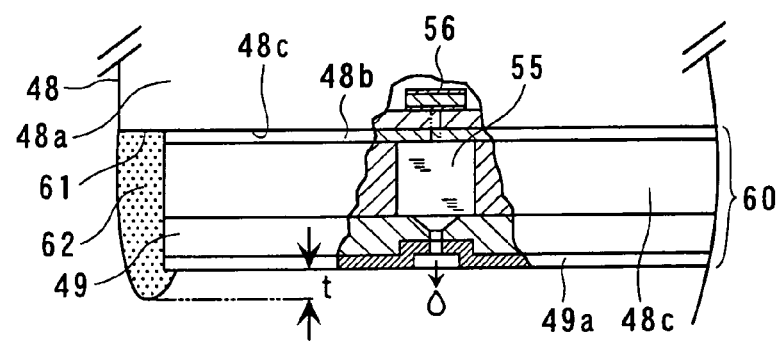
Figure 7C:
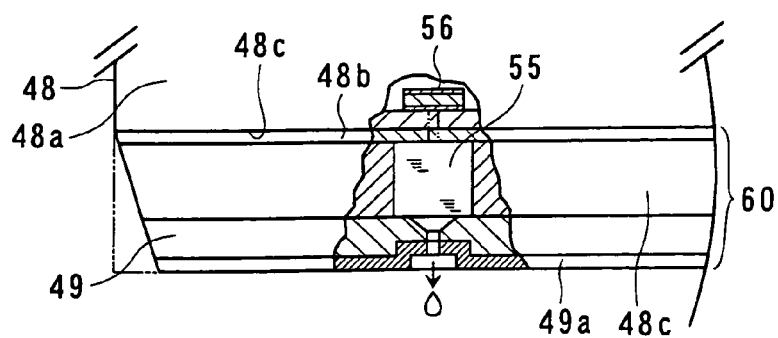
Figure 8C:
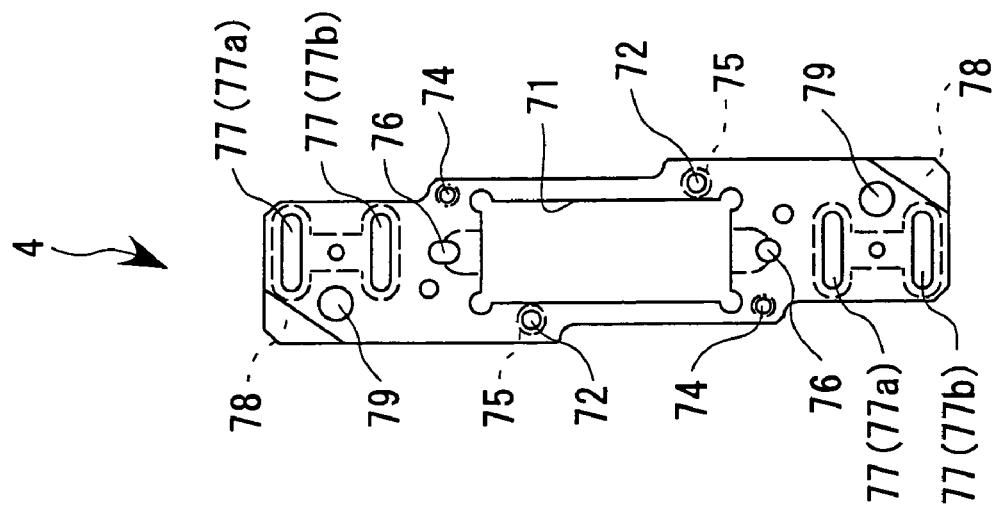
FIGS. 8A through 8C are structural representations of a head holding member.
Figure 8B:
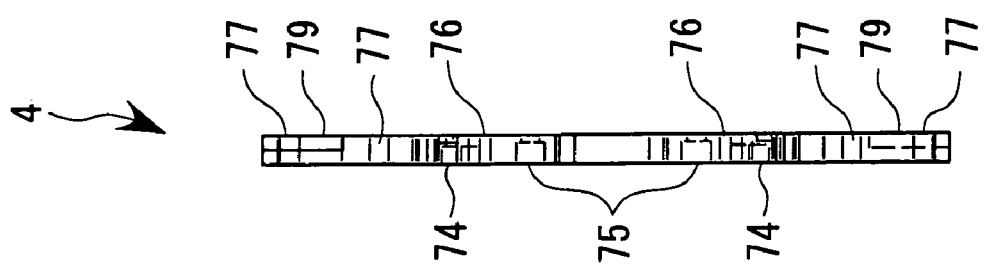
Figure 8A:
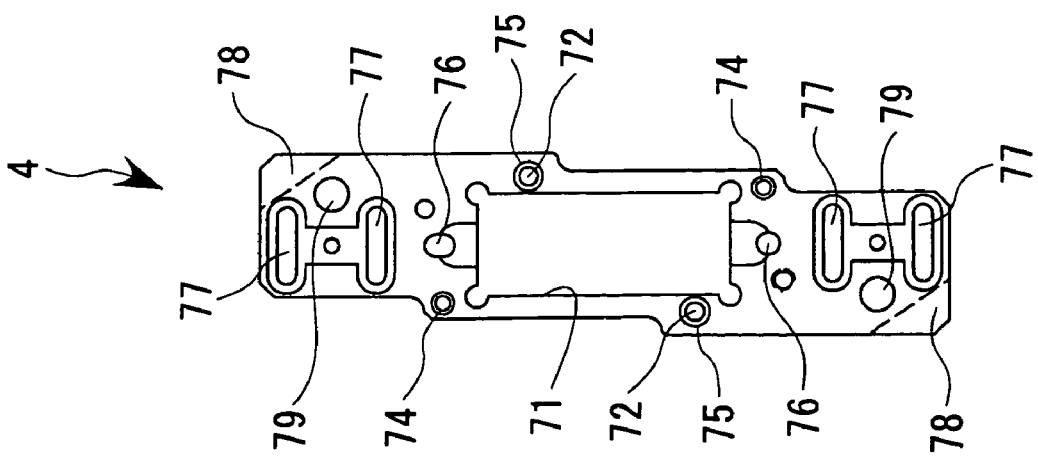

Though the details are described hereinafter, by means of molding with this resin 62, the head main body 50 can be prevented from getting caught or getting stuck with a wiping sheet 31 at the time of wiping work. In this arrangement, although the liquid droplet ejection head 3 is held by the carriage 2 in a slightly inclined manner within a horizontal plane, the wiping sheet 131 operates to wipe out from the X-axis direction relative to the head main body 50 (see FIG. 17). Therefore, the molding resin 62 extending over the periphery may be provided only in the long-side portion in which minimum wiping is performed or only along both the long-side portions. The same applies to the chamfering work to be described hereinafter. As shown in FIG. 7B, the following arrangement is also possible. Namely, the resin 62 is molded so as to be projecting somewhat forward (by the thickness "t" as shown in the figure) from the nozzle forming plate 49. In this manner, the resin 62 serves the function of a protector for protecting the ejection nozzle 57. Or else, as shown in FIG. 7C, the coupling surface 48*d* of the mechanism part 48*a* and the pressure chamber assembly 60 are formed in the same shape and, in place of the molding of resin 62, the end edge of the pressure chamber assembly 60 is subjected to chamfering work.

The nozzle forming plate 49 has disposed therein two nozzle arrays 53, 53 in parallel with each other. Each of the nozzle arrays 53 is made up of 180 pieces (though schematically shown in the figure) of ejection nozzles 57 arranged at an equal pitch. Namely, the nozzle forming surface 52 of the head main body 50 has disposed therein two nozzle arrays 53, 53 symmetrically on left and right relative to the center line. The nozzle opening 63 of each of the ejection nozzles 57 opens inside a circular recessed portion 64 which has formed therein a water-repellant (liquid-repellant) plated layer 49*a*.

In FIGS. 6A and 6B, reference numerals 65, 65 denote two nozzle standard marks for positional recognition of the liquid droplet ejection head 3. As described in detail hereinafter, the positional recognition of the liquid droplet ejection head 3 in this embodiment is performed by image recognition (pattern recognition) of the two outermost ejection nozzles 57*a*, 57*a* in one of the nozzle arrays 53. However, depending on the liquid to be ejected, the mode of meniscus to be formed at the ejection nozzle 57 (nozzle opening 63) is not uniform (see imaginary line in FIG. 6B). There is therefore a possibility of being incapable of recognizing the pattern.

As a solution, in this embodiment, two nozzle standard marks 65, 65 are formed in the neighborhood of the two outermost ejection nozzles 57*a*, 57*a*. In other words, in the nozzle forming surface 52, two nozzle standard marks 65, 65 are formed by laser etching, or the like, at positions in which the two ejection nozzles 57*a*, 57*a* are moved in parallel, or more strictly, in positions corresponding to both the ejection nozzles 57*a*, 57*a* when the nozzle arrays 53 are moved in parallel (the direction need not always be perpendicular to the nozzle arrays 53). Two nozzle standard marks 65, 65 relative to the two ejection nozzles 57*a*, 57*a* are secured in position. In case the image recognition at the two ejection nozzles 57*a*, 57*a* is unstable, the image recognition is made by using the two nozzle standard marks 65, 65. The two nozzle standard marks 65, 65 may be provided in any position of the nozzle forming surface 52 as long as they are secured in position relative to the two ejection nozzles 57*a*, 57*a* (strictly speaking, any two arbitrary ejection nozzles 57, 57 which are separate from each other will do) and as long as they are sufficiently separate from each other.

The liquid droplet ejection head 3 thus constituted is fixed as follows. Namely, the head main body 50 is projected through the mounting hole 18 formed in the carriage 2 toward the back surface side of the carriage 2. The head main body 50 is then fixed by screws to the head holding member 4 which is applied to the edge portion of the mounting hole 18 by means of the flange part 58. The head holding member 4 is tentatively or provisionally fixed to the carriage 2 by adhering or gluing and is thereafter finally fixed by means of mechanical fixing means.

With reference to FIGS. 8A through 8*c* and 9, a description will be made about the head holding member 4. The head holding member 4 is an intervening metallic member for stably fixing the liquid droplet ejection head 3 to the carriage 2, and is formed into a substantially rectangular flat plate shape of stainless steel, or the like. The head holding member 4 has formed in the central portion thereof a rectangular inserting hole 71 through which the head main body 50 of the liquid droplet ejection head 3 is inserted. The head holding member 4 is set in position to the back surface of the carriage 2 in a manner to bridge over the mounting hole (hole portion 18*a*) 18 at both ends in the rectangular direction. The liquid droplet ejection head 3, on the other hand, is set in position to the front side of the carriage 2 by inserting the head main body 50 through the inserting hole 71 (see FIG. 5).

In the periphery of the inserting hole 71 of the head holding member 4, there are disposed two penetrating holes 72, 72 and two small screws 73, 73 corresponding to the two screw holes 59, 59 in the flange part 58, and two projection position restricting pins 74, 74. The two penetrating holes 72, 72 are formed in boss parts 75, 75 which project respectively toward the mounting hole 18. Each of the boss parts 75 is constituted by a cylindrical collar which is inserted under pressure into the head holding member 4. The two boss parts 75, 75 and the two projection position restricting pins 74, 74 are disposed in a point-symmetry with each other relative to the center of the inserting hole 71. As a result of contact of the boss parts 75, 75 and the projection position restricting pins 74, 74 with the flange part 58, the dimension of projection of the liquid droplet ejection head 3 beyond the carriage 2 is thus arranged to be restricted.

Along the center line of the inserting hole 71 there are formed two engaging holes 76, 76 on the outside of the inserting hole 71. The two engaging holes 76, 76 are also portions in which the assembly jig C of the liquid droplet ejection head 3 is mounted and are portions in which the engaging pins 343, 343 for positional correction of the assembly apparatus A are engaged. In order for the mounting of the assembly jig C or the engagement of the engaging pins 343 to be performed without much trouble, the two engaging holes 76, 76 are formed such that one of them is circular and the other of them is oblong in the direction of the center line.

Along the center line of the inserting hole 71, there are formed, at both end portions of the head holding member 4, two adhesive agent injection holes 77, 77 respectively in positions symmetrical with each other relative to the inserting hole 71. Each of the adhesive agent injection holes 77 is formed into a slot which extends in the direction to cross the head holding member 4. The end portion of the slot on the side of the carriage 2 is chamfered (see FIGS. 8A, 8C). Both end portions of the head holding member 4 in which the adhesive agent injection holes 77, 77 are formed are arranged to serve as the adhesion portions 78, 78 for adhering the head holding member 4 to the carriage 2. The adhesive agent injected through each of the adhesive agent injection holes 77 expands through capillary phenomenon into the surface portions between the carriage 2 and the adhesive portions 78, 78 and gets adhered thereto.

In this arrangement, the adhesive agent injection hole 77a (77b) formed on an outside (inside) of one end portion forms a pair with the adhesive agent injection hole 77a (77b) formed on an inside (outside) of the other end portion. Though details are descried hereinafter, the assembly apparatus A has two adhesive agent injection nozzles 387, 387. The two adhesive agent injection nozzles 387, 387 are simultaneously inserted into the adhesive agent injection holes 77a, 77a for filling them with the adhesive agent and, after moving along the center line, are simultaneously inserted into the adhesive agent injection holes 77b, 77b for filling them with the adhesive agent.

In the figures, reference numeral 79, 79 denotes a pair of fastening holes which are used in provisionally mounting the head holding member 4 on the carriage 2 (details to be described hereinbelow). These pair of fastening holes 79, 79 are formed near the adhesive agent injection holes 77, 77 in a point symmetry relative to the center of the inserting hole 71. In addition, in the hole portion 18a of the carriage 2, there are formed a pair of provisional fastening screw holes 20, 20 corresponding to the pair of the fastening holes 79, 79 (see FIG. 11).

Each of the liquid droplet ejection heads 3 is positioned in the X-axis direction, Y-axis direction, and Θ-axis direction (position recognition) relative to the carriage 2 which is positioned or aligned through the pair of standard pins 12, 12, based on the nozzle array 53 (ejection nozzle 57) which are the output end. In concrete, since the two nozzle arrays 53, 53 are secured in mutual positional accuracy at the manufacturing stage, the two ejection nozzles 57a, 57a which are positioned in the outermost end of one of the nozzle arrays 53 are used as positioning standard and are subjected to recognition. The four sides (strictly speaking, the four sides at the front end portion in several mm of the pump part 48) at the front end portion of the head main body 50 of the liquid droplet ejection head 3 are also secured in the mutual positional accuracy at the manufacturing stage.

On the other hand, the liquid droplet ejection head 3 is in a style of being fixed to the carriage 2 through the head holding member 4. Therefore, in this embodiment, by using the assembly jig C, the liquid droplet ejection head 3 is positioned and fixed by screwing to the head holding member 4 by using as a standard the four sides of the front end part of the head main body 50. Then, based on the two ejection nozzles 57a, 57a, the liquid droplet ejection head 3 accompanied by the head holding member 4 is positioned and provisionally fixed. In other words, by manual work using the assembly jig C, the liquid droplet ejection head 3 is once provisionally positioned to the head holding member 4 and is finally fixed after the image recognition (recognition of the ejection nozzles 57a, 57a) in the assembly apparatus A.

In the assembly apparatus A of this embodiment, in order to speed up the positional recognition (i.e., the recognition of the position), it is so arranged that the two ejection nozzles 57a, 57a are simultaneously recognized by two stationary recognition cameras 353, 353, i.e., are simultaneously caught within the scope of view by the two recognition cameras 353, 353. Therefore, the provisional positioning of the liquid droplet ejection head 3 using the assembly jig C is intended so that, when the two recognition cameras 353, 353 are caused to face the two ejection nozzles 57a, 57a based on the set positional data at the stage of final positioning, none of the ejection nozzles 57a, 57a falls outside the scope of view.

Now, with reference to FIGS. 9–10A through 10C, a description will be made about the assembly jig C for the liquid droplet ejection head 3, as well as about the method of assembling the liquid droplet ejection head 3 onto the head holding member 4 by using the assembly jig C. As shown in FIGS. 10A through 10C, the assembling jig C is made up of: a jig main body 81 which positions the head main body 50 of the liquid droplet ejection head 3; and a pair of mounting pins 82, 82 which mount the jig main body 81 to the head holding member 4 in a positioned state.

The jig main body 81 is formed substantially into a C-shape by a longitudinal side part 84 and a pair of lateral side parts 85, 85 which extend at right angles from both ends of the longitudinal side part 84. The mounting pins 82, 82, on the other hand, project from the back surface of the lateral side parts 85, 85. By fitting these pair of mounting pins 82, 82 into the engaging holes 76, 76 in the head holding member 4, the jig main body 81 is mounted onto the head holding member 4.

In a part which extends from the inside of the longitudinal side part 84 toward the inside of one of the lateral side parts 85, there is formed a substantially L-shaped positioning part 86. By bringing one of the longitudinal sides of the long sides and the short sides of the head main body 50 into contact with the positioning part 86, the liquid droplet ejection head 3 is positioned to the head holding member 4. The positioning part 86 is formed into a thin wall so that the front side is flush with the other portion, and the corner portion 86*a* is formed into an indented semicircular shape. In addition, the thickness of the jig main body 81 is designed such that the surface thereof and the nozzle forming surface 52 of the liquid droplet ejection head 3 become substantially flush with each other (i.e., of the same level).

It is thus so arranged that the head main body 50 is positioned as a result of contact of the front end portion in the direction of its projection with the positioning part 86 of the assembly jig C. In other words, by bringing the two adjoining sides among the four sides at the front end portion of the head main body 50 whose positioning accuracy is secured, at the stage of manufacturing, relative to the nozzle array 53, into abutment with the positioning part 86 of the assembly jig C, the liquid droplet ejection head 3 is positioned to the head holding member 4.

On the other hand, the pair of mounting pins 82, 82 are disposed so as to coincide with the center line of the head main body 50 which has been held in abutment with the positioning part 86. In concrete, the longitudinal side portion 86*b* of the positioning part 86 is formed in parallel with the straight line connecting the pair of mounting pins 82, 82. The distance between the mounting pins 82, 82 is controlled to suit the position of the long or longitudinal side of the head main body 50, and is formed to ½ of the short side of the head main body 50. The short side portion 86*c* of the positioning part 86 is formed at right angles to the long side portion 86*b*, and the distance to the mounting pin 82 which is positioned on the side of the short side portion 86*c* is controlled to suit the short side position of the head main body 50.

Figure 9:
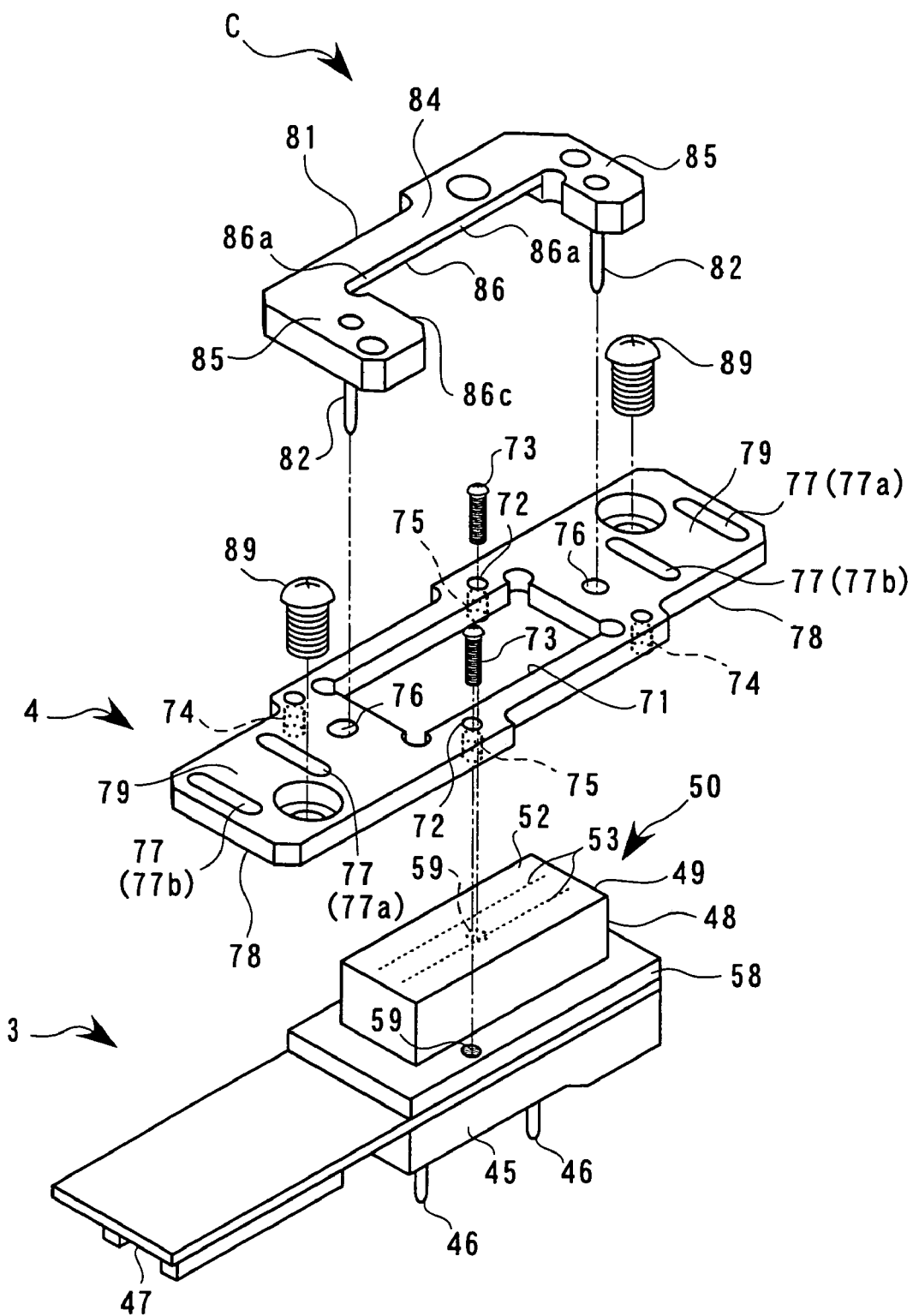
FIG. 9 is an enlarged, exploded perspective view showing the method of assembling the head unit using an assembling jig.
Figure 10C:
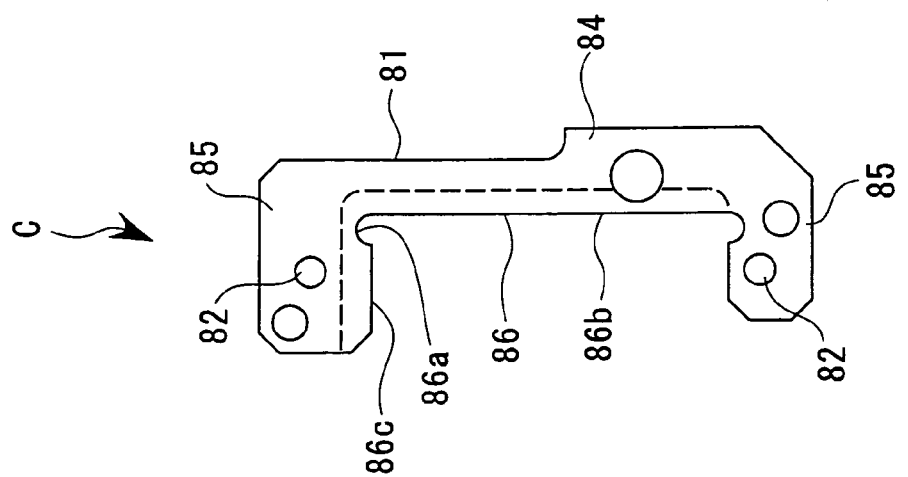
FIGS. 10A through 10C are structural representations of the assembling jig.
Figure 10B:
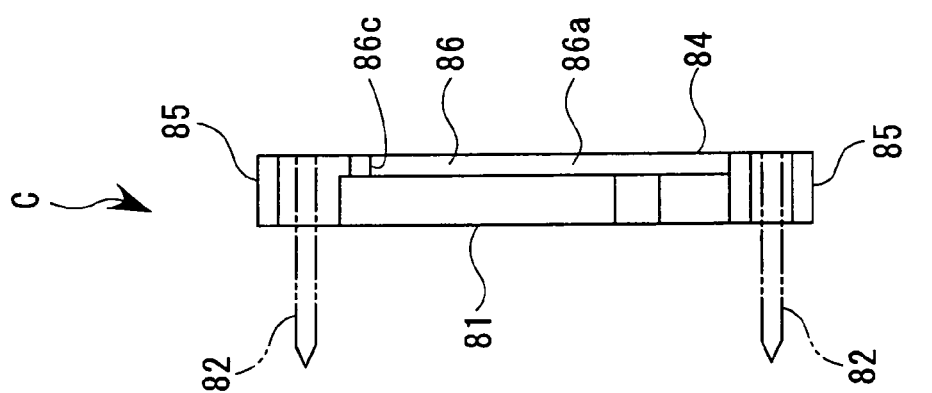
Figure 10A:
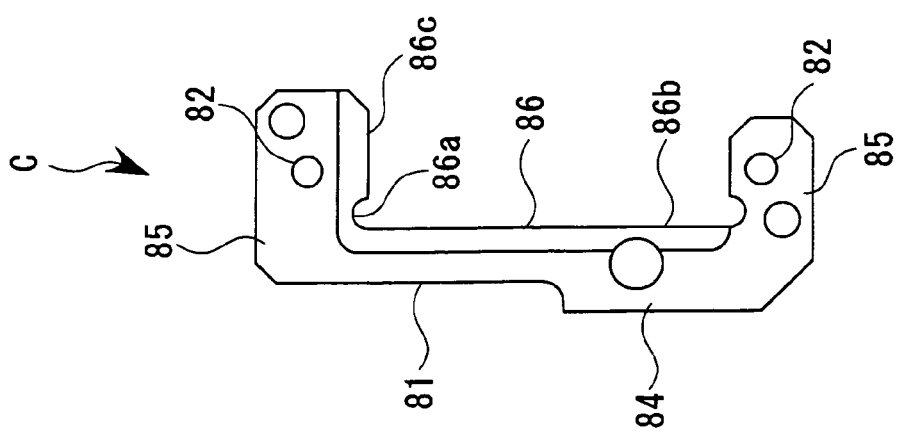

According to this arrangement, even if the assembly jig C is mounted on the head holding member 4 in a state in which it is rotated by 180° from the state shown in FIG. 9, the liquid droplet ejection head 3 can be positioned without giving rise to any particular problem. In other words, the assembly jig C of the embodiment is not symmetrical between left and right in its plane shape, but is in a construction available for service without relation to the left-handed or right-handed.

Figure 11:
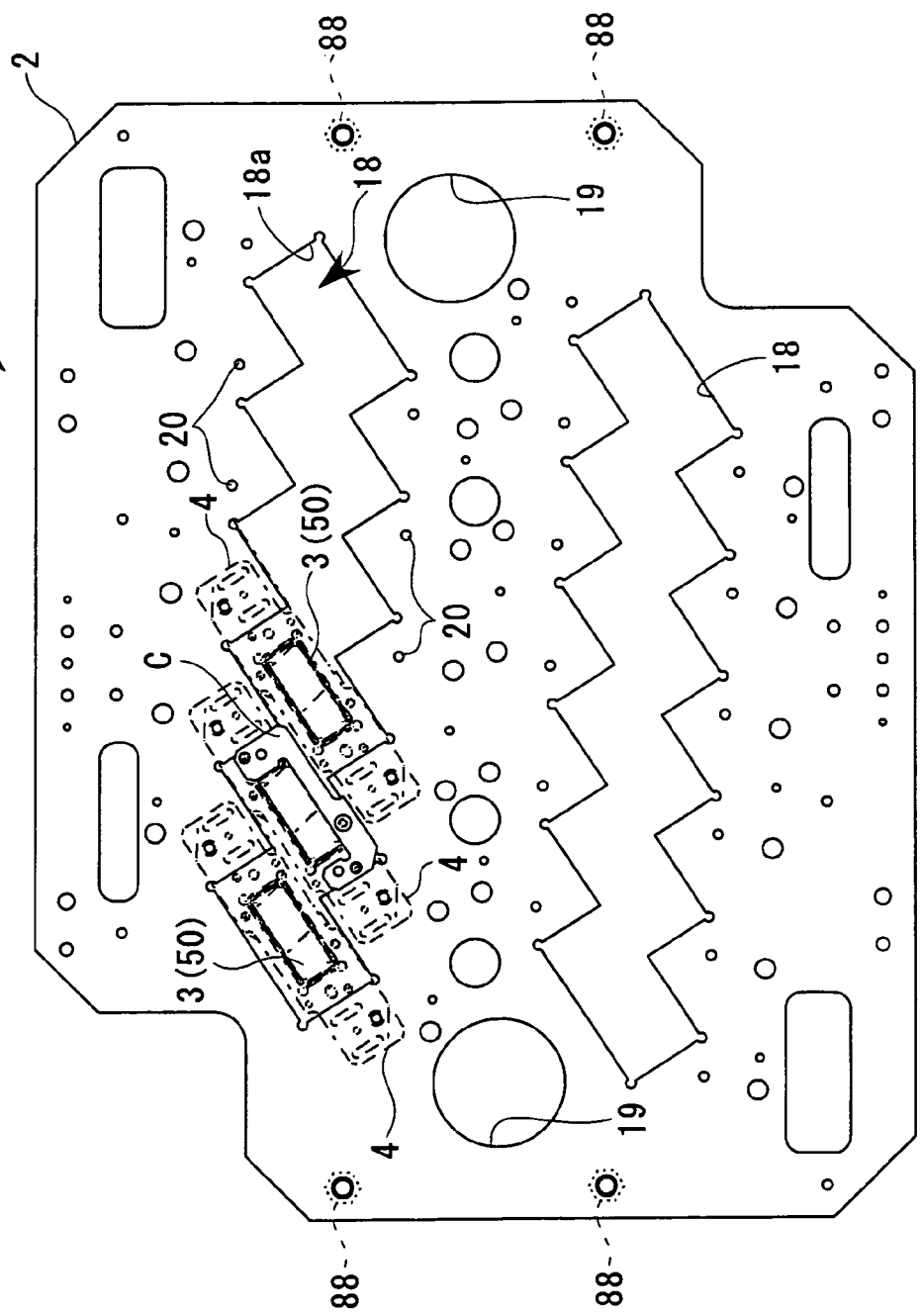
FIG. 11 is a plan view showing the method of assembling the head unit using the assembling jig.
Figure 12:
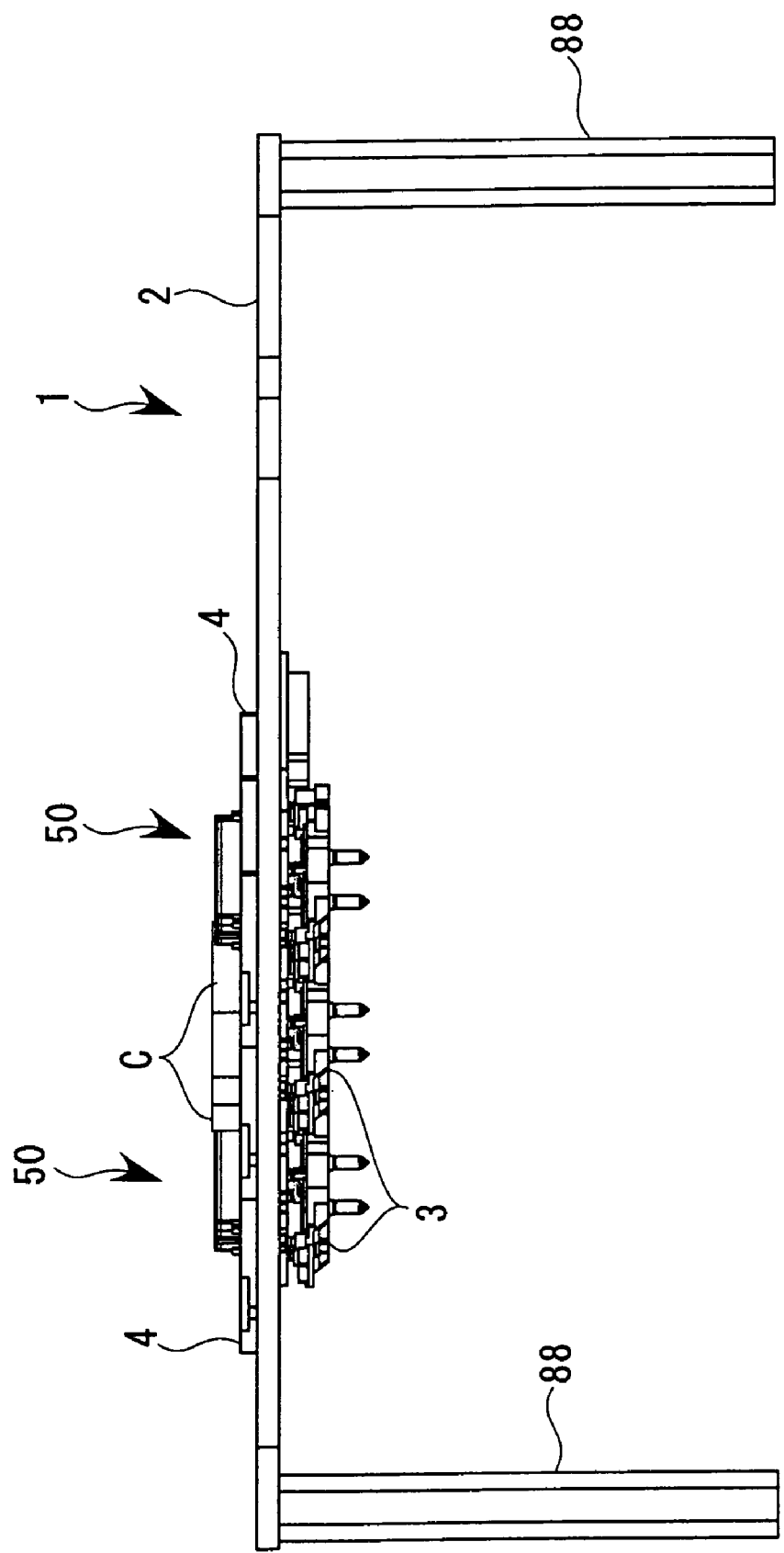
FIG. 12 is a front view showing the assembling method of the head unit using the assembling jig.

With reference to FIGS. 9, 11 and 12, description is made about the method of assembling or building the liquid droplet ejection head 3 into the head holding member 4 by using the above-described assembly jig C. This assembly work is manually performed as an outside step of the assembly apparatus A. First, four supporting legs 88, 88, 88, 88 are screwed to the periphery of the front side of the carriage 2 (strictly speaking, the main body plate 11). Then, the carriage 2 is reversed upside down and the carriage 2 is set in position in a state of being lifted or floated by the supporting legs 88. Though not illustrated, the pair of supporting members 13, 13 and the pair of standard pins 12, 12 and the above-described pair of supporting members 13, 13 shall preferably be mounted on the carriage 2 in this state.

Then, the liquid droplet ejection head 3 with the head main body 50 being positioned upward is inserted from the lower side of the carriage 2 into the mounting hole 18. The inserting hole 71 of the head holding member 4 is positioned relative to the head main body 50 and is fitted from the upper side of the carriage 2 into the head main body 50 so that the head holding member 4 is set in position onto the carriage 2. Once the head holding member 4 has been set in position, the assembly jig C is mounted from the upper side onto the head holding member 4, and the two sides of the head main body 50 which is positioned to lie face to face with the positioning part 86 are urged against the positioning part 86 of the head holding member 4. It may be so arranged that a plurality of assembly jigs C are prepared for mounting in advance onto the head holding member 4 before starting the work.

Subsequently, while maintaining the above-described urged state, two screws 73, 73 from the upper side are penetrated through the head holding member 4 to thereby respectively screw them into the flange portion 58 of the liquid droplet ejection head 3. The liquid droplet ejection head 3 is thus fixed to the head holding member 4. Then, as a means of preventing the scope of view of the two recognition cameras 353, 353 from falling outside the two ejection nozzles 75, 75*a*, the fixing screws 89, 89 are screwed from the pair of fastening holes 79, 79 into the provisional fixing screw holes 20, 20 in a state of provisionally fastened.

According to this arrangement, within a range of dimensional tolerances between the fixing screws 89 and the fastening holes 79, the positioning of the liquid droplet ejection head 3 relative to the carriage 2 becomes possible. Also, the scope of view of the two recognition cameras 353, 353 does not fall outside the two ejection nozzles 75*a*, 75*a*. By thus repeating the positioning and fixing of the liquid droplet ejection head 3 to the head holding member 4, twelve liquid droplet ejection heads 3 are respectively assembled to the head holding member 4. Finally, the assembly jig C is pulled out of position from the head holding member 4, and the supporting legs 88 are removed to thereby finish the work.

As described above, twelve liquid droplet ejection heads 3 are assembled to twelve head holding members 4 with the carriage 2 in between. In this state, however, twelve liquid droplet ejection heads 3 have not been fixed to the carriage 2, but are in a state of being suspended therefrom. In other words, twelve liquid droplet ejection heads 3 accompanied by the head holding members 4 are provisionally mounted on the carriage 2 so as to be slightly movable within dimensional tolerances between the fixing screws 89 and the fastening holes 79. The fixing screws 89 are waste screws and thus are removed after the head holding members 4 have been mounted (provisionally fixed) to the carriage 2 in the assembly apparatus A. In other words, in this embodiment, final fixing of the head holding members 4 to the carriage 2 by means of screws is not performed (they are fixed in an urging manner by means of other members).

Then, the head unit 1 in which twelve liquid droplet ejection heads 3 accompanied by the head holding members 4 have been provisionally mounted on the carriage 2 is introduced into the assembly apparatus A and is set in position in a posture of upside down. The head unit 1 to be introduced into the assembly apparatus A has assembled therein a pair of supporting members 13, 13 and standard pins 12, 12, aside from the above-described main constituting elements. The head unit 1 to be introduced into the picturing apparatus B has further assembled therein handles 14, both assemblies 15, 16, or the like.

A description is made about the picturing apparatus B, as well as about the method of setting the head unit 1 by using the pair of handles 14, 14 to thereby mount the head unit 1 on the picturing apparatus B. In addition, a brief description is made about a wiping apparatus of the picturing apparatus B in relation to the construction of the head main body 50 of the liquid droplet ejection head 3.

Figure 13:
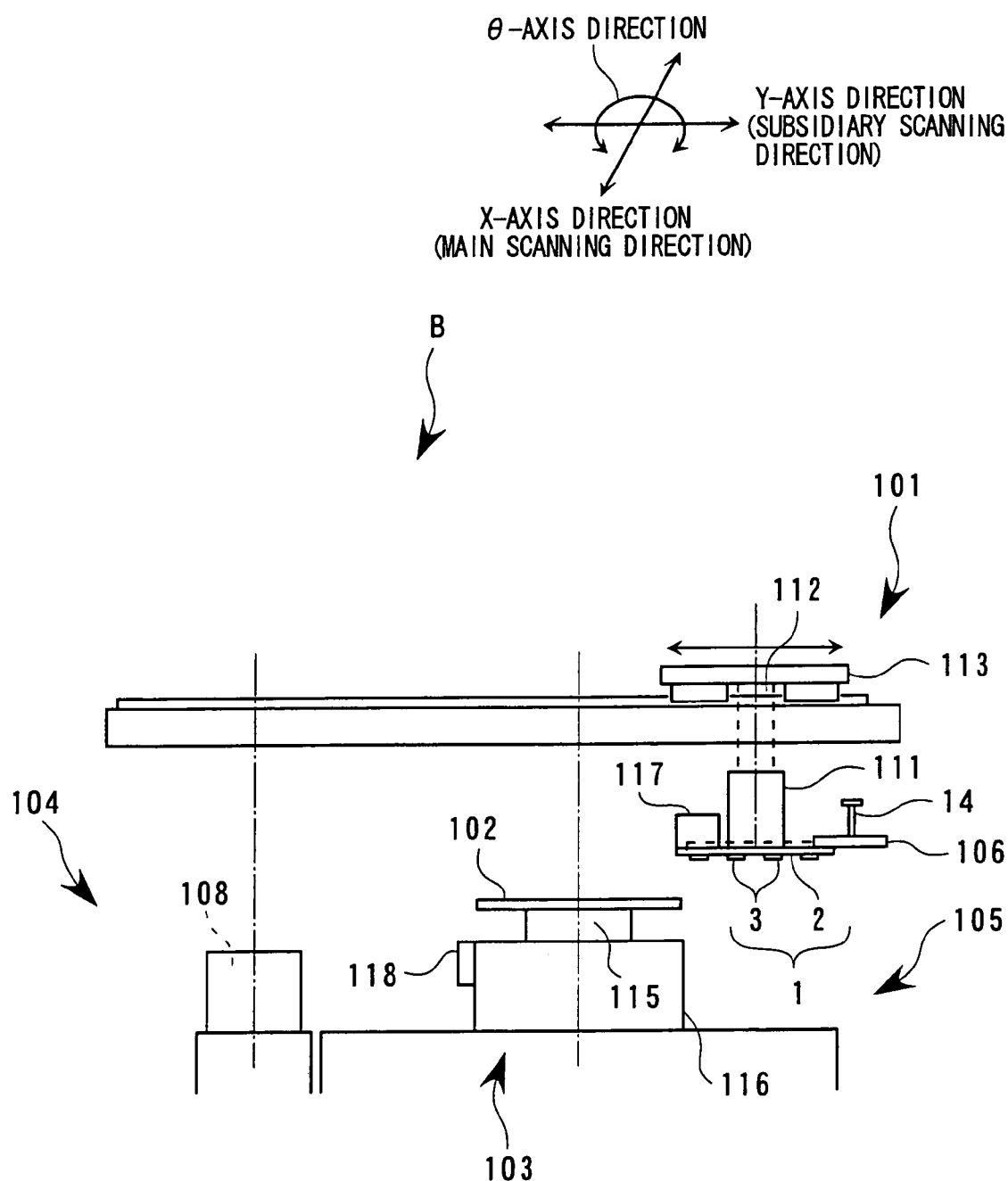
FIG. 13 is a schematic representation of a picturing apparatus.

FIG. 13 is a schematic representation showing the picturing apparatus B. As shown therein, the picturing apparatus B has: a head moving part 101 which has mounted thereon the head unit 1 and moves it in the Y-axis direction and Θ-axis direction; a substrate moving part 103 which lies opposite to the head moving part 101 and moves the substrate 102 such as color filters, or the like, in the X-axis direction; and a maintenance part 104 which performs maintenance to the liquid droplet ejection head 3 of the head unit 1. The head moving part 101 moves the head unit 1 that is mounted thereon, between a unit introduction part 105 and the maintenance part 104 with the substrate moving part 103 inbetween.

When the head unit 1 is introduced and set in position, the head moving part 101 moves toward the unit introduction part 105, and provisional setting base 106 faces the unit introduction part 105. The head unit 1 is provisionally set on the provisional setting brackets 106 and, after connecting the piping and wiring thereto, is set in position into the head moving part 101. In a preparing step in which an initial positioning of the head unit 1 is performed, a slight moving (angle adjustment) of the head unit 1 in the Θ-axis direction is performed. In a manufacturing step in which the filter material is ejected, the substrate 102 moves in the X-axis direction and the head unit 1 moves in the Y-axis direction, whereby main scanning and subsidiary scanning of the liquid droplet ejection head 3 are performed.

The head moving part 101 has: a main carriage 111 which supports the head unit 1 in a suspended manner; a Θ table 112 which moves the main carriage 111 in the Θ-axis direction; and a Y table 113 which moves the head unit 1 in the Y-axis direction through the Θ-axis table 112. The substrate moving part 103 has: a substrate setting table 115 which sets in position the substrate 102 by suction; and an X table 116 which moves the substrate in the X-axis direction through the substrate setting table 115.

The X table 116 is driven by a combination of an air slider and a linear motor, and the Y table 113 is driven by a combination of ball screws and a servo motor (above elements not illustrated). A substrate recognition camera 117 is mounted on a main carriage 111 (see FIG. 15), and a head recognition camera 118 is mounted on the substrate setting table 115, respectively. Therefore, the pair of standard pins 12, 12 disposed on the carriage 2 of the head unit 1 are recognized as images (image-recognized) by a cooperation of the head recognition camera 118 and the X table which moves the head recognition camera 118 in the X-axis direction.

Figure 67:
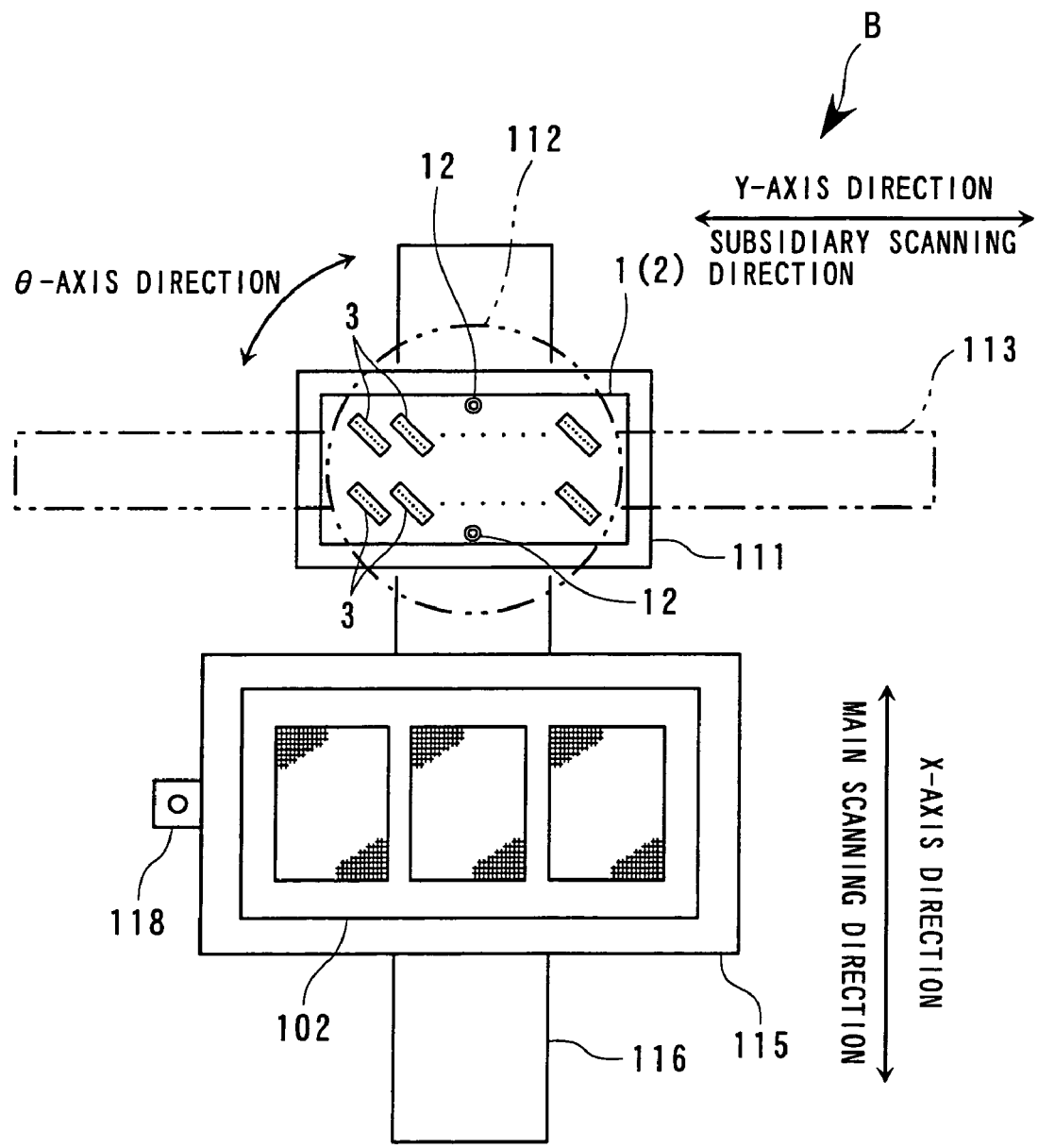
FIG. 67 is a schematic representation showing the recognition movement of the carriage in the picturing apparatus.

With reference to FIG. 67, a description will now be made about the recognizing operation of the pair of standard pins 112, 112 by means of the head recognition camera 118. First, based on the design data, the X table 116 and the Y table 113 are adequately driven to thereby move the head recognition camera 118 and the carriage (head unit 1). One of the standard pins 12 is thus caused to fall within the scope of view of the head recognition camera 118. Once one of the standard pins 12 has been recognized by the head recognition camera 118, the X table 116 is driven to move the head recognition camera 118 in the X-axis direction (in the direction of the main scanning). The other of the standard pins 12 is thus caused to fall within the scope of view of the head recognition camera 118 and recognize it.

Then, based on the result of recognition of the pair of standard pins 12, 12 by the head recognition camera 118, the X table 116, the Y table 113 and the Θ table 112 are adequately driven to thereby perform the positional correction of the carriage (head unit 1). After the positional correction, the above-described operation for recognition is performed again for the purpose of confirmation. A series of operations for recognition are finished.

Thereafter, in the actual liquid droplet ejection operation, the X table 116 is driven first to thereby reciprocate the substrate 102 in the direction of main scanning. The plurality of liquid droplet ejection heads 3 are also driven to thereby perform selective droplet ejection of the liquid droplet ejection heads 3. Then, the Y table 113 is driven to move the carriage 2 (head unit 1) by one pitch in the direction of the subsidiary scanning. The reciprocating movement of the substrate 102 in the direction of the main scanning and the driving of the liquid droplet ejection heads 3 are performed again. These operations are repeated several times to perform the ejection of the liquid droplets from one end of the substrate 102 to the other end thereof (entire region) is performed.

As descried above, since the movement of the head recognition camera 118 in recognizing the images of the pair of the standard pins 12, 12 is performed by the X table 116, unlike the Y table 113, or the like, using the ball screws, the movement accuracy can be prevented from affecting the recognition accuracy. In addition, the X-axis direction which is the direction of movement of the X table 116 coincides with the direction of the main scanning. Therefore, the accuracy of ejection of the liquid droplets (accuracy of reaching points of the liquid droplets) can be improved from the structural point of view.

In this embodiment, the substrate 102 which is the object to which the droplets are directed is moved in the direction of the main scanning relative to the head unit 1 (carriage 2). It may also be arranged that the carriage 2 (head unit 1) is moved in the direction of the main scanning. Further, it is also considered to dispose the pair of standard pins 12, 12 on both end portions of the long side of the carriage 2. In this case, the pair of the standard pins 12, 12 are recognized by the relative movement of the carriage 2 in the Y-axis direction.

Figure 14:
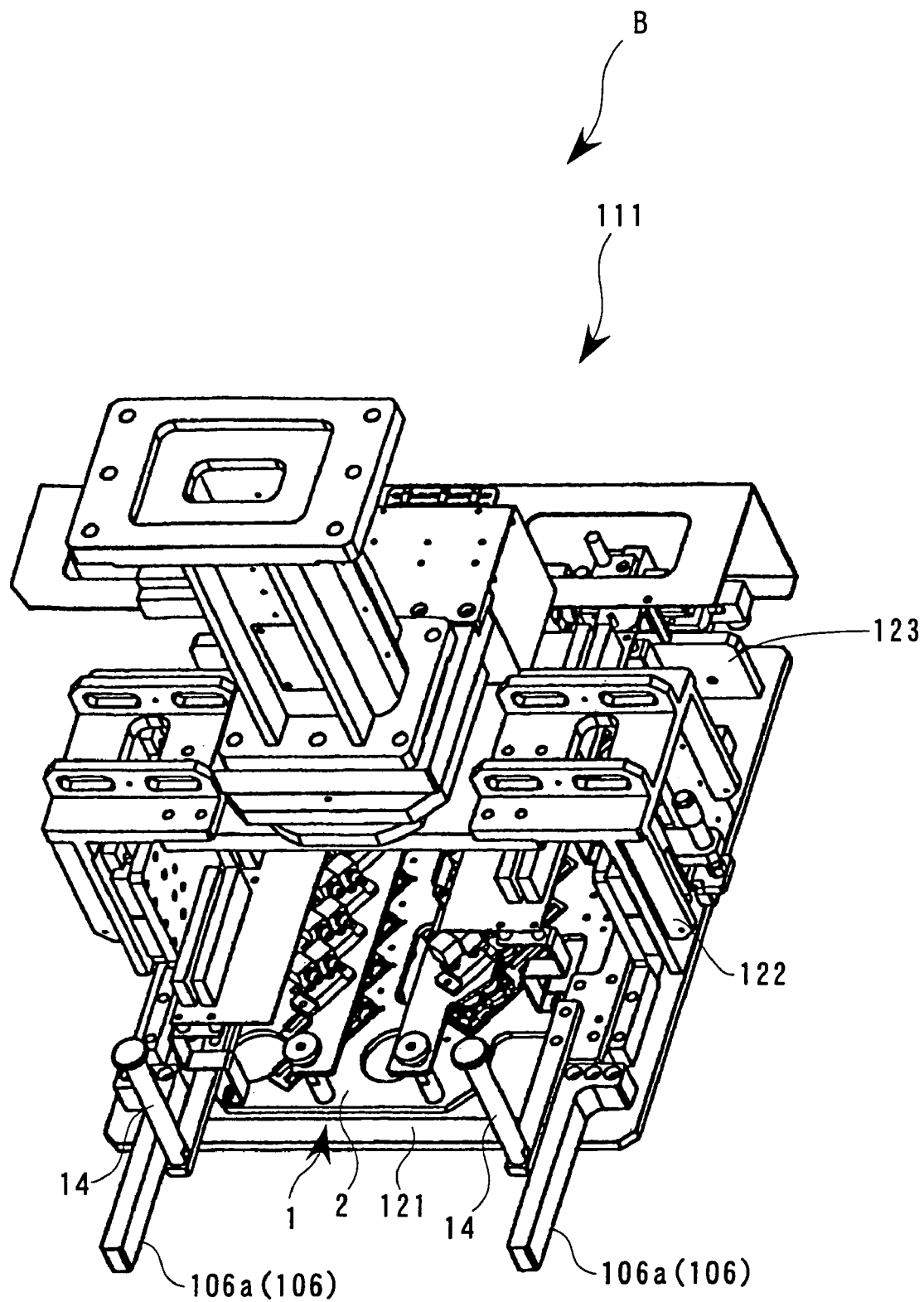
FIG. 14 is a perspective view of a main carriage in the picturing apparatus.

FIGS. 14 and 15 are outside views of the main carriage 111. The main carriage 111 is provided with: a base plate 121 on which is seated the head unit 1; an arch member 122 which supports the base plate 121 in a suspended manner; a pair of left and right provisional placement angle members 106a, 106a, serving as provisional setting bases 106, which are disposed in a manner to project from one end of the base plate 121; and a stopper plate 123 which is disposed at the other end portion of the base plate 123. The above-described substrate recognition cameras 117 are disposed in a pair on an outside of the stopper plate 121.

The base plate 121 has formed therein a rectangular opening 124 for loosely fitting thereinto the main body plate 11 of the head unit 1. In each of those left and right opening edge portions 125 of the base plate 121 which constitute the rectangular opening 124, there are provided: two bolt holes 22, 22 which are formed in each of the supporting members 13 of the head unit 1; two penetrating holes 126, 126 which coincide with the pin holes 23; and a positioning pin 127. In this arrangement, the width of the rectangular opening 124 and the width f the main body plate 11 approximately coincide with each other. The head unit 1 to be set in position from a side is inserted such that the left and right of the main body plate 11 is guided by the left and right of he rectangular opening 124.

Each of the provisional placement angle members 106a has a sufficient thickness (height) and is fixed by placing the base portion which is bent outward into an L-shape to the end portion of the base plate 121. The distance between both the provisional placement angle members 106a, 106a corresponds to the distance between both the supporting members 13, 13 of the head unit 1. Therefore, the head unit 1 can be provisionally placed by causing both the supporting members 13, 13 to be seated on the provisional placement angle members 106a, 106a. The feeding into the base plate 121 is guided by both the provisional placement angle members 106a, 106a. In this state, the head main body 50 of each of the liquid droplet ejection heads 3 is sufficiently lifted from the base plate 121, so that they can be prevented from coming into contact with (or from being interfered with) the base plate 121.

Figure 16A:
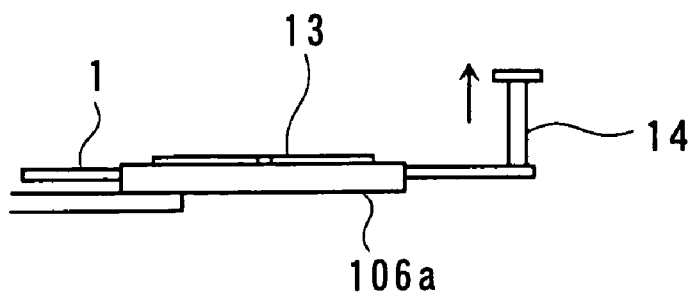
FIGS. 16A through 16C are explanatory representations showing the setting method of the head unit.
Figure 16B:
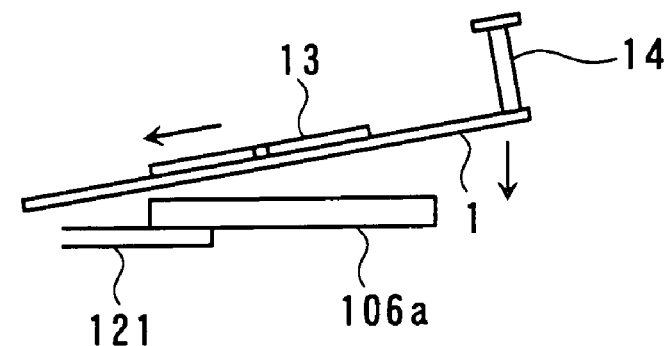
Figure 16C:
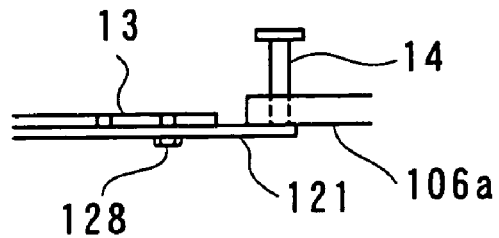

As shown in schematic drawings in FIGS. 16A through 16C, when the head unit 1 is set in position onto the base plate 121 of the main carriage 111, first, the head unit 1 transported by manually carrying with both the handles 14, 14 is placed on both the provisional placement angle members 106a, 106a (provisional placement). Although not specifically illustrated, the tube for supplying filter material of the picturing apparatus B disposed on the arch member 122 is coupled to the piping connection assembly 15 of the head unit 1, and the cable for the control system is coupled to the wiring coupling assembly (see FIG. 16A).

Once the coupling work has been finished, both the handles 14, 14 are held again and the head unit 1 is pushed forward with the provisional placement angle members 106a, 106a serving as guides, and the head unit 1 is inclined so that the front end portion thereof is lowered (see FIG. 16B). When the head unit 1 is inclined, the front end portion of the main body plate 11 is inserted into the rectangular opening 124, and the front end portions of both the supporting members 13, 13 come in touch with the opening edge portions 125, 125 of the rectangular opening 124. Once both the supporting members 13, 13 have come in touch with the opening edge portions 125, 125, both the supporting members 13, 13 are arranged to be floated. The head unit 1 is then pushed inward while sliding it along the opening edge portions 125, 125 starting with the front ends of both the supporting members 13, 13.

Once the front ends of the head unit 1 have come into abutment with the stopper plate 123, the rear end of the head unit 1 is lowered slowly so that the positioning pins 125, 15 of both the opening edge portions are fitted into the pin holes 3 in both the supporting members 13, 13. The head unit 1 is thus caused to be seated on the base plate 121. At this stage, four fixing screws 128 are screwed into both the supporting members 13, 13 by penetrating through the base plate 121 from the lower side of the base plate 121, thereby finishing the work (see FIG. 16C).

As described above, in the unit introduction part 105, the head unit 1 is provisionally placed and the necessary piping work and wiring work are performed. Therefore, the coupling work can be easily performed, and the head unit 1 with the coupling work finished can be appropriately set in position inside a narrow space. In addition, since the head unit 1 is arranged to be set in position by sliding from the provisional placement angle members 106a down to the base plate 12 which is positioned in a lower position by one step, the head unit 1 can be set by soft-landing it to the main carriage 111. It is thus possible to smoothly set the heavy head unit 1 without giving a shock to it.

Figure 17A:
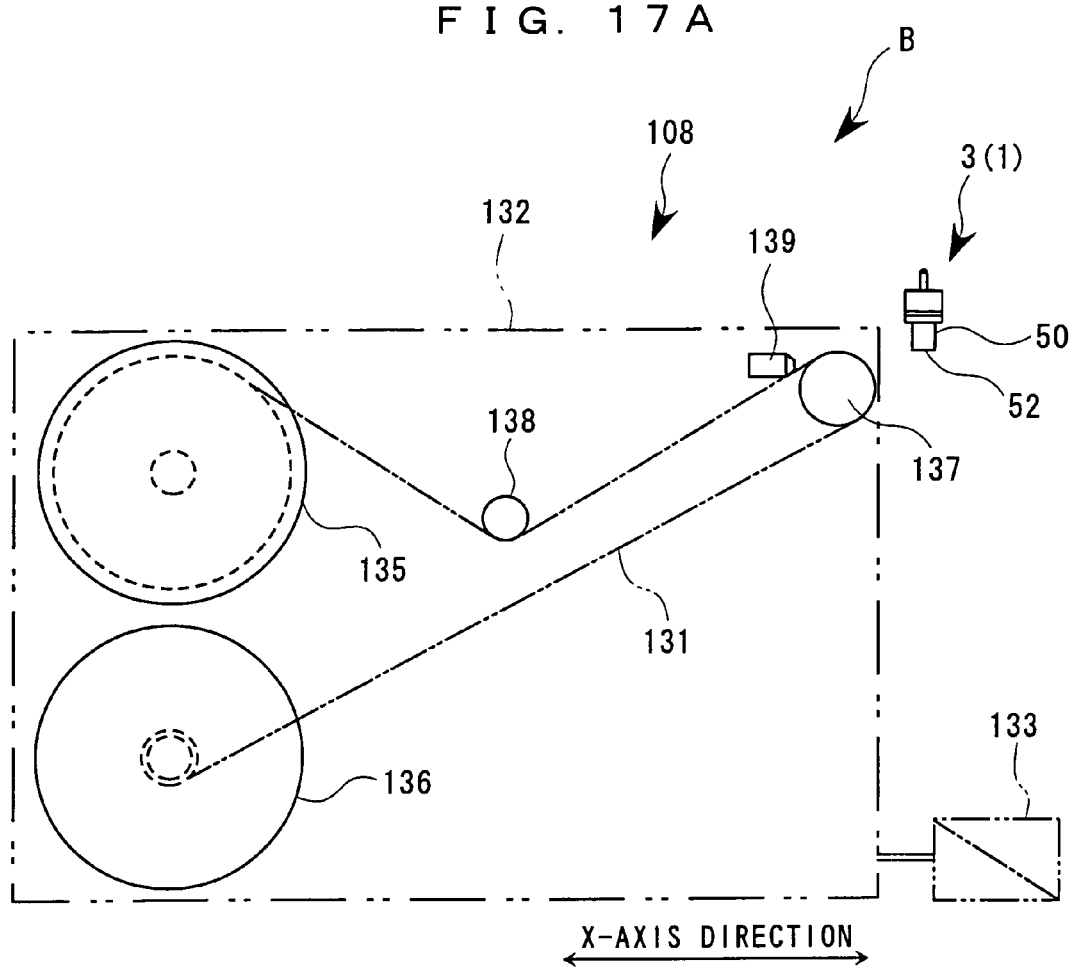
FIGS. 17A and 17B are schematic representations of a wiping device of the picturing apparatus.
Figure 17B:
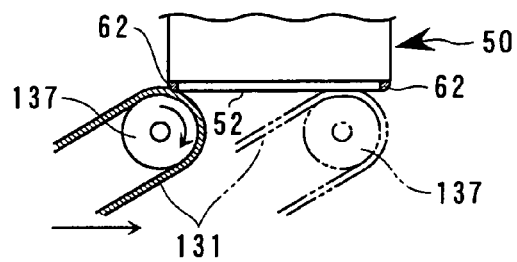

The maintenance part 104 of the picturing apparatus B is provided with a wiping device in a manner to be provided in parallel with the capping device and the cleaning device. As shown in FIGS. 17A and 17B, the wiping device 108 is provided with a wiping unit 132 which is equipped with a wiping sheet 131, and a moving mechanism 133 which moves the wiping sheet 131 back and forth toward and away from the head unit 1. The moving mechanism 133 moves the wiping unit 132 back and forth in the X-axis direction (in the direction of the main scanning) relative to the head unit 1 introduced by the Y-table 113 into the maintenance part 104 to thereby perform the wiping operation.

The wiping unit 133 is provided with: a feeding reel 135 around which is wound the wiping sheet 131; a rolling reel 136 for rolling the wiping sheet 131 that has been fed out of the feeding reel 135; and a wiping roller 137 having a wiping sheet wound around the feeding reel 135 and the rolling reel 136. Between the feeding reel 135 and the wiping roller 137 there is disposed a guide roller 138 which serves the dual function as a rotational speed detecting shaft. In the neighborhood of the wiping roller 137 there is disposed a cleaning liquid feeding head 139.

The feeding reel 135 is rotated while being subjected to braking by a torque limiter which is provided therein, and the rolling reel 136 is driven for rotation by an electric motor which is provided therein. The wiping sheet fed out of the feeding reel 135 changes its direction of traveling route through the guide roller 138. After being fed with the cleaning liquid from the cleaning liquid feeding head 139, the wiping sheet 131 travels round the wiping roller 137 for being rolled into the rolling reel 136.

The wiping roller 137 is a freely rotating roller and is constituted by a rubber roller, or the like, which has an elasticity or flexibility. The wiping roller 137 during the wiping work functions to push the wiping sheet 131 from the lower side toward the head main body 50 of each of the liquid droplet ejection heads 3. During wiping, the wiping roller 137 is caused to rotate by the wiping sheet 131 by receiving the rotation of the rolling reel 136. The wiping unit 132 as a whole is caused to move in the X-axis direction by the moving mechanism 133. As a result, the wiping sheet 131 sequentially comes into contact with the lower surface of the head unit, i.e., the head main body 50 of the twelve liquid droplet ejection heads 3. In other words, the wiping sheet 131 travels in the opposite direction of the relative traveling direction of the head main body 50 so that the nozzle forming surface 52 of each of the head main bodies 50 is wiped out.

The wiping sheet 131 coming into sliding contact with the head main body 50 is supplied, right before reaching the wiping roller 137, with a cleaning liquid, i.e., a solvent, or the like, for the filter material, from the cleaning liquid supply head 139. According to this arrangement, the filter material adhered to the nozzle forming surface 52 of each of the head main bodies 50 is completely wiped out via the wiping roller 137 by means of the wiping sheet 131 impregnated with the cleaning liquid. As described above, the lower end portion of the head main body 50 is chamfered by the molded resin 62. Therefore, the head main body 50 is prevented from getting stuck or caught by the wiping sheet 131.

Figure 18A:
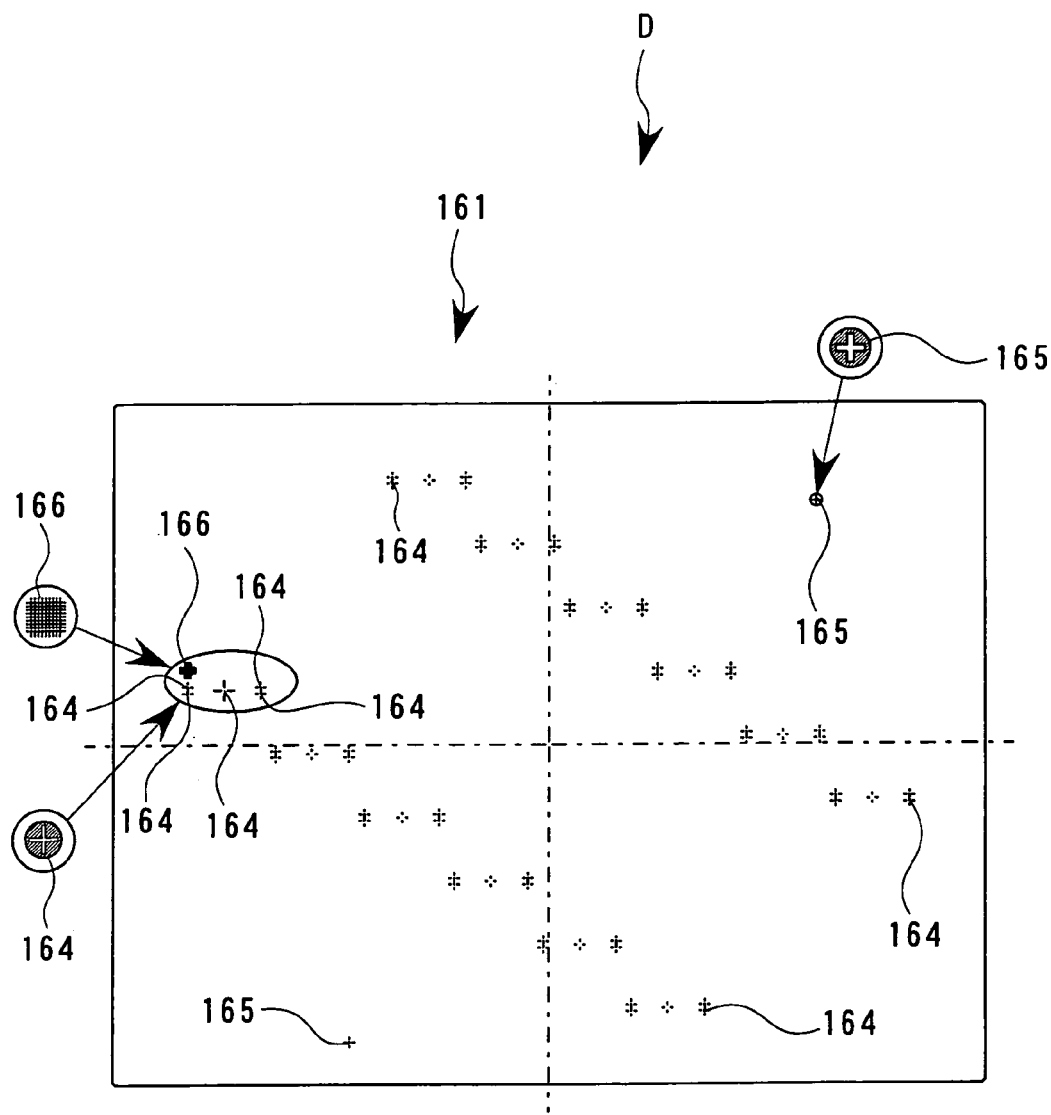
FIGS. 18A and 18B are structural representations of a master plate in an alignment mask.
Figure 18B:
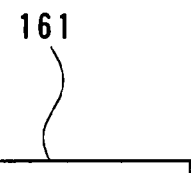
Figure 19:
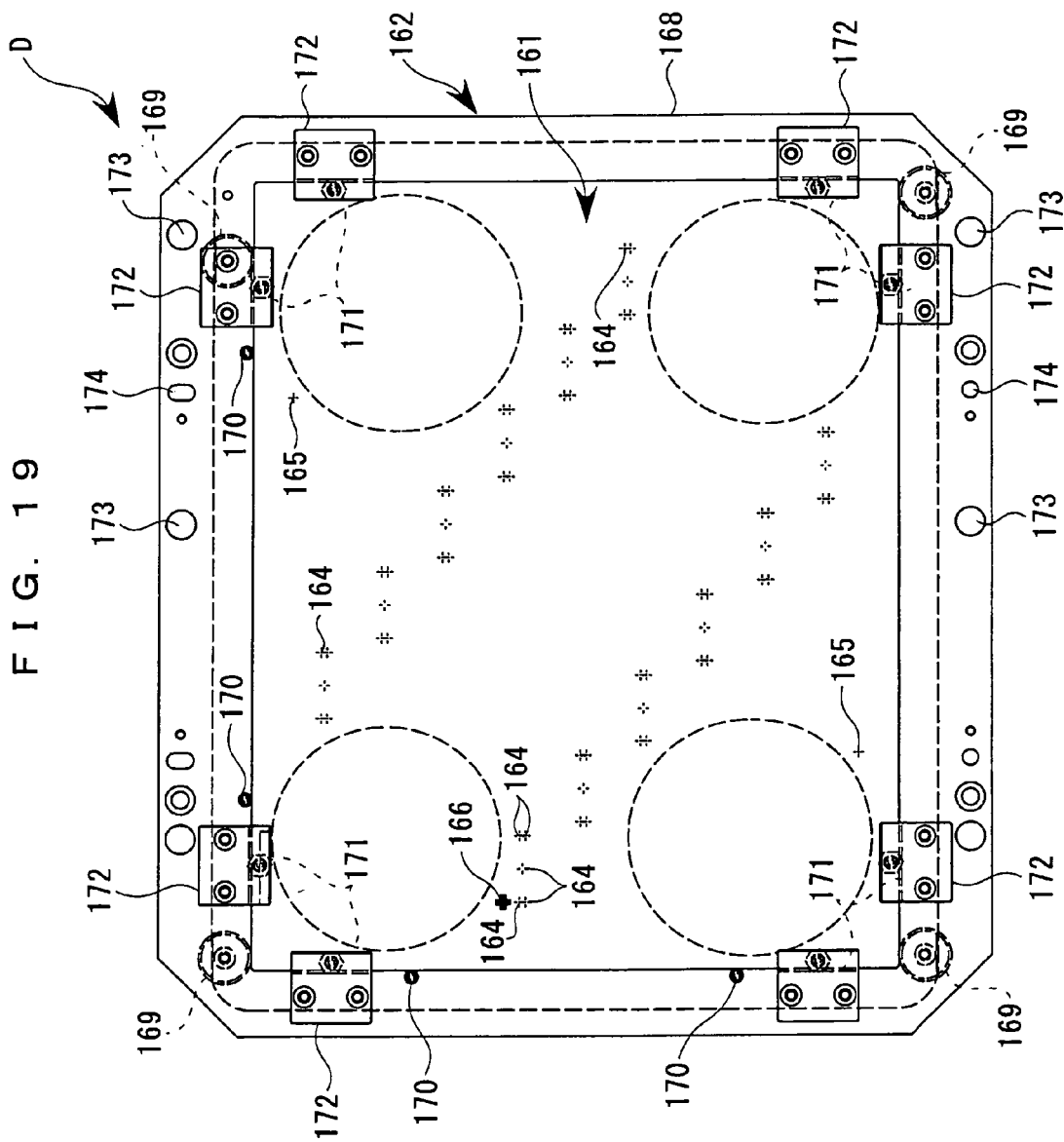
FIG. 19 is a plan view of the alignment mask.

With reference to FIGS. 18A, 18B and 19, a description is made about an alignment mask D. In the assembly apparatus A of the embodiment, it is always necessary to supply a head unit 1 having a certain level of assembly accuracy irrespective of the number of the head units 1 assembled. In order to meet the necessity, there is provided an alignment mask D in which standard positions of the carriage 2 and twelve liquid droplet ejection heads 3 are marked. In other words, the alignment mask D is made to be an original pattern (original model) of the positions of the parts so that the head unit 1 as a copy is assembled in this assembly apparatus A. In this manner, the effects on the head unit 1 in point of accuracy due to peculiar features or due to the change in the lapse of time of each of the assembly apparatuses A is eliminated.

The alignment mask D is made up of: a master plate 161 which has formed therein a master pattern of the standard positions of the carriage 2 and the standard position of each of the liquid droplet ejection head 3; and a plate holder 162 which holds the master plate from the lower side thereof. As described above, each of the liquid droplet ejection heads 3 is disposed at a predetermined angle (40°–60°) relative to the direction of main scanning. The master plate 161 and the plate holder 162 are formed to suit this inclination.

In particular, the master plate 161 is formed to correspond to the head main body 50 of the liquid droplet ejection head 3 which is to be mounted in an inclined manner, i.e., is formed into a rectangle with two sides which are parallel with the longer sides and two sides which are parallel with the shorter sides to thereby eliminate a waste. In addition, the master plate 161 is constituted by a thick transparent quartz glass so as not to give rise to deviations as the original model.

On the surface of this maser plate 161 there are formed six sets of head standard marks on each side, i.e., a total of twelve sets, each set being made up of five standard marks 164, 164, 164, 164, 164 to represent the standard positions of the respective liquid droplet ejection heads 3. On the outside of these twelve sets of head standard marks 164, there are formed a pair of carriage standard marks 165, 165 to represent the standard position of the carriage 2. Furthermore, in the neighborhood of the head standard mark 164 that is located in the end portion, there is formed an image 166 of the object to be pictured for the purpose of adjusting the pixel resolution of the recognition camera 353.

Each of the five standard marks 164 represents the center position of the nozzle forming surface 52 in the liquid droplet ejection head 3 and the positions of the four ejection nozzles 57, 57, 57, 57 which are positioned in the outermost end portions of the two rows of nozzle arrays 53, 53. As shown in FIG. 18A, each of the standard marks 164 has depicted therein a blank cross inside a circular line, and hatched lines inside the circular line in which the cross is depicted, exclusive of the cross itself. When the recognition camera 353 recognizes (pictures) this cross, a cross portion in light color is recognized inside the dark circular portion.

In a similar manner as above, each of the carriage standard marks 165 has depicted therein a blank cross inside a circular line, and hatched lines inside the circular line in which the cross is depicted exclusive of the cross itself. The image 166 to be pictured is formed of a large number of lines depicted at a higher accuracy in the crossed shape. The head standard mark 164 to represent the central position of the nozzle forming surface 52 can be computed from the four head standard marks 164 representing the positions of the four ejection nozzles 57. Therefore, they may be omitted. The pattern on the alignment mask D is formed by forming a translucent film of metals represented by Cr, or the like, over the entire surface and the film thus formed is subjected to patterning by using a semiconductor technology, or in a similar manner.

Figure 20:
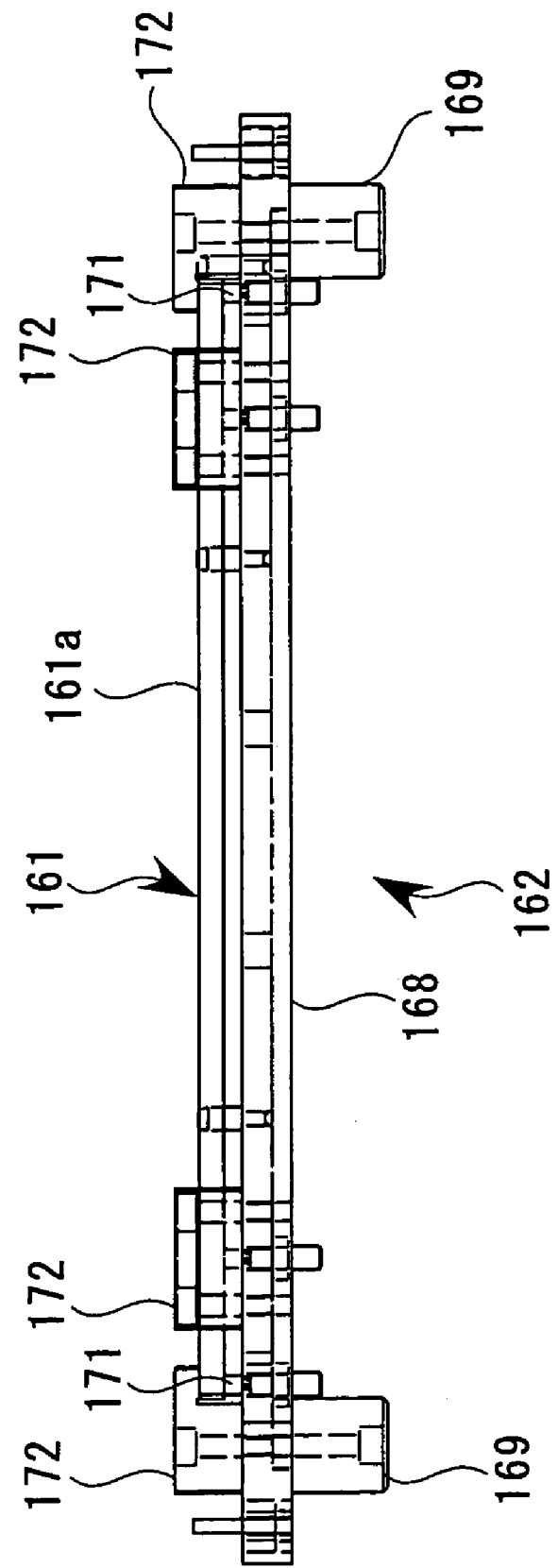
FIG. 20 is a front view of the alignment mask.

As shown in FIGS. 19 and 20, the plate holder 162 is provided with: a substantially square master supporting plate 168 which is formed slightly larger than the master plate 161; four resin leg blocks 169, 169, 169, 169 which are mounted on the back four corners of the master supporting plate 168; a plurality of urethane stoppers 170 which position the master plate provided on the front surface of the master supporting plate 168 such that the master plate 161 is immovable in the longitudinal and lateral directions; a plurality of supporting pins 171 which support the master plate 161 in a manner floating on the master supporting plate 168; and a plurality of pushing or holding blocks 172 which push, from the upper side, the master plate 168 which is provided to correspond to the supporting pins 171.

The plurality of urethane stoppers 170 are caused to be abutted, two each, against the four sides of the master plate 161. The plurality of supporting pins 171 are disposed, two each, on the corner portions of the master plate 161 such that they are adjustable in height relative to the master supporting plate 168. In other words, each of the supporting pins 171 has a construction of an adjustable bolt such that the level of the mark forming surface 161a can be adjusted. The plurality of pushing blocks 172 correspond to the respective supporting pins 171 and are arranged to push them in a manner to sandwich the master plate 161 between the supporting pins 171.

The alignment mask D having the above arrangement is fixed to the set table 231, which is described in more detail hereinafter, of the assembly apparatus A. Therefore, in each of the left and right edge portions of the master supporting plate 168, there are formed two fixing holes 173, 173 and a pin hole 174 which is formed between the two fixing holes 173, 173. Then, the alignment mask D and the head unit 1 are set in position on the setting table 231 of the assembly apparatus A in exchange for each other.

Now, a description is made about the assembly apparatus A for, and the method of assembling of, the liquid droplet ejection heads 3. The assembly apparatus A has, as an object of assembling, the head unit 1 in which twelve liquid droplet ejection heads 3 are provisionally mounted on the carriage 2, and has an object of positioning and adhering (provisionally fixing) at a high accuracy each of the liquid droplet ejection heads 3 to the carriage 2 of the head unit 1. The head unit 1 to which the liquid droplet ejection heads 3 have been provisionally fixed passes in the assembly apparatus A through the cleaning step and the step of assembling parts such as the above-described handles 14, or the like, and is set in position to the picturing apparatus B.

As shown in FIGS. 21 through 25, the assembly apparatus A has a transparent cover 202 on the supporting base 201. The air supply device 203, or the like, is assembled into the supporting base 301 and the apparatus base 204 is mounted inside the safety cover 202, whereby the main constituent apparatus 205 is housed. The supporting base 201 is provided with four casters and six supporting legs with adjusting bolts. In the front face of the safety cover 202 there is provided an opening and closing door 208 for introducing the head unit 1. On an upper surface of the safety cover 202, there is vertically provided an alarm lamp 209.

The main constituting apparatus 205 is provided with: a unit moving apparatus 211 on which is mounted the head unit 1 for moving it in the X, Y, and Θ directions on the horizontal plane; a head correction apparatus 212 which performs the positional correction to each of the liquid droplet ejection heads 3 provisionally mounted on the carriage 2; a provisional fixing apparatus 213 which adheres each of the liquid droplet ejection heads 3 to the carriage 2; a recognition apparatus 214 which performs the positional recognition of the carriage 2 and each of the liquid droplet ejection heads 3 prior to the positional correction thereof; and a control apparatus 215 which performs an overall control of the unit moving apparatus 211, the head correction apparatus 212, the provisional fixing apparatus 213 and the recognition apparatus 214 (see FIG. 50).

In this assembly apparatus A, the above-described alignment mask D is introduced in advance into the moving apparatus 211, each of the standard marks 164, 165 are image-recognized by means of the recognition apparatus 214, the standard positional data of the carriage 2 and each of the liquid droplet ejection heads 3 are stored, and the positional correction of each of the liquid droplet ejection heads 3 is performed based on the standard positional data (master data). The alignment mask D is introduced at uniform intervals depending on the frequency of assembling (number of assembled units) and the working hours even with the same head unit 1, as well as at the time when a new head unit 1 is newly introduced and assembled. The standard positional data are then reset.

The head unit 1, on the other hand, is set in position on the upper face of the unit moving apparatus 211 with the head main body 50 of each of the liquid droplet ejection heads 3 facing upward. In assembling the head unit 1, the work is started with the positional recognition of the carriage 2 by means of the recognition apparatus 214. Once the position of the carriage 2 has been recognized, this recognition data and the standard positional data are compared with each other. Based on the result of comparison, the positional correction of the carriage 2 is performed by the unit moving apparatus 211. Then, the positions of the liquid droplet ejection heads 3 are recognized by means of the recognition apparatus 214. Based on the result of this recognition (result of comparison), the positional correction of the liquid droplet ejection heads 3 is performed by the head correction apparatus 212.

Then, while the state of this positional correction is maintained, the liquid droplet ejection heads 3 are adhered to the carriage 2 by means of the provisional fixing apparatus 213 through the head holding member 4. At this time, until the adhering agent has been hardened, the head correction apparatus 212 pushes or holds the liquid droplet ejection heads 3 (head holding member 4) so as not to move. The steps of positional recognition of the liquid droplet ejection heads 3 to the adhering step are repeated by the same number as that of the liquid droplet ejection heads 3, thereby finishing the provisional fixing of all the liquid droplet ejection heads 3.

Figure 21:
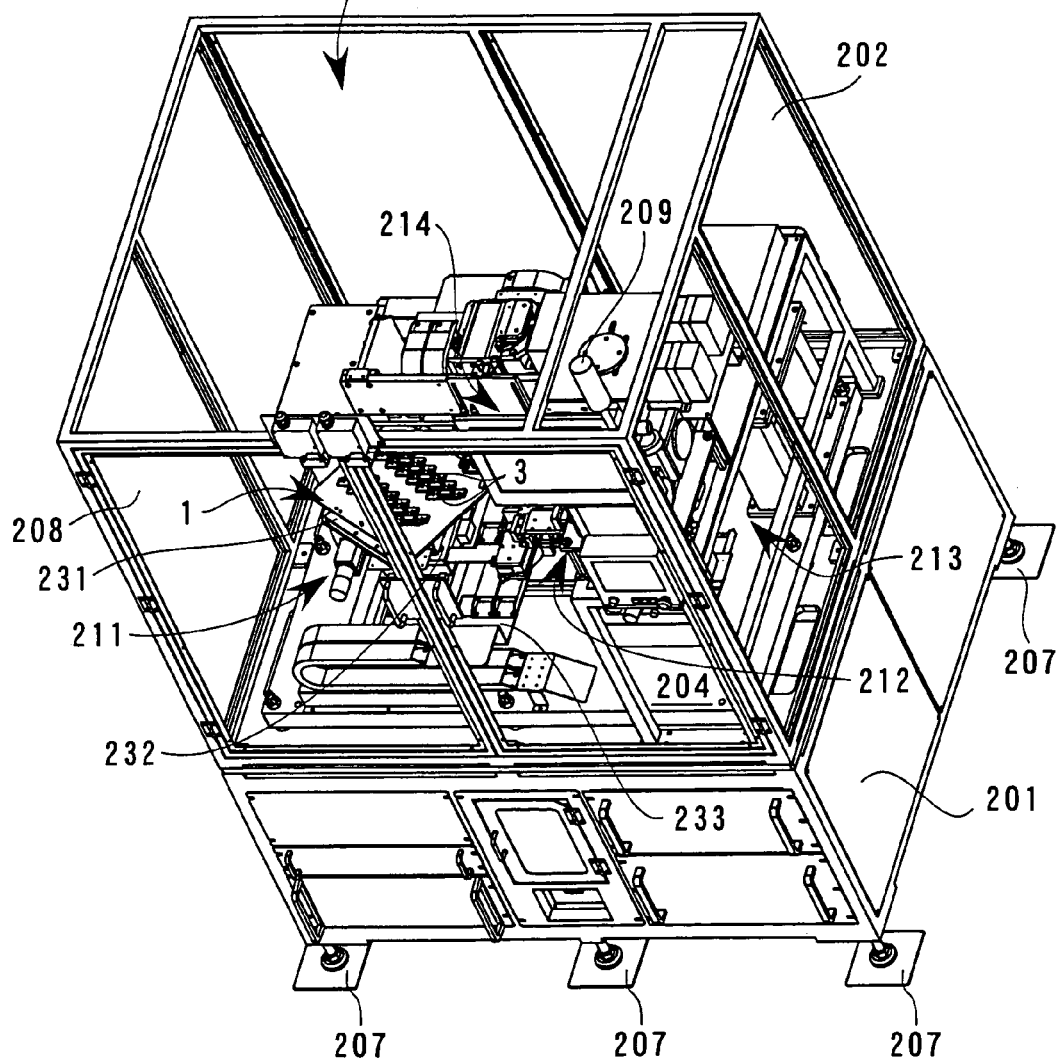
FIG. 21 is an overall perspective view of an assembling apparatus as seen from the front side thereof.
Figure 26:
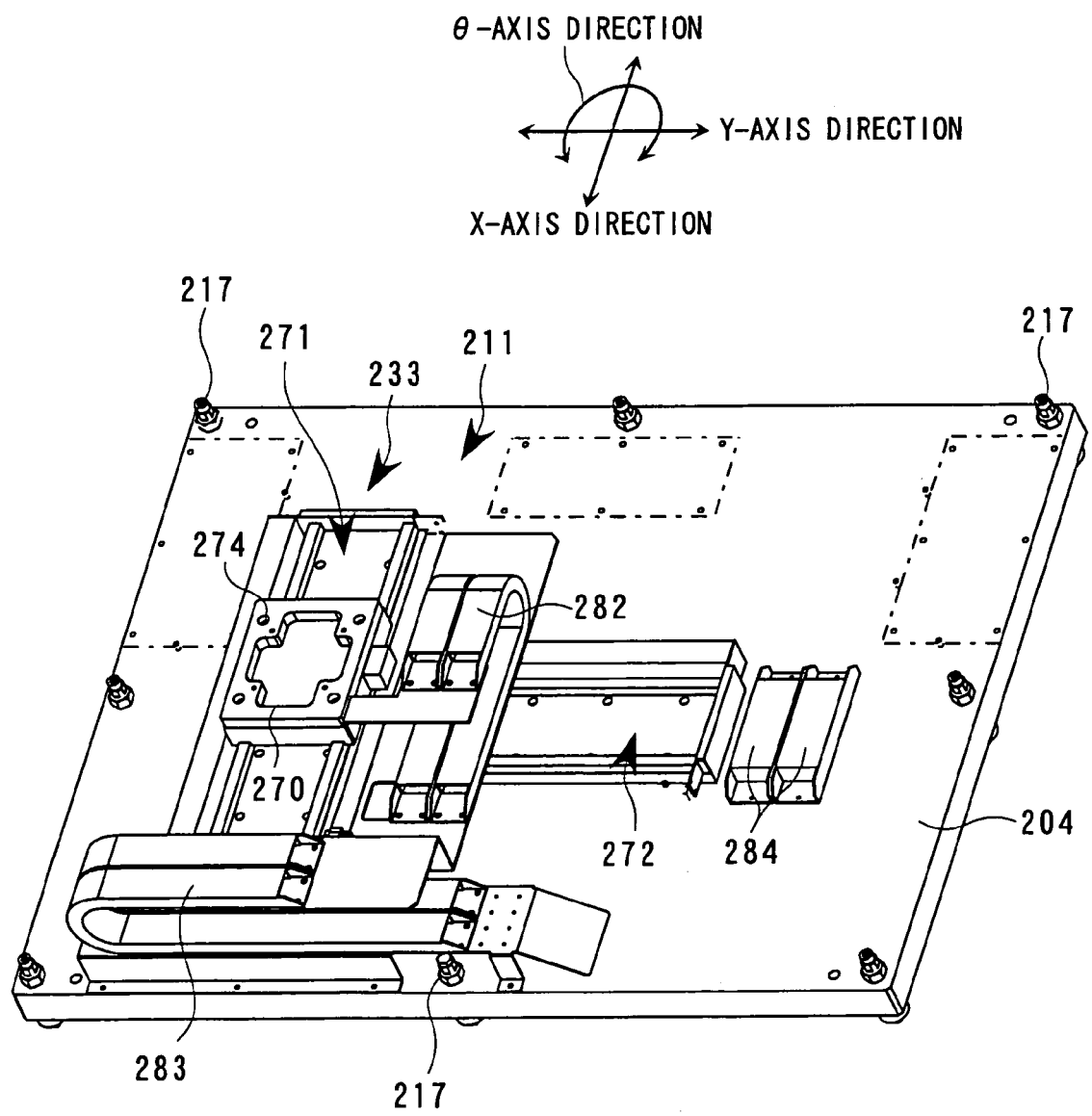
FIG. 26 is a perspective view around an X·Y table in a unit moving apparatus.

As shown in FIGS. 21 and 26, the unit moving apparatus 211 is placed on the plate-like apparatus base 204 which is horizontally supported by three adjusting bolts 217, with a spacious occupying area. The unit moving apparatus 211 is provided with: a setting table 231 which sets the head unit 1 in an inverted state; a Θ table 232 which supports the set table from the lower side; and an X·Y table 233 which supports the table from the lower side. The head unit 1 is set in position at an inclination to suit the inclination of the liquid droplet ejection heads 3 mounted together with the setting table 231. Therefore, the direction corresponding to the direction of the main scanning of the liquid droplet ejection heads 3 becomes the X-axis direction and the direction of the subsidiary scanning becomes the Y axis direction.

As shown in FIG. 27, the setting table 231 is provided with: a rectangular base plate 235 which has formed therein a plurality of circular punched holes 236; and a pair of band-shaped blocks 237, 237 which are fixed to both ends of the base plate 235. On an upper surface of each of the bar-shaped blocks 237, there is vertically disposed a positioning pin 238 and two screwed holes 239, 239. In other words, the head unit 1 is arranged to be positioned relative to the setting table 231 at the two left and right positions and be fixed by screws at a total of four positions. In the central portion of the base plate 235, there are formed four penetrating holes 240 for fixing the setting table 231 to the Θ table 232, as well as other arrangements.

As described above, the head unit 1 is arranged to be fixed to the E) table through the setting table 231, and the alignment mask D is similarly arranged to be fixed to the table 232 through the setting table 231. In this case, the head unit 1 and the alignment mask D are designed such that the nozzle forming surface 52 of each of the liquid droplet ejection heads 3 of the head unit 1 fixed to the Θ table and the mark forming surface (the surface of the master plate) 161a of the alignment mask D fixed to the Θ table 232 are positioned on the same horizontal plane.

Similarly, the weight of the head unit 1 and the weight of the alignment mask D inclusive of the plate holder 162 are designed to attain substantially the same weight. In this manner, it is so arranged that the positional recognition work of the alignment mask D and the positional recognition work of the head unit 1 can be made on the same conditions. The setting table 231 is made to be a part for exclusive use by the head unit 1 and, therefore, if the head unit 1 is changed, the setting table 231 is also changed accordingly.

Figure 28:
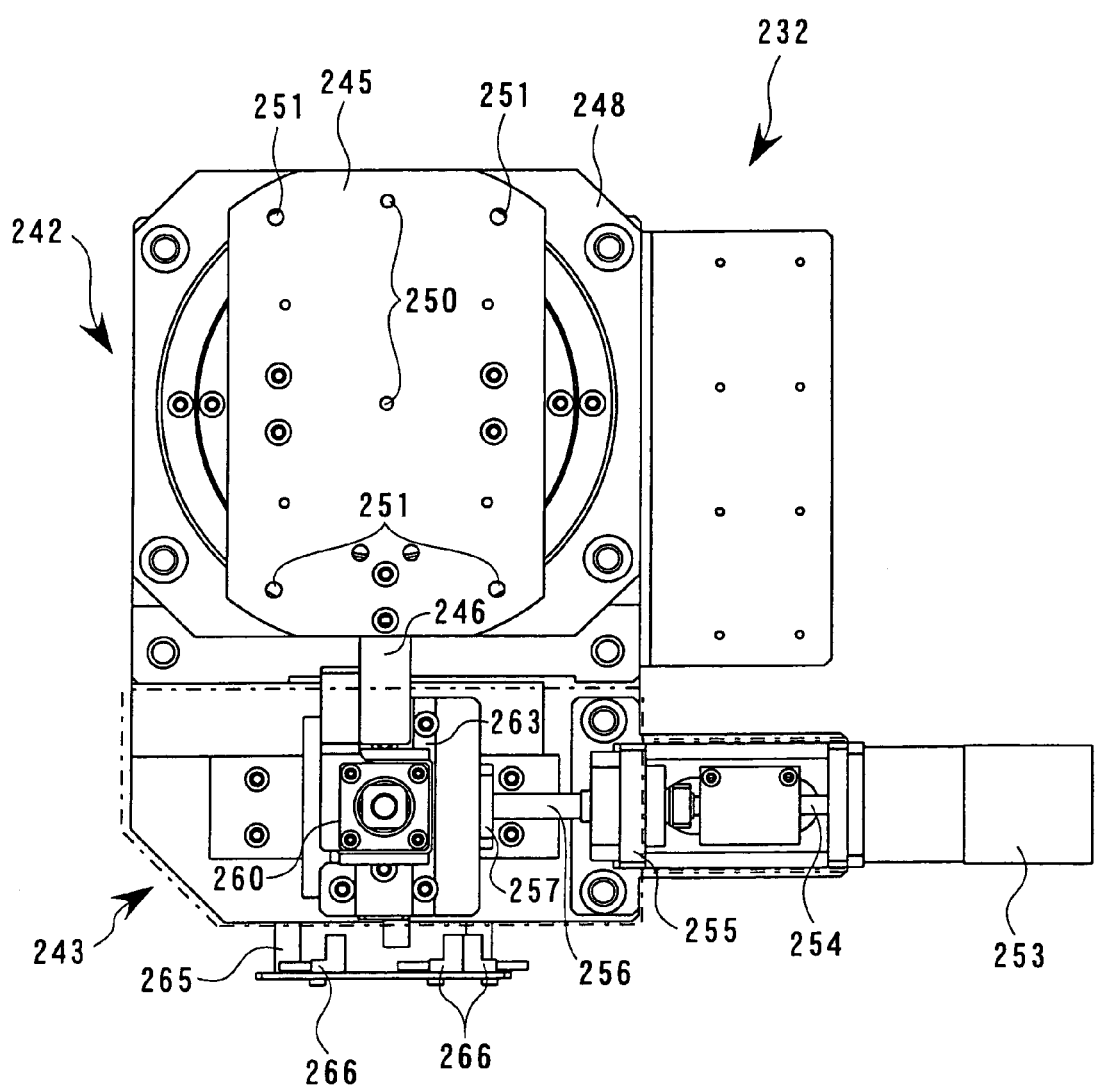
FIG. 28 is a plan view of a Θ table of the unit moving apparatus.
Figure 29:
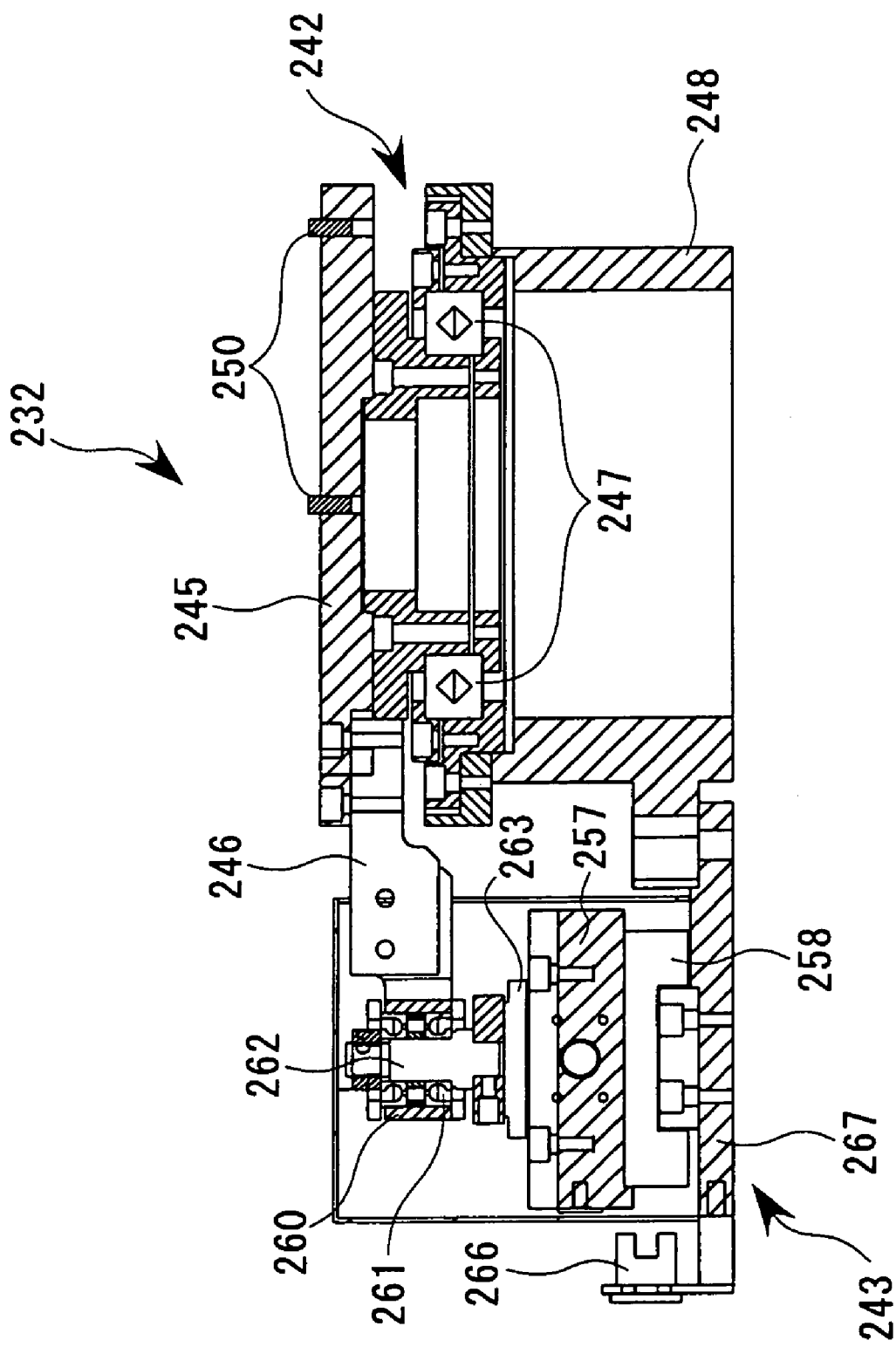
FIG. 29 is a sectional side view of the Θ table of the unit moving apparatus.
Figure 30:
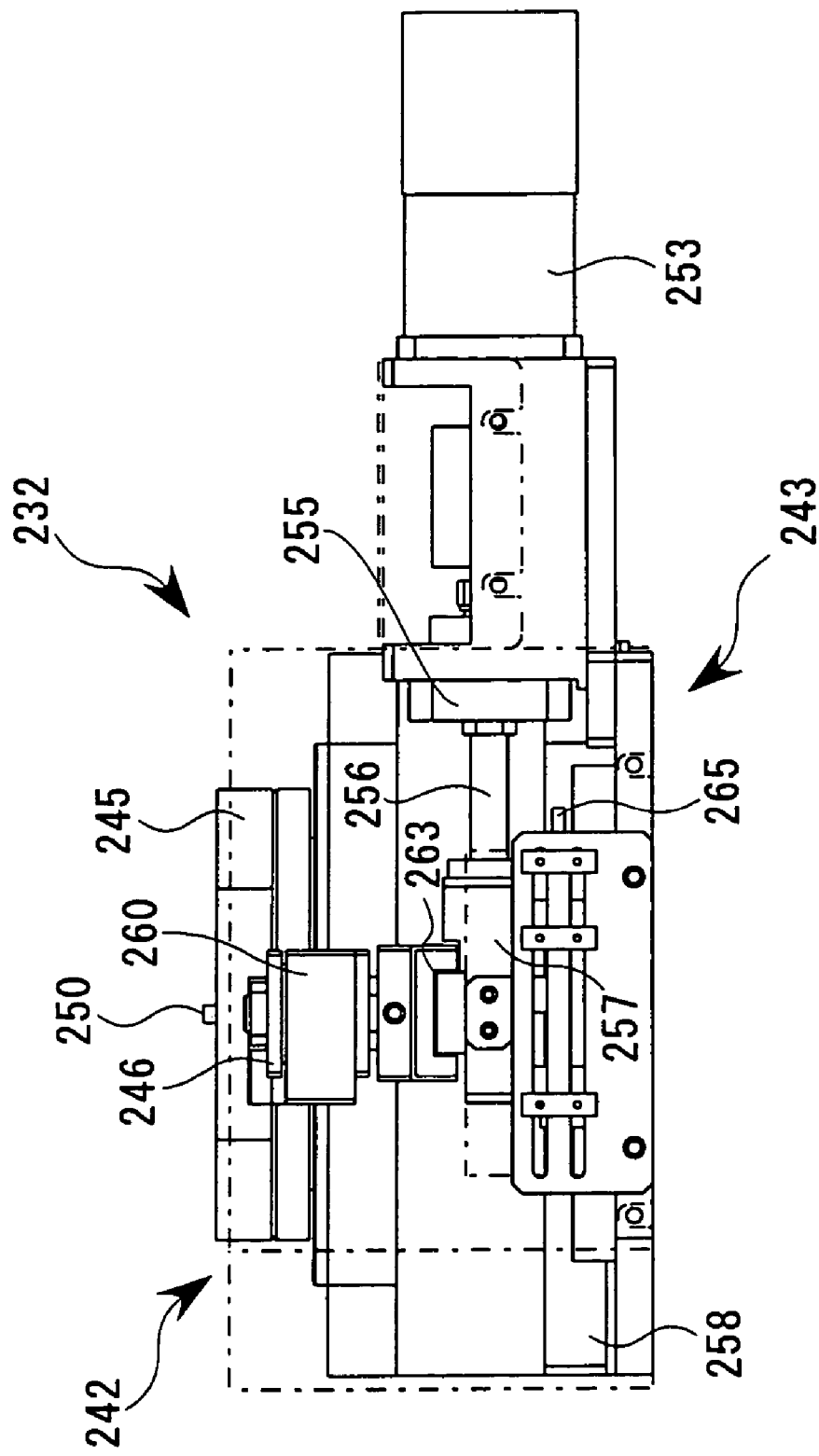
FIG. 30 is a front view of the Θ table of the unit moving apparatus.

With reference to FIGS. 28, 29 and 30, a description will now be made about the Θ table 232. The Θ table 232 is made up of: a rotary operation part 242 which slightly rotates (or rotates by minute rotation) the head unit 1 through the setting table 231; and a back-and-forth driving part 243 which drives the rotary operation part 242. The rotary operation part 242 has: a table main body 245 to which is fixed the setting table 231; a connection arm 246 which extends from the table main body 245 towards the back-and-forth driving part 243; a roller ring 247 which rotatably supports the table main body 245; and a supporting base 248 which supports the roller ring 247. The setting table 231 is screwed to the upper surface of the table main body 245 in a manner set in position by means of the two positioning pins 250, 250 which are disposed in two positions on the table main body 245, and the screw holes at four positions.

The back-and-forth moving part 243 has: a Θ table motor (servo motor) 253 which constitutes a power source; a ball screw 256 which is connected to a main shaft 254 of the Θ table motor 253 through a coupling 255; a female-screwed block 257 to which is screwed the ball screw 256; a main slider 258 which slidably supports the female-screwed block 257 in the axial direction of the ball screw 256 (in the X-axis direction); an arm receiver 260 which receives the front end portion of the connection arm 246; a vertical axis member 262 which rotatably supports the arm receiver 260 through a bearing 261; and a subsidiary slider 263 which supports the vertical axis member 262 in a manner slidable in the Y-axis direction relative to the female-screwed block 257.

The Θ table motor 253 is arranged to be rotatable both in one direction and in the opposite direction. When the table 253 rotates in one direction and in the opposite direction, the female-screwed block 257 moves back and forth in the X-axis direction due to the ball screw 256 by being guided by the main slider 258. When the female-screwed block 257 moves back and forth, the subsidiary slider 263 and the vertical axis member 262 which are supported by the female-screwed block 257 also move back and forth in the X-axis direction. In addition, when the vertical axis member 262 moves back and forth, the connection arm 246 and the table main body 245 rotate about the axial center of the table main body 245 through the arm receiver 260 which is rotatably supported by the vertical axial member 262. In other words, the table main body 245 slightly rotates in one direction and in the opposite direction on the same horizontal plane (i.e., moves in one direction and in the opposite direction in the Θ direction).

As a result of this rotation, the distance between the centers of the table main body 245 and the vertical axis member 262 changes. This change in the distance is, however, absorbed by an adequate slight movement of the vertical axis member 262 in the Y-axis direction through the subsidiary slider 263. By means of a light-shielding plate 265 which projects from the female-screwed block 257 and by means of the three photo-interrupters 266 which the light-shielding plate 265 faces as a result of back and forth movement of the female-screwed block 257, the movement end position of the female-screwed block 257, i.e., the range of rotation (angle) of the table main body 245 is restricted (for the prevention of overrunning).

The back-and-forth driving part 243 is supported by the supporting plate 267 which is provided on the lower side of the main slider 258, and this supporting plate 267 is fixed to the supporting base 248 of the rotary operation part 242. The supporting base 248 is placed on the X·Y table 233.

Figure 31:
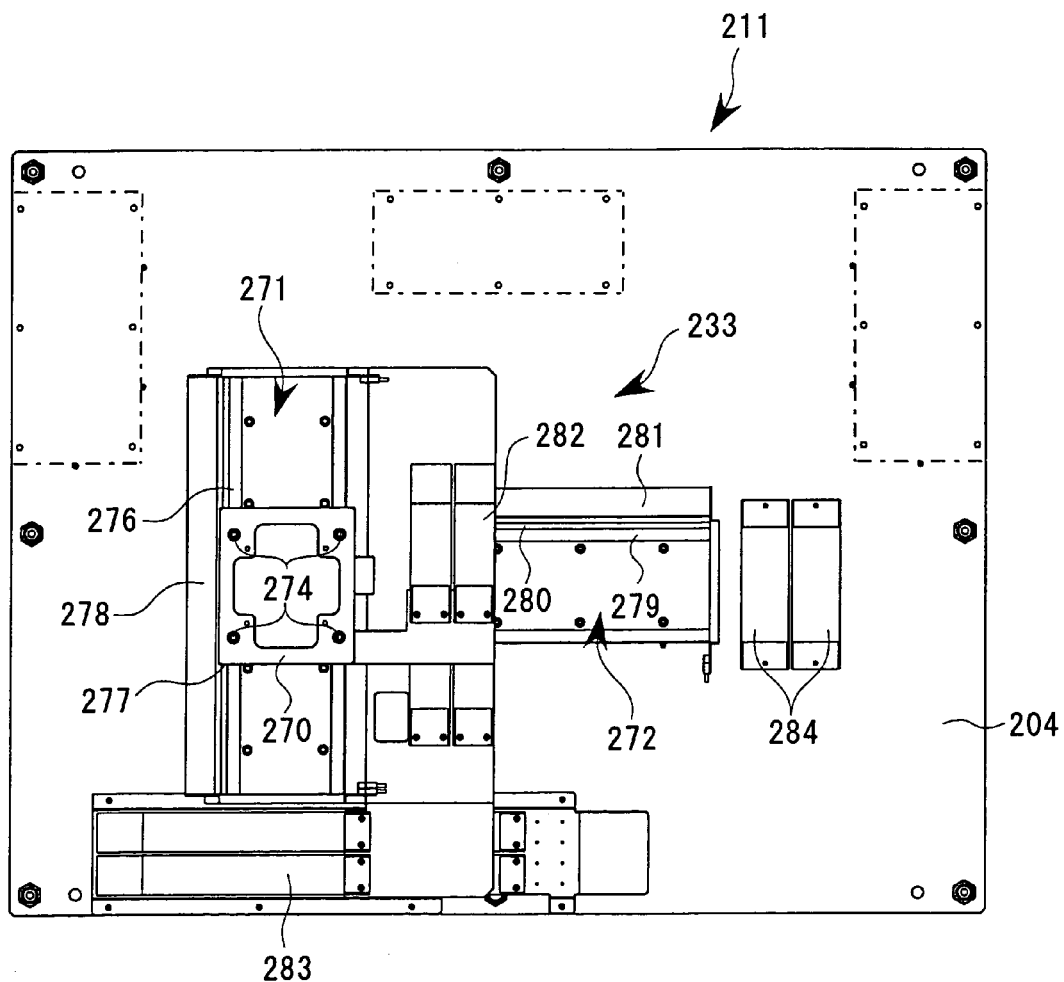
FIG. 31 is a plan view around the X·Y table of the unit moving apparatus.
Figure 32:
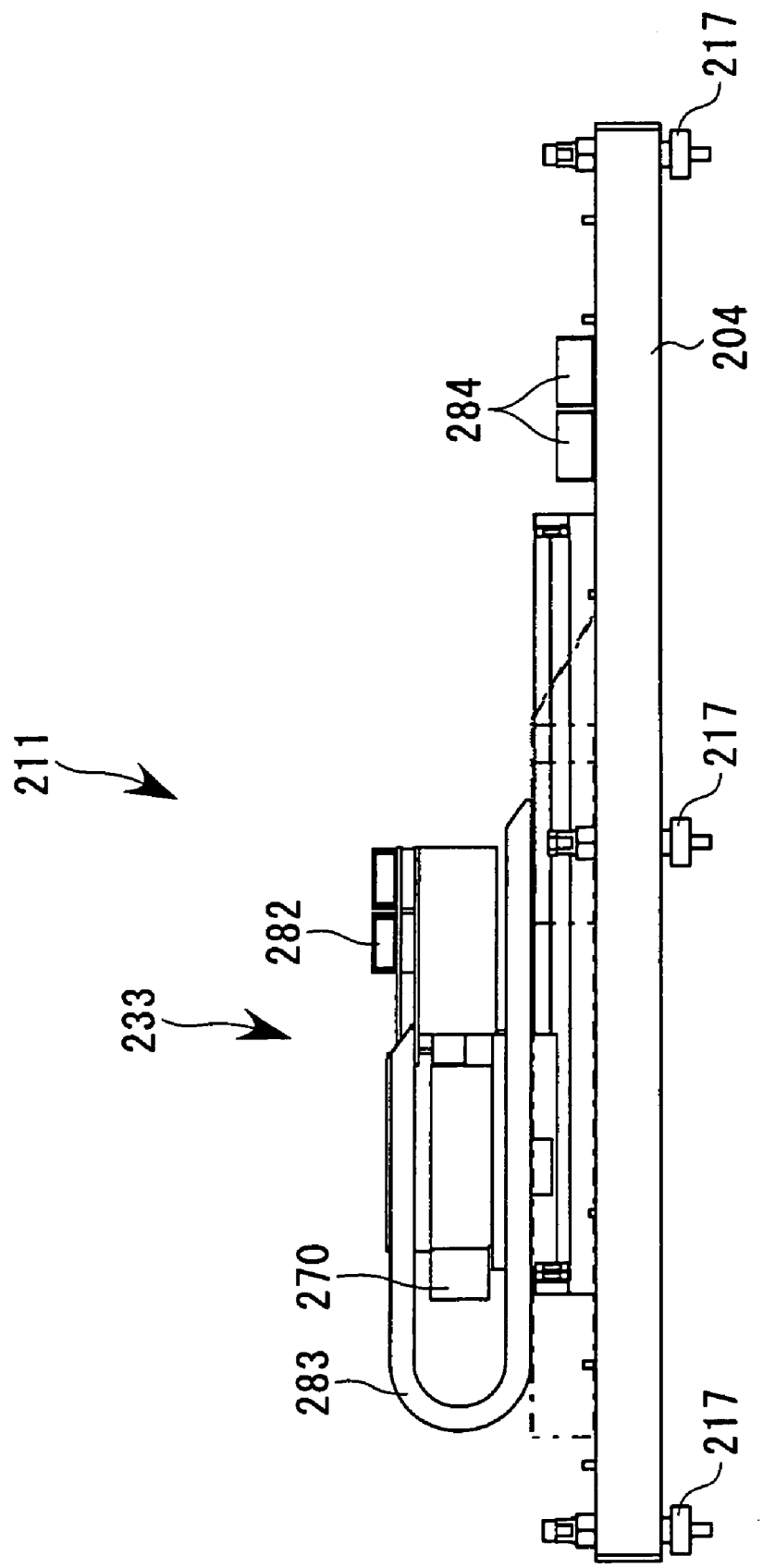
FIG. 32 is a front view around the X·Y table of the unit moving apparatus.

With reference to FIGS. 26, 31 and 32, a description will now be made about the X·Y table 233. The X·Y table 233 has: a supporting block 270 which supports the Θ table 232 from the lower side; an X-axis table 271 which supports the supporting block 270 in a manner slidable in the X-axis direction; and a Y-axis table 272 which supports the X-axis table 271 in a manner slidable in the Y-axis direction. The supporting block 270 has screwed holes 274 at four points, and the Θ table 232 is fixed to the supporting block 270 through the screwed holes at these four points.

The X-axis table 271 is made up of: an X-axis air slider 276; an X-axis linear motor 277; and an X-axis linear scale 278 which is disposed in parallel with the X-axis air slider 276. Similarly, the Y-axis table 272 is made up of: a Y-axis air slider 279; a Y-axis liner motor 280; and a Y-axis liner scale 281 which is disposed in parallel with the Y-axis air slider 279. In the figures, reference numerals 282 and 283 denote a flexible X-axis cable bundle and a flexible Y-axis cable bundle, respectively. Reference numerals 284, 284 denote amplifiers for both the liner motors 277, 280.

The X-axis linear motor 277 and the Y-axis linear motor 280 are appropriately driven to thereby move the table in the X-axis direction and in the Y-axis direction. In other words, the head unit 1 (or the alignment mask D) which is set on the setting table 231 moves on the horizontal plane in the Θ-axis direction by the table 231 and also in the X-axis direction and in the Y-axis direction by the X·Y table 233.

A description is made about the head correction apparatus 212. This head correction apparatus 212 has the following function. Namely, based on the positional recognition of the liquid droplet ejection head 3 by means of the recognition apparatus 214, the liquid droplet ejection head 3 is slightly moved in the X-axis, Y-axis and Θ-axis directions through the head supporting member 4, to thereby perform the positioning (correction of position) of the liquid droplet ejection head 3. The head correction apparatus 212 also has the function of urging the head holding member 4 against the carriage 2 in cooperation with the provisional fixing apparatus 213 until the adhesive agent has been hardened.

Figure 23:
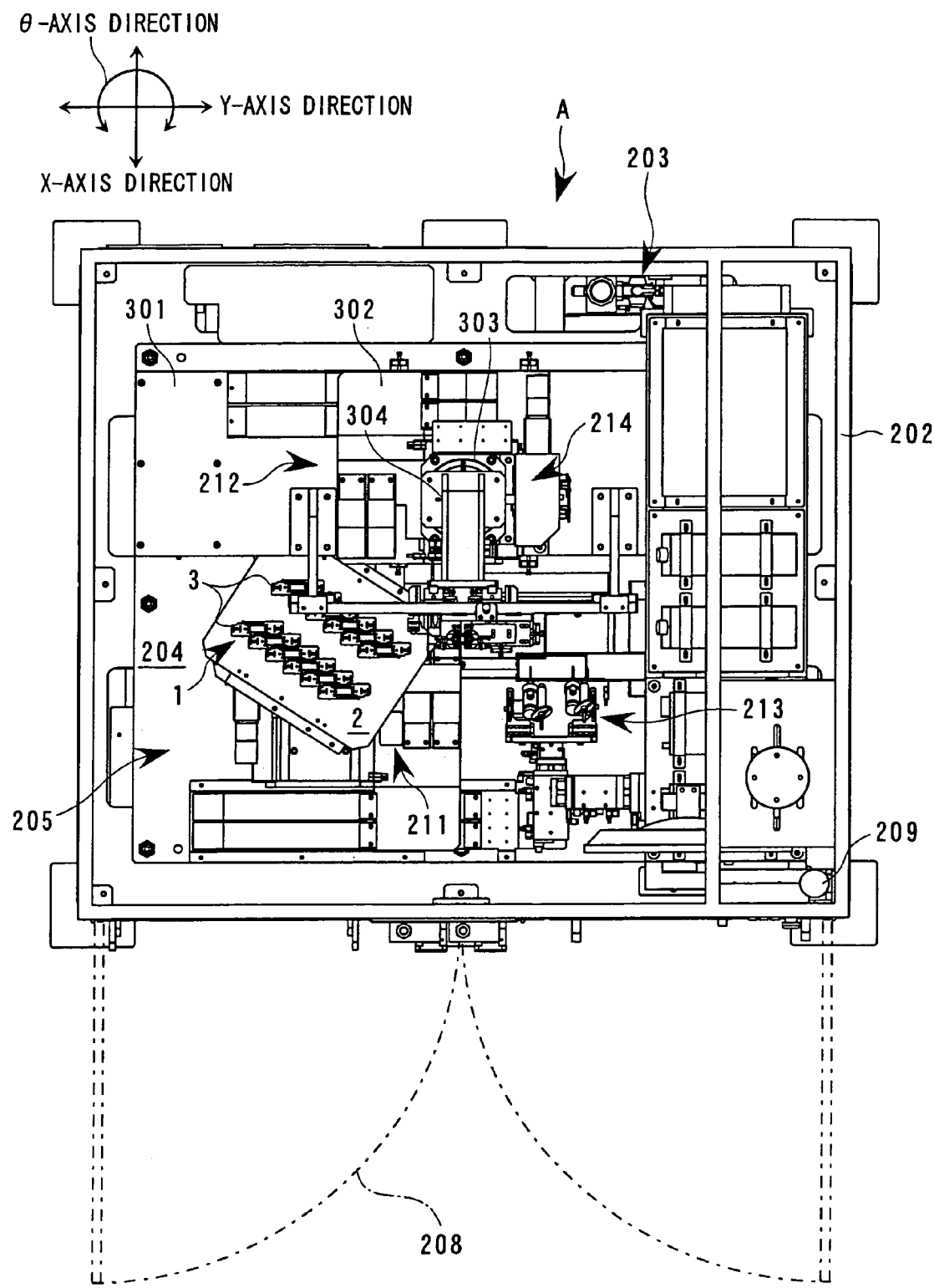
FIG. 23 is an overall plan view of the assembling apparatus.
Figure 33:
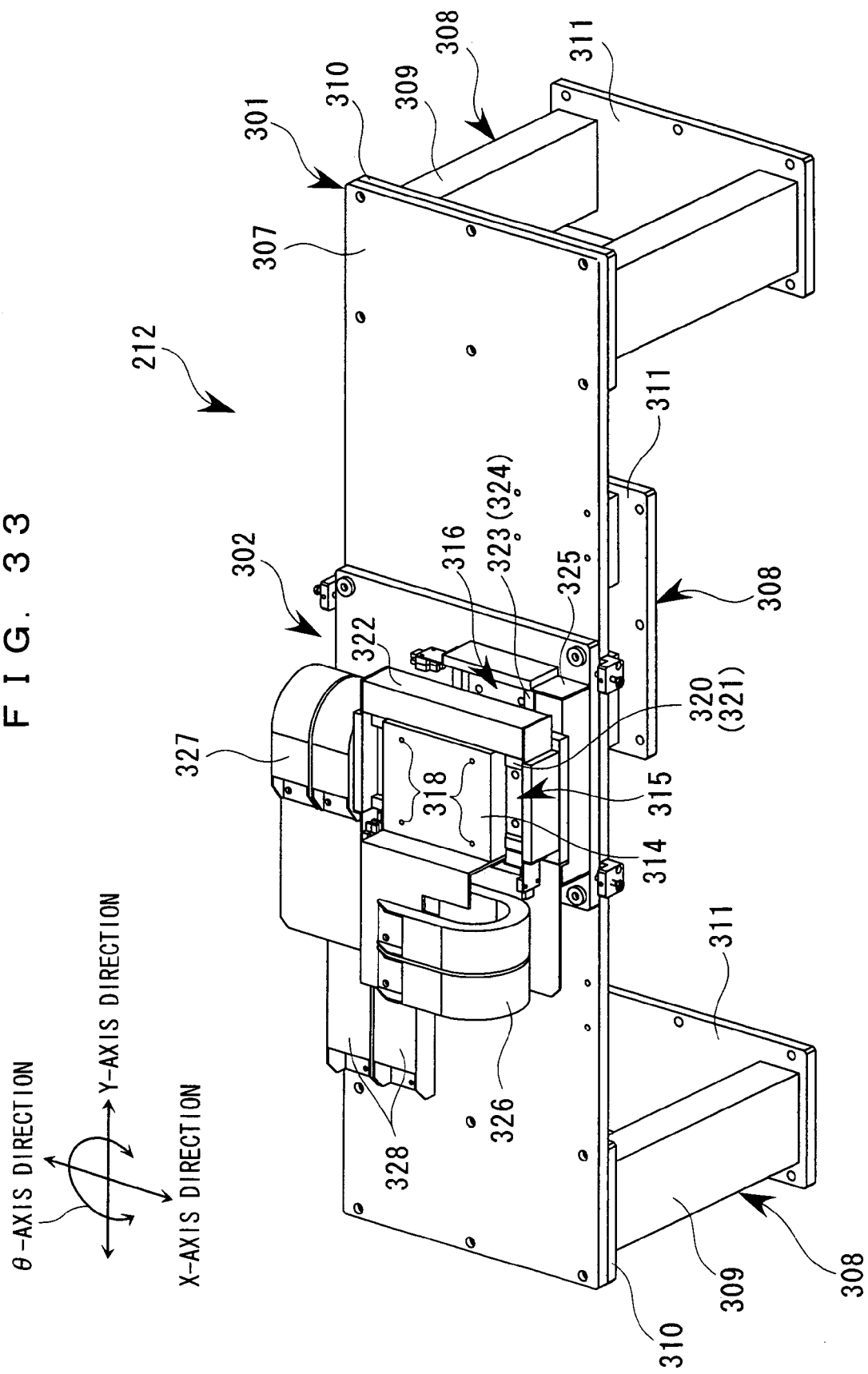
FIG. 33 is a perspective view around a correction X·Y table in a head correction apparatus.
Figure 34:
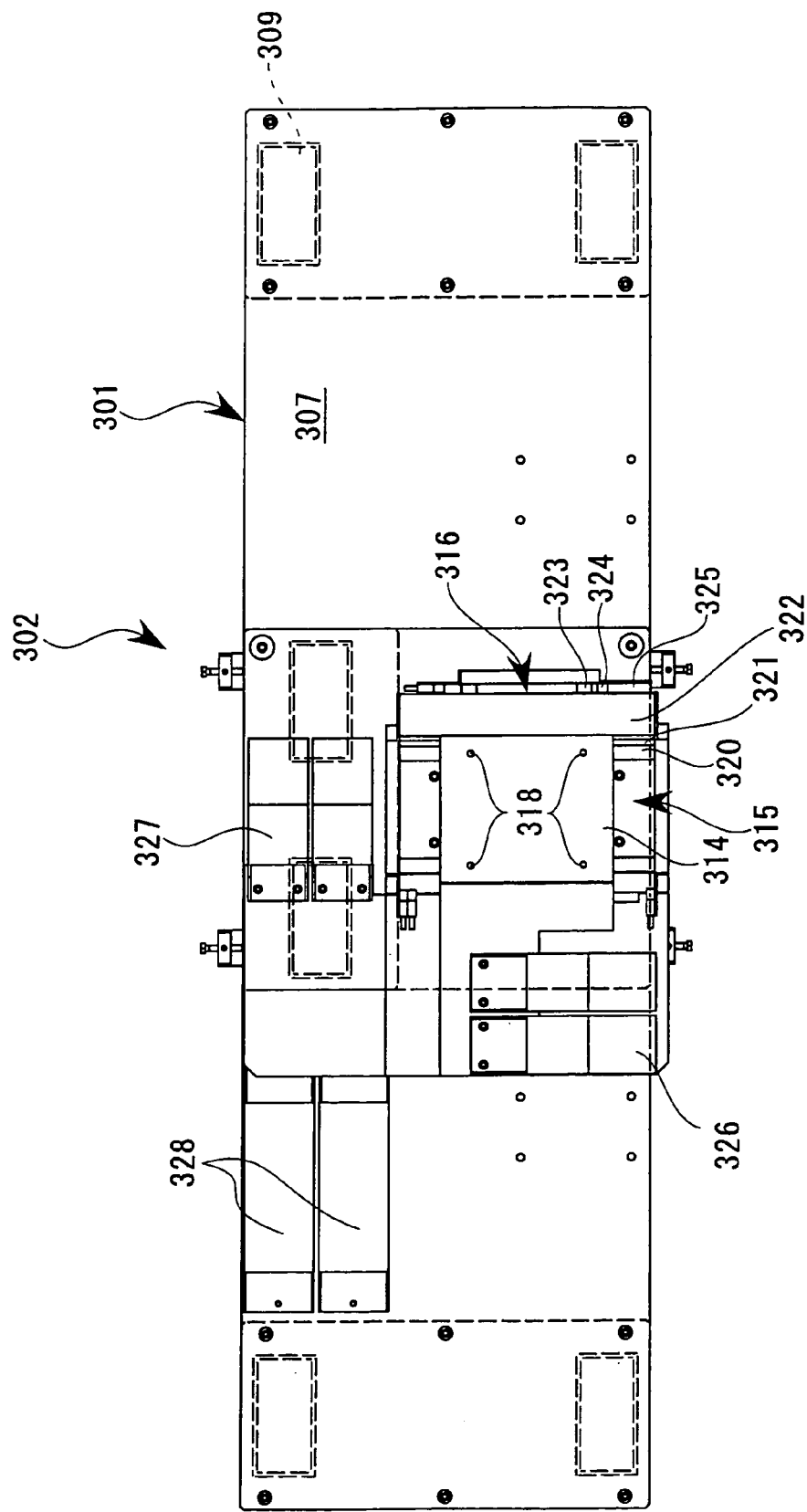
FIG. 34 is a plan view of around the correction X·Y table in a head correction apparatus.
Figure 35:
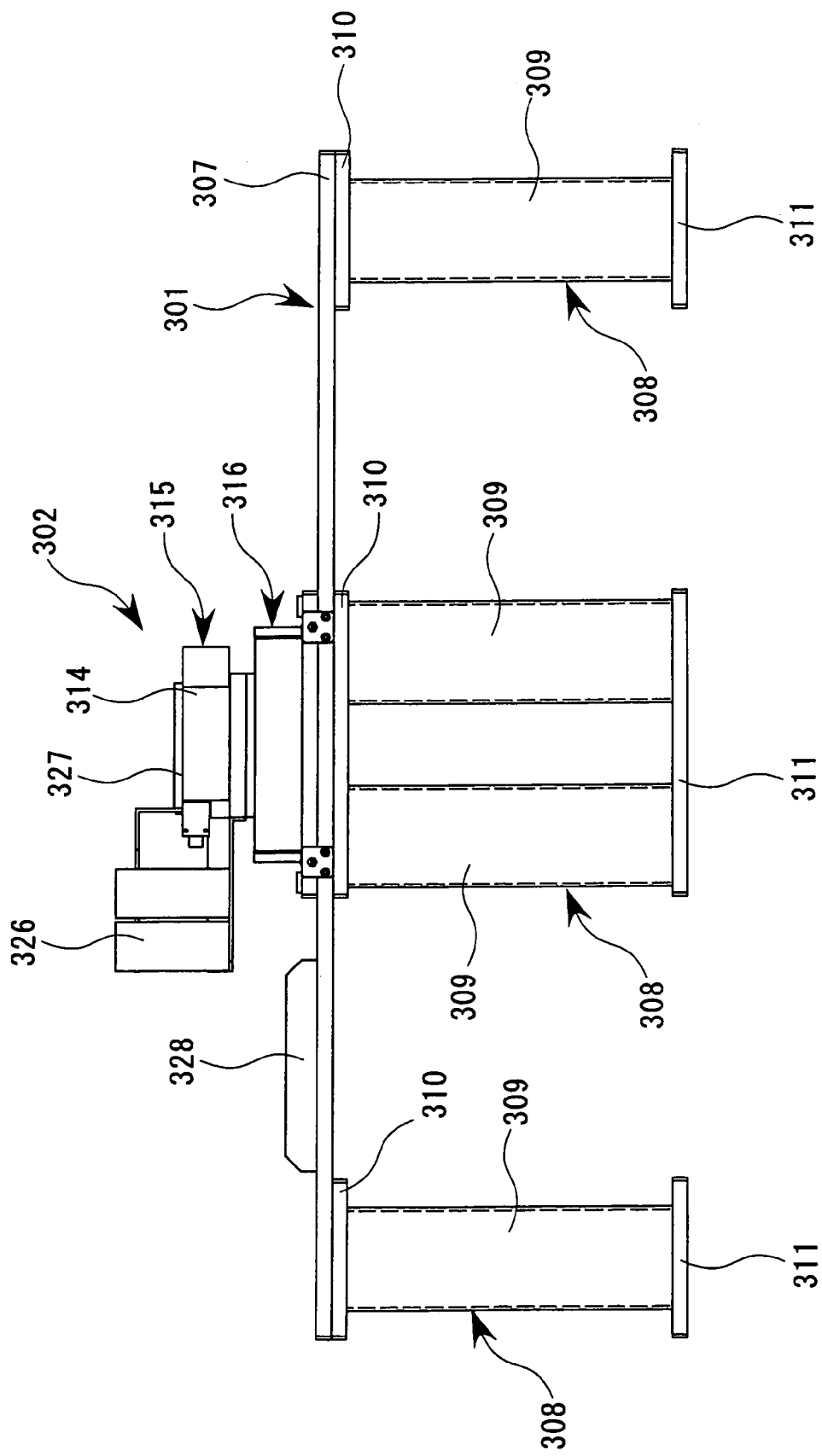
FIG. 35 is a front view around the correction X·Y table in the head correction apparatus.
Figure 36:
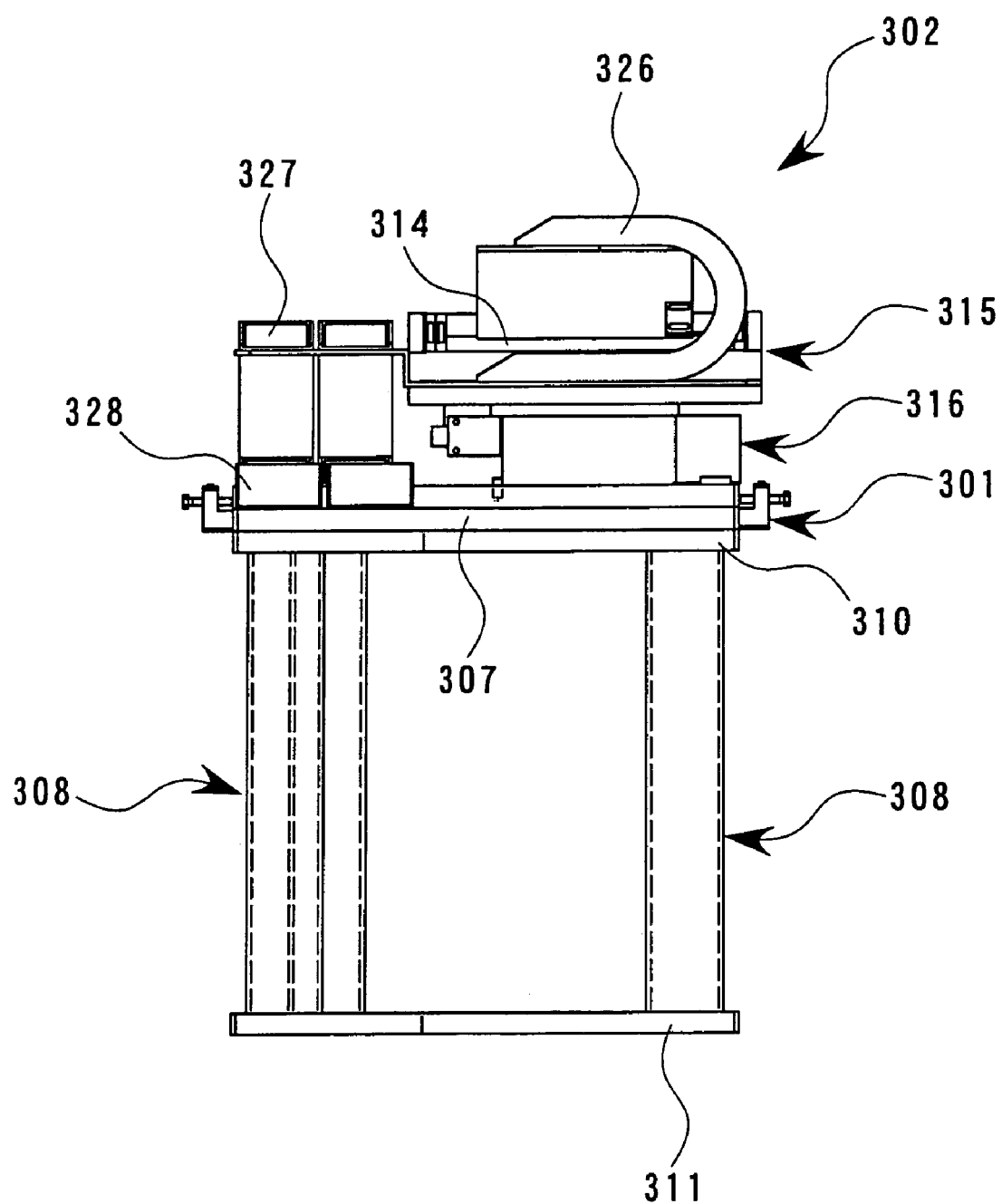
FIG. 36 is a side view around the correction X·Y table in a head correction apparatus.

As shown in FIGS. 23 and 33, the head correction apparatus 212 is made up of: a stand 301 for use with the correction apparatus, the correction stand 301 being attached to an inner side of the apparatus base 204; a correction X·Y table 302 which is mounted on the stand 301; a correction table 303 which is supported by the correction X·Y table 302; and an arm unit 304 which is supported by the correction X·Y table 302. In this arrangement, since the correction Θ table 303 has exactly the same construction as the table 232 for the unit movement apparatus 211, the description thereabout is omitted here. In the Θ table 232 the back-and-forth driving part 243 is disposed on the left side. In this correction Θ table 303, on the other hand, it is disposed on the right side (see FIG. 23).

As shown in FIG. 33, the stand 301 for the correction apparatus has: a base plate 307 on which is mounted the correction X·Y table 302; and three sets of leg units 308, 308, 308 which support the base plate 307. The three sets of leg units 308 are disposed in the left, right and central rear portions, i.e., in three portions. Each leg unit 308 is made up of a pair of supporting columns 309, 309, and an upper plate 310 and lower plate 311 which are respectively fixed to the upper and lower sides of the pair of columns 309, 309.

In the lower space of the stand 301 for the correction apparatus, there is faced the head unit 1 which is moved by the unit moving apparatus 211, and the arm unit 304 which extends from the stand 301 for the correction apparatus faces the head unit 1 (is engaged with the head holding member 4) from the upper side. The movement of the head unit 1 and the positional correction of the carriage 2 are performed by the unit moving apparatus 211. The positional correction of each of the liquid droplet ejection heads 3 is performed by the head correction apparatus 212. Therefore, after an arbitrary liquid droplet ejection head 3 has been provisionally fixed, the unit moving apparatus 211 moves the head unit 1 to thereby cause the next liquid droplet ejection head 3 to face the head correction apparatus 212.

As shown in FIGS. 33 through 36, the correction X·Y table 302 is placed in the center of the stand 301 for the correction apparatus and has: a supporting block 314 which supports the correction table 302; a correction X-axis table 315 which supports the supporting block in a manner slidable in the X-axis direction; and a correction Y-axis table 316 which supports the correction X-axis table 315 in a manner slidable in the Y-axis direction. The supporting block 314 has screwed holes 318 at four positions. The correction Θ table 303 is fixed to the supporting block 314 at these four positions through the screwed holes 318.

The correction X-axis table 315 is made up of: an X-axis air slider 320; an X-axis linear motor 321; and an X-axis linear scale 322 which is disposed in parallel with the X-axis air slider 320. Similarly, the correction Y-axis table 316 is made up of: a Y-axis air slider 323; a Y-axis linear motor 324; and a Y-axis linear scale 325 which is disposed in parallel with the Y-axis air slider 323. In the figures, reference numerals 326, 327 denote a flexible X-axis cable bundle and a flexible Y-axis cable bundle, respectively. Reference numerals 328, 328 denote amplifiers for both the liner motors 321, 324.

Figure 37:
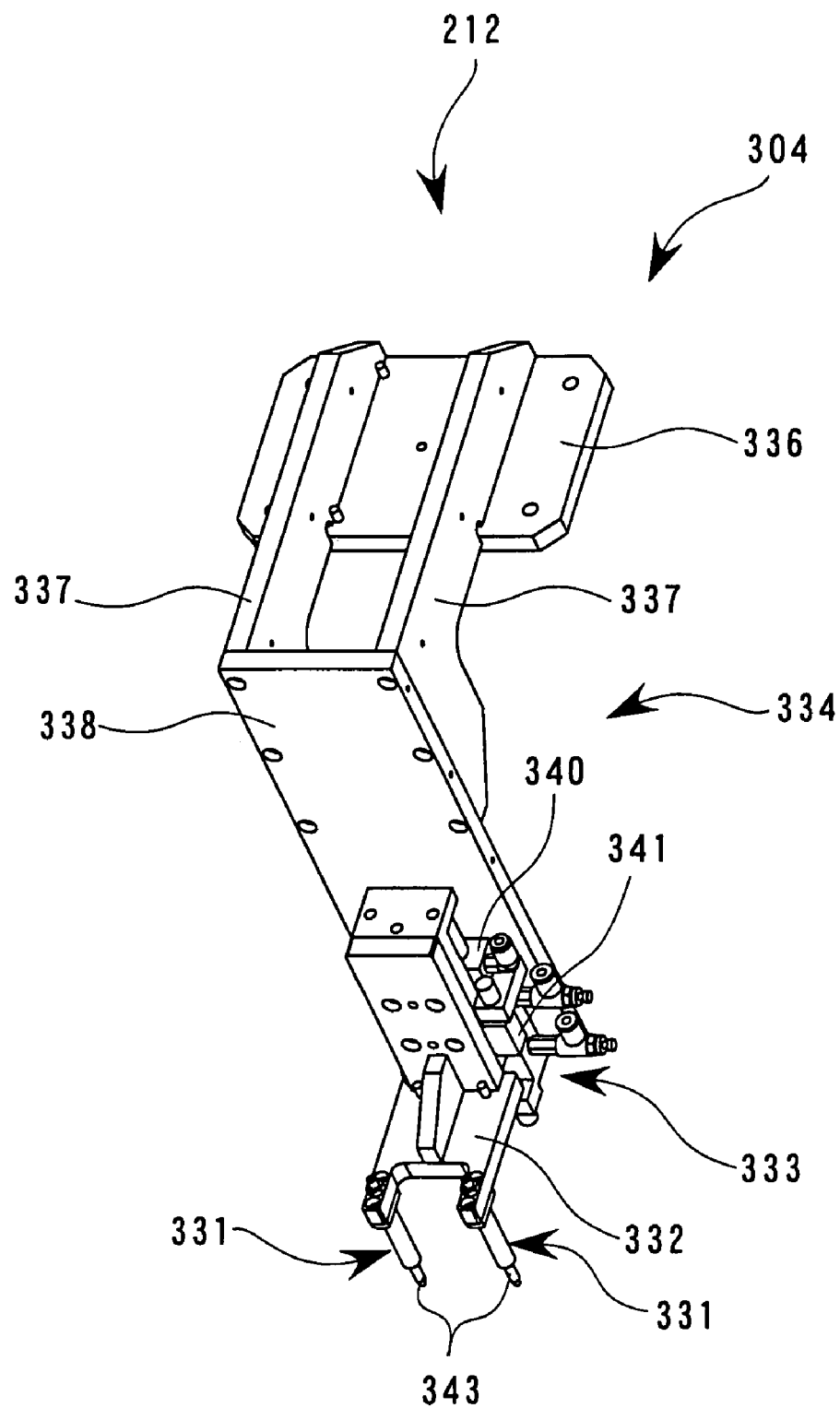
FIG. 37 is a perspective view of an arm unit in the correction apparatus.
Figure 38:
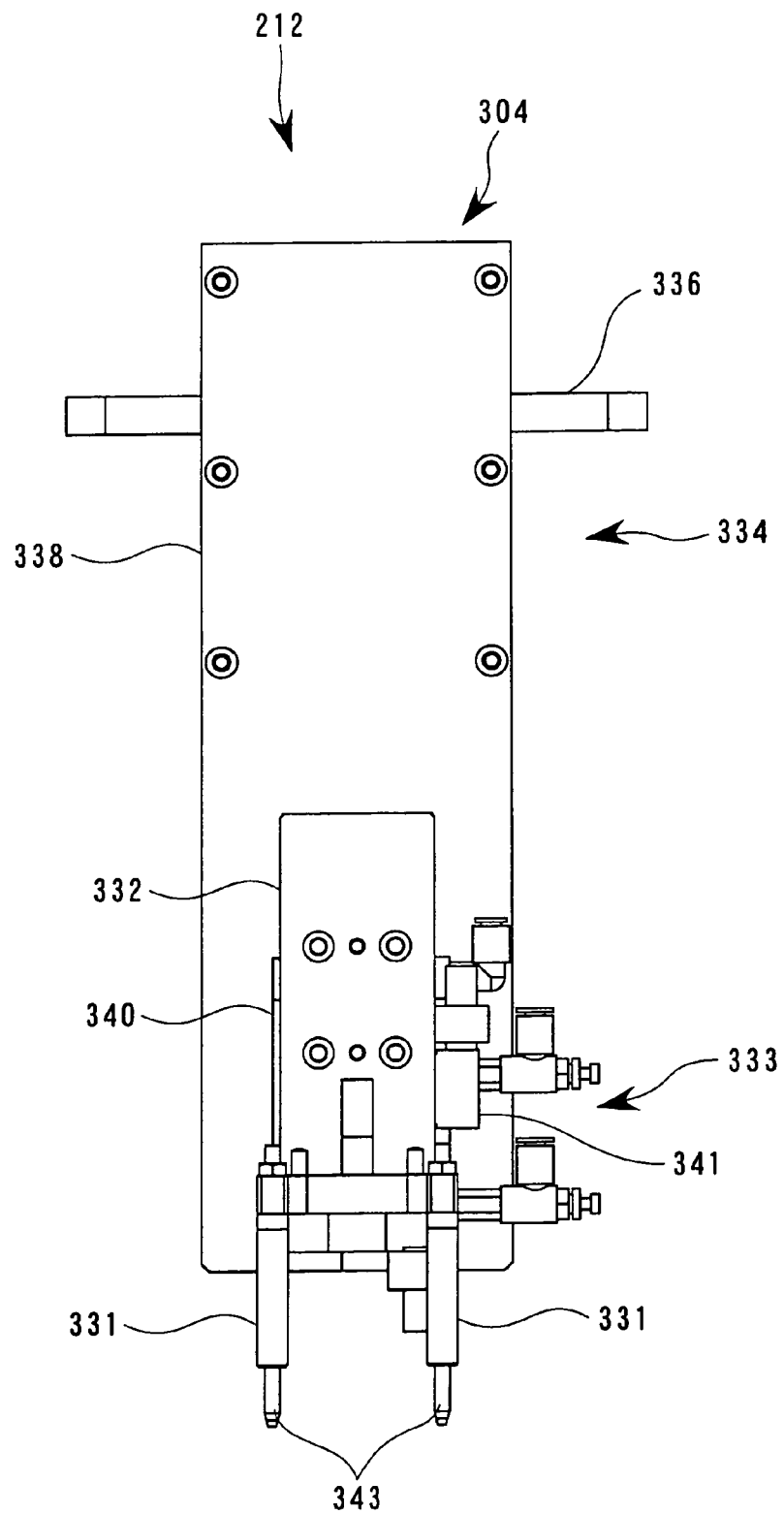
FIG. 38 is a front view of the arm unit in the correction apparatus.
Figure 39:
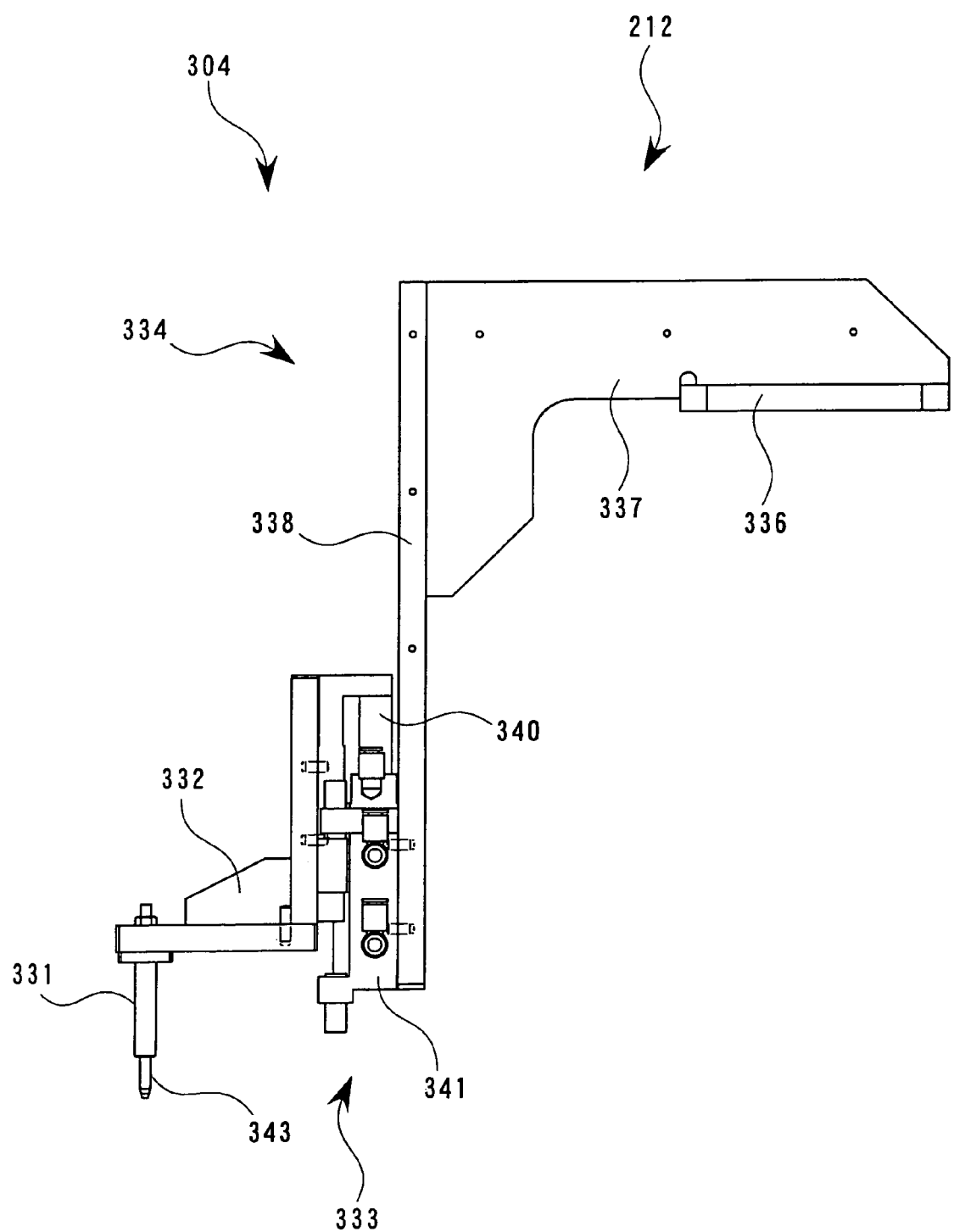
FIG. 39 is a side view of the arm unit in the correction apparatus.

As shown in FIGS. 37, 38 and 39, the arm unit 304 is made up of: a pair of engaging arms 331, 331 which are engaged with a pair of engaging holes 76, 76 of the head supporting member 4; a bracket 332 which supports the pair of the engaging arms 331, 331; an arm elevating mechanism 333 which moves up and down the bracket 332; and a supporting base 334 which supports the arm elevating mechanism 333. The supporting base 334 is made up of: a fixing plate 336 which is fixed to the Θ table 303; a pair of L-shaped arms 337, 337 which extend from the fixing plate 336 forward; and a vertical plate 338 which is fixed to the front end of the pair of the L-shaped arms 337, 337. The supporting base 334 extends to the front in an inverted L shape.

The arm elevating mechanism 333 is made up of: an elevating slider 340 which supports the bracket 332 in a manner movable up and down; and an air cylinder 341 which is fixed to the lower part of the vertical plate 338 and moves the elevating slider 340 up and down. The air cylinder 341 is connected to the air supply device 203. By the switching of the air valve, or the like, the bracket 332 is moved up and down guided by the elevating slider 340. The bracket 332 is formed into an L shape and the front end thereof is divided into two. These engaging arms 331, 331 are respectively mounted on this divided portion in a downward posture.

Figure 40:
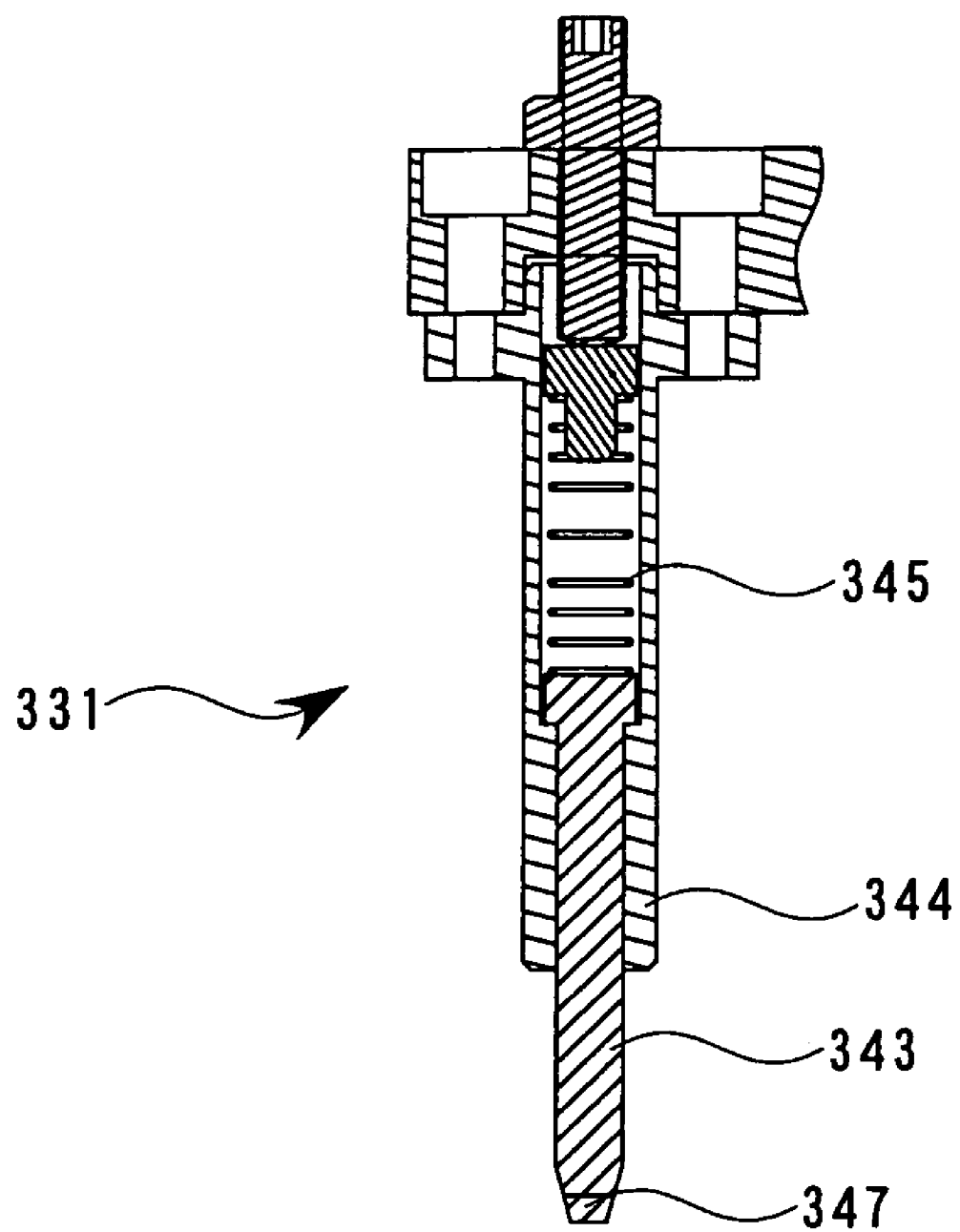
FIG. 40 is a sectional view of an engaging arm of the arm unit.

As shown in FIG. 40, each of the engaging arms 331 is made up of: an engaging pin 343 which is inserted into the engaging hole 76 of the head holding member 4; a pin holder 344 which holds the engaging pin 343 in a manner to be movable up and down; and a coil spring 345 which is contained inside the pin holder 343 and urges the engaging pin 343 downward. The upper end portion of the pin holder 344 is fixed to the bracket 332 in a manner to be fitted from the lower side. The front end of the engaging pin 343 is formed into a taper, and this tapered portion 347 is formed, relative to the engaging hole 76 of the head holding member 4, in a larger diameter at the base end side and in a smaller diameter at the front end side. By this arrangement, the engaging pin 343 can be engaged with the engaging hole 76 without giving rise to rattling.

At an initial state, both the engaging arms 331, 331 have been moved to a lifted end position by the air cylinder 341. When both the engaging arms 331, 331 are lowered by the air cylinder 341 after the head unit 1 has been moved by the unit moving apparatus 211, the pair of engaging pins 343, 343 are engaged with he engaging holes 76, 76 of the desired head holding member 4. The air cylinder 341 is being controlled with timer by the control apparatus 215. Until the adhering agent coated by the provisional fixing apparatus 213 has been hardened, the air cylinder 341 keeps on urging the head holding member 4 after positional correction against the carriage 2.

In other words, after performing the positional correction of the head holding member 4 and the coating of the adhesive agent (to be described in detail hereinafter), the air cylinder 341 that has lowered both the engaging arms 331, 331 lifts both the engaging arms 331, 331 back to the original position after the lapse of the hardening time of the adhesive agent (the time for the adhesive agent to reach a given adhesive strength). In this embodiment, it is so arranged that the engaging pin 343 is urged by the coil spring 345, but it may also employ a construction to omit the coil spring 345 to thereby attain a simple construction in which the engaging pin 343 and the pin holder 344 are unified.

In the above arrangement, when both the engaging arms 331, 331 of the arm unit 304 are lowered to thereby engage with the head holding member 4, the correction Θ table 303 and the correction X·Y table 302 are driven to thereby set in position the liquid droplet ejection head 3 through the head holding member 4. Then, this positioning state is maintained until the adhesive agent is hardened. In other words, both the engaging arms 331, 331 of the arm unit 304 keep on pushing the head holding member 4 against the carriage 2 in a positioned state. The provisional fixing (adhering) apparatus 213 faces the head holding member 4.

Figure 24:
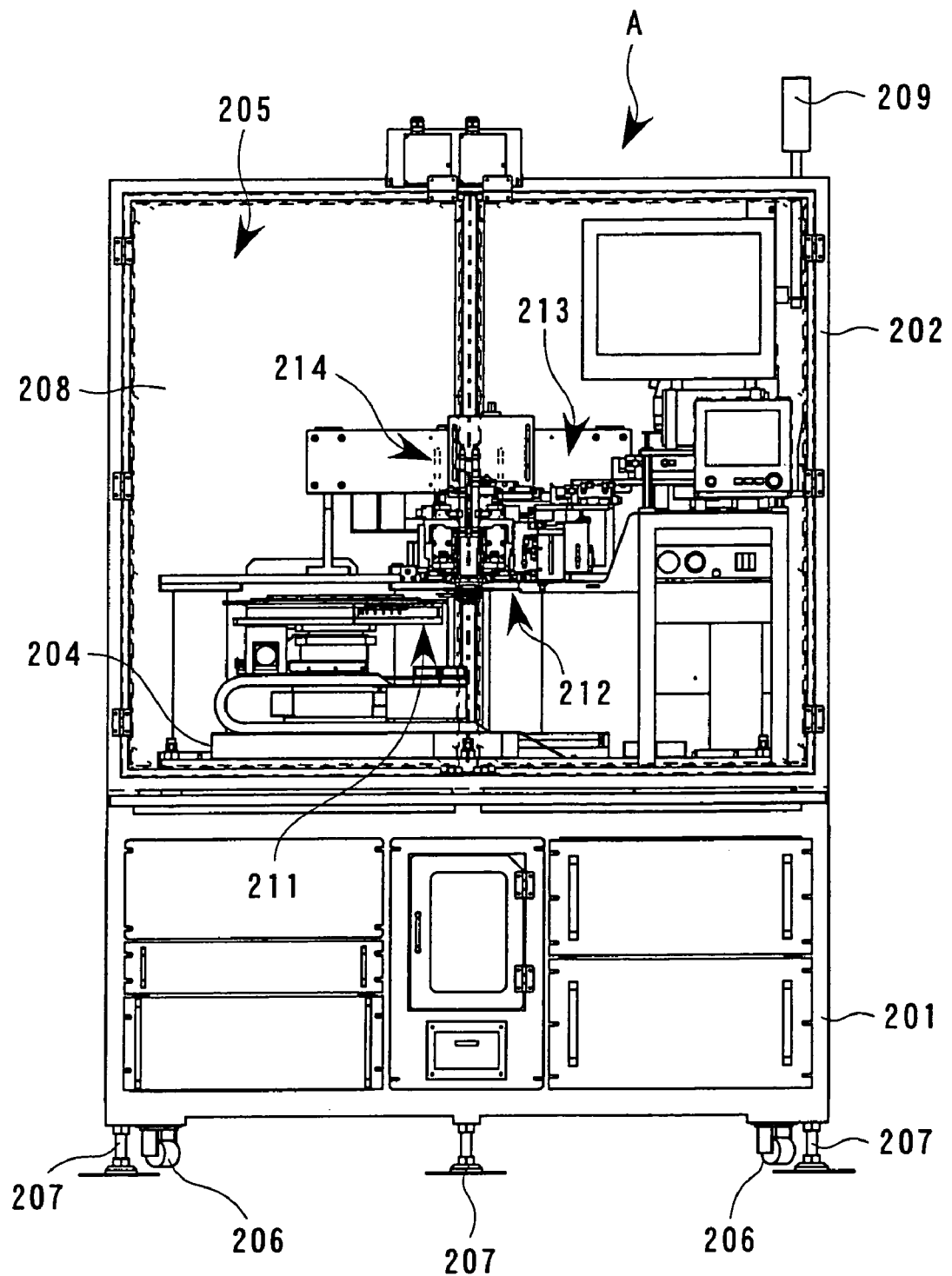
FIG. 24 is an overall front view of the assembling apparatus.
Figure 25:
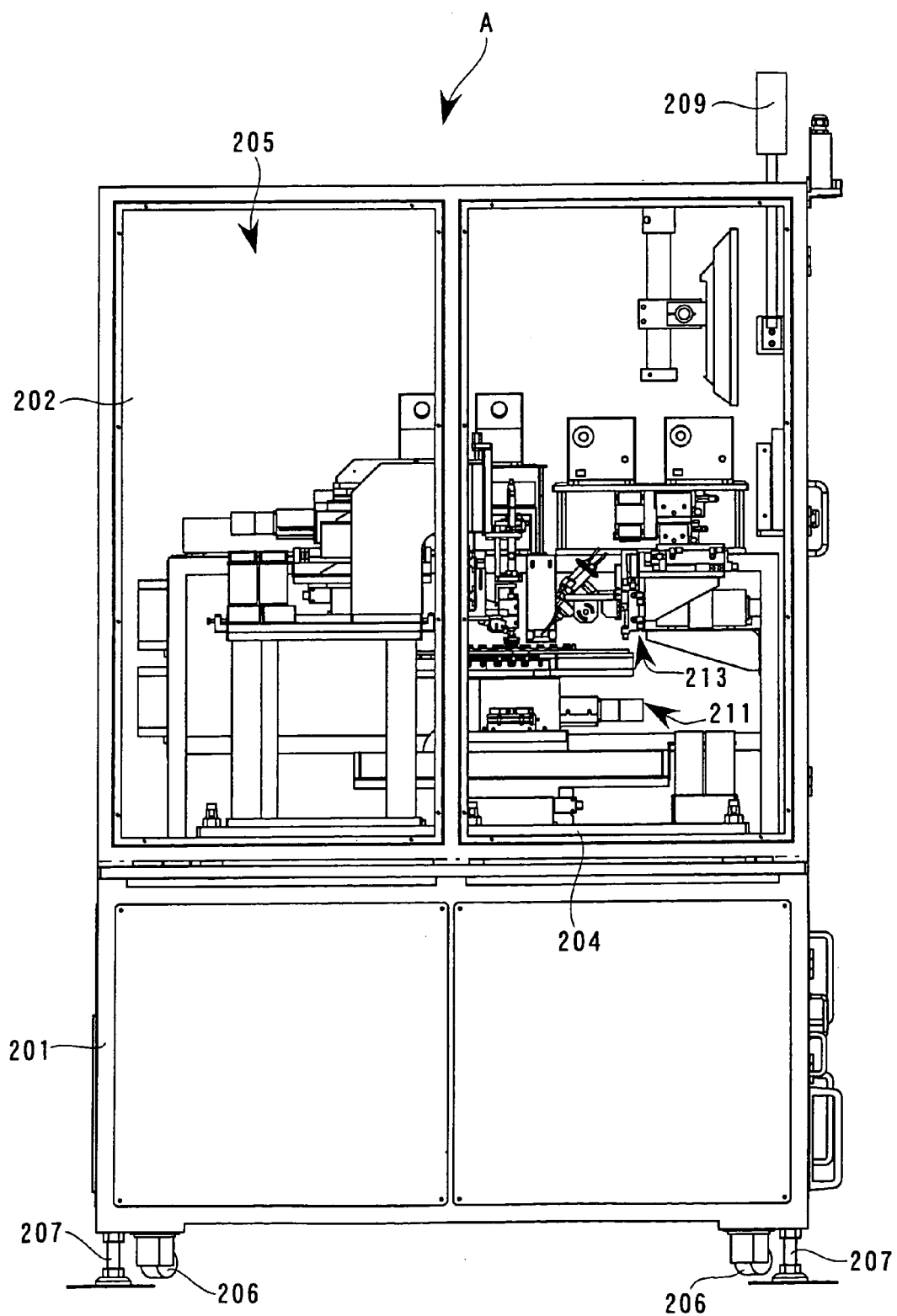
FIG. 25 is an overall side view of the assembling apparatus as seen from the left side thereof.
Figure 41:
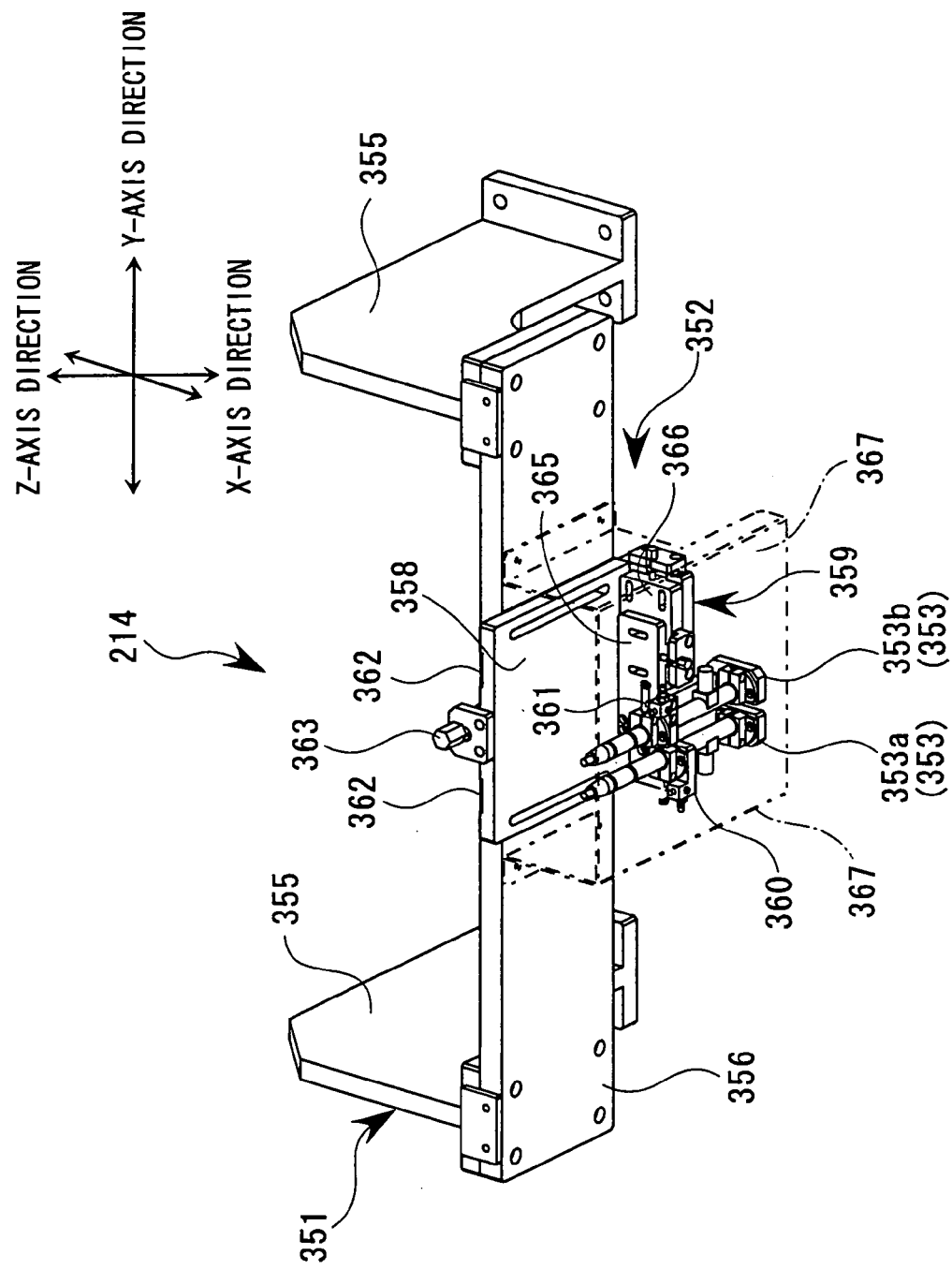
FIG. 41 is a perspective view of a recognition apparatus.
Figure 42:
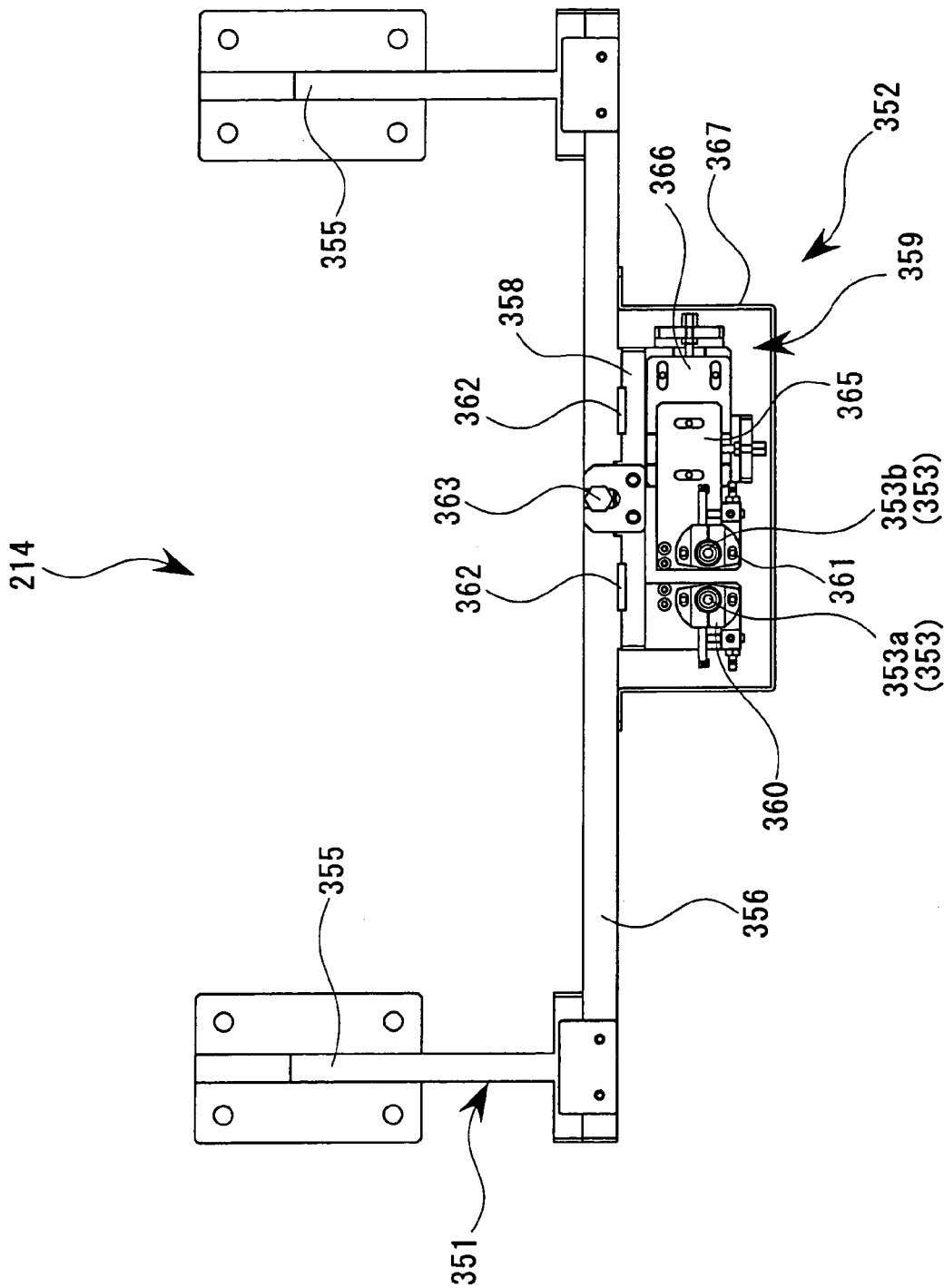
FIG. 42 is a plan view of the recognition apparatus.
Figure 43:
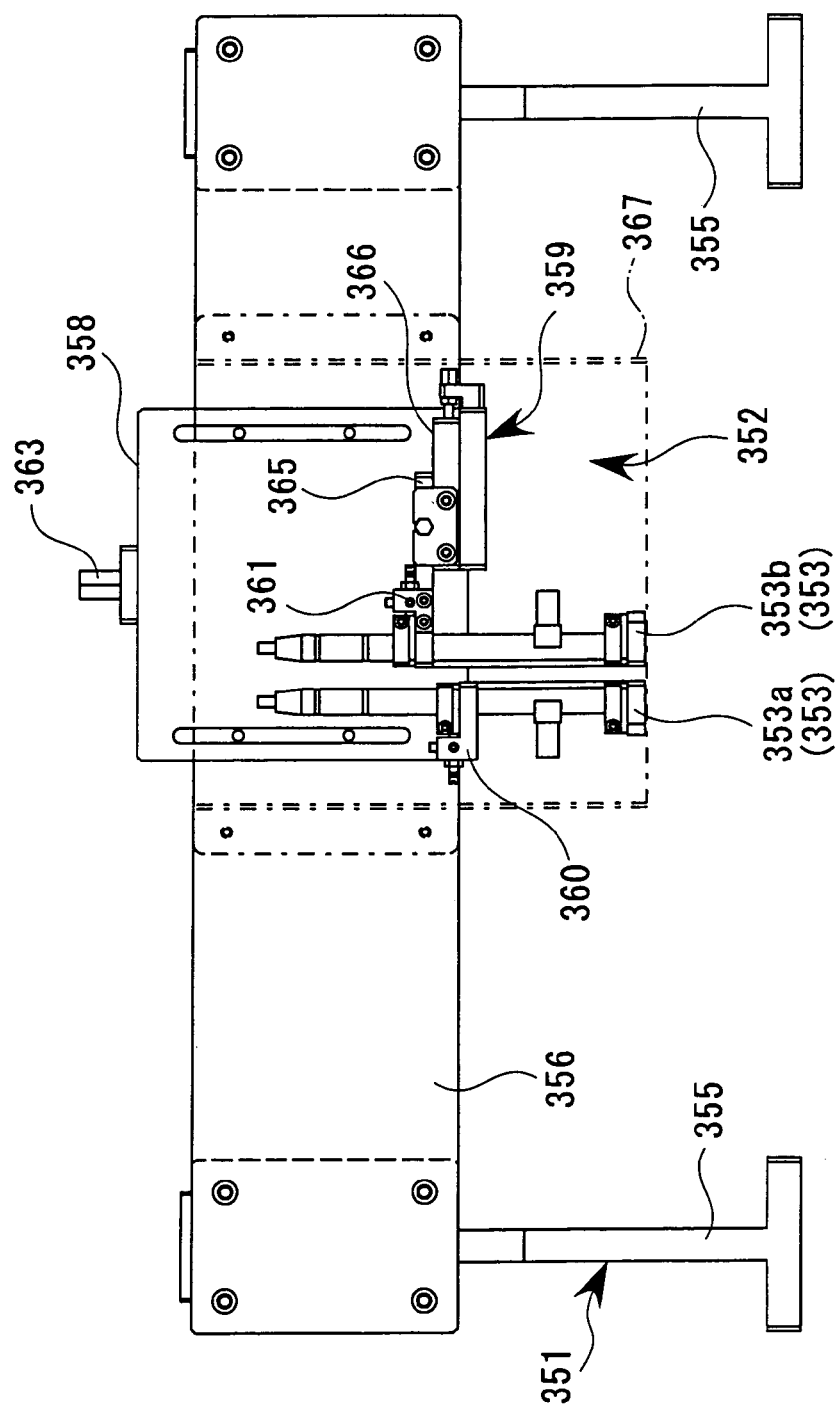
FIG. 43 is a front view of the recognition apparatus.
Figure 44:
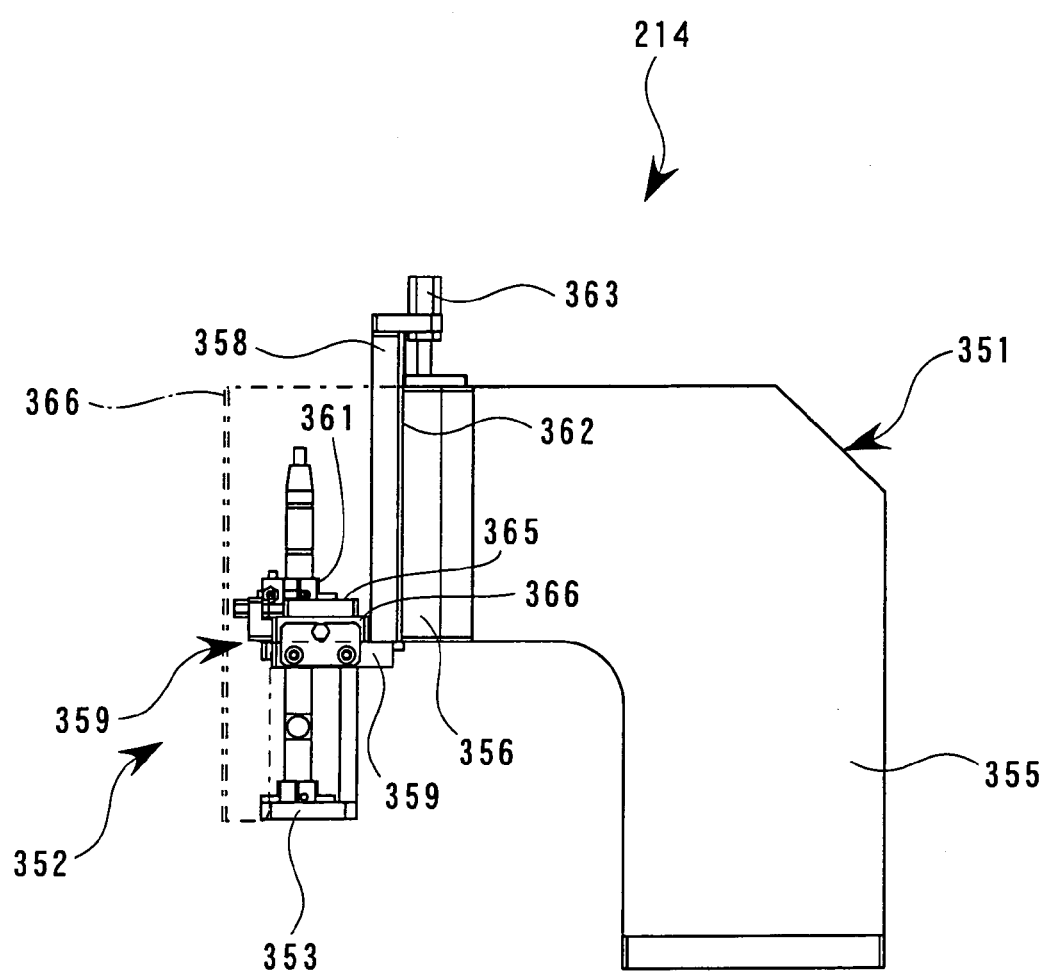
FIG. 44 is a side view of the recognition apparatus.

A description is made about the recognition apparatus 214. As shown in FIGS. 24 and 41, the recognition apparatus 214 is made up of: a camera stand 351 which is fixed to a stand 301 for the correction apparatus in a manner to bridge over the front portion of the correction X·Y table 302; a camera position adjusting unit 352 which is fixed to the front surface of the camera stand 351; and a pair of recognition cameras (CCD cameras) 353, 353 which are mounted on the camera adjusting unit 352. The pair of recognition cameras 353, 353 are fixedly disposed relative to the head unit 1 (alignment mask D) which is the object to be recognized.

The camera stand 351 is made up of: a pair of left and right leg piece members 355, 355 which extend forward in an inverted L shape; and a front elongated plate 356 which extends between a pair of leg piece members 355, 355. The pair of recognition cameras 353, 353 which are fixed to the front surface plate 356 through the camera position adjustment unit 352 are disposed in a position slightly protruding forward at a position slightly higher than the pair of engaging arms 331, 331 of the head correction apparatus 212 (see FIG. 25). It is thus so arranged that the interference with the engaging arm 331 can be prevented.

As shown in FIGS. 41 through 44, the camera position adjusting unit 352 is made up of: a Z-axis adjustment plate 358 which is disposed in addition to the front late 356; a microstage 359 which is mounted on the lower end portion of the Z-axis adjusting plate 358; a left camera holder 360 which holds the left-side recognition camera 353a; and a right camera holder 361 which holds the right-side recognition camera 353b. The Z-axis adjustment plate 358 has: a pair of guide rails 362, 362 which extends in the vertical direction between the front plate 356; and an adjusting bolt 363 which is in abutment with an upper end of the front plate 356. By the rotation of this adjustment bolt 363 in one direction and in the opposite direction, the position in the vertical direction of both the recognition cameras 353, 353 is adjustable through the 2^axis adjusting plate 358.

The microstage 359 is made up of: an X-axis stage 365 which supports the right-side recognition camera 353 through the right camera holder 361; and a Y-axis stage 366 which, while supporting the X-axis stage 365, is fixed to the lower end portion of the Z-axis adjusting plate 358. The X-axis stage 365 is so arranged as to slightly move the right-side recognition camera 353b in the X-axis direction. The position in the back and forth direction of the right-side recognition camera 33b is arranged to be adjustable. Similarly, the Y-axis stage 366 is so arranged as to slightly move the position in the left and right direction of the right-side recognition camera 353.

On the other hand, the left camera holder 360 is fixed to the lower end portion of the Z-axis adjusting plate 358. Therefore, the right-side recognition camera 353 is adjustable in position by the microstage 359 relative to the left-side recognition camera 353a which is fixedly disposed through the left camera holder 360. As described above, in order that the positions of the two ejection heads 57a, 57a are simultaneously recognized by the left and right recognition cameras 352a, 353b, the distance between the left and right recognition cameras 353a, 353b, i.e., the distance between the scopes of view is adjusted in advance by the microstage 359 especially when new liquid droplet ejection heads 3 are handled. In the figures, reference numeral 367 denotes a camera cover which entirely covers the camera position adjusting unit 352 and both the recognition cameras 353, 353.

In the recognition apparatus 214 constituted as described above, the positions of the two standard marks 26, 26 (standard pins 12, 12) of the carriage 2 are recognized by the cooperation of one of the recognition cameras 353 and the X-axis table 271 of the unit moving mechanism 211. In other words, the image recognition of one of the standard pins 12 is performed by one of the recognition cameras 353, and subsequently the image recognition of the other of the standard pins 12 is performed by the movement of the carriage 2 in the X-axis direction. Based on the results of recognition, the positional correction of the carriage 2 (head unit 1) is performed by the unit moving apparatus 211 and, for the purpose of confirmation, the positional recognition is made again.

In addition, by the pair of recognition cameras 353, 353, the positions of the two ejection nozzles 57a, 57a which serve as the standard of each of the liquid droplet ejection heads 3 are simultaneously recognized. In other words, the corresponding liquid droplet ejection head 3 is moved to a position right below the pair of the recognition cameras 353, 353, and the images of the two ejection heads 57a, 57a are simultaneously recognized. In addition, the head correcting apparatus 212 faces the head holding member 4 in this state, and the positional correction of the liquid droplet ejection head 3 is performed and the adhering by the provisional fixing apparatus is performed. The recognition of each of the marks 164, 164 in the alignment mask D is similarly performed.

Figure 22:
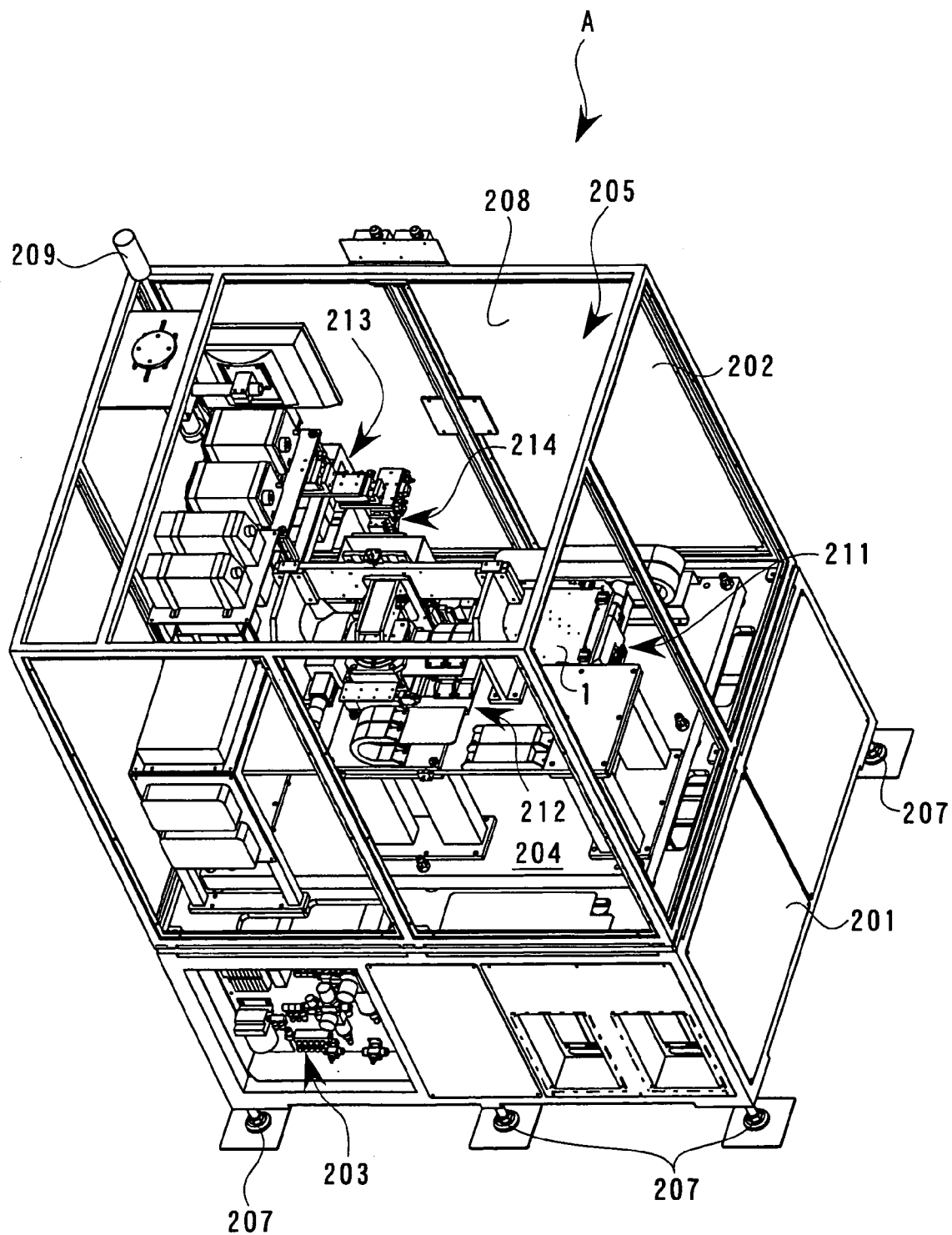
FIG. 22 is an overall perspective view of the assembling apparatus as seen from the back side thereof.
Figure 45:
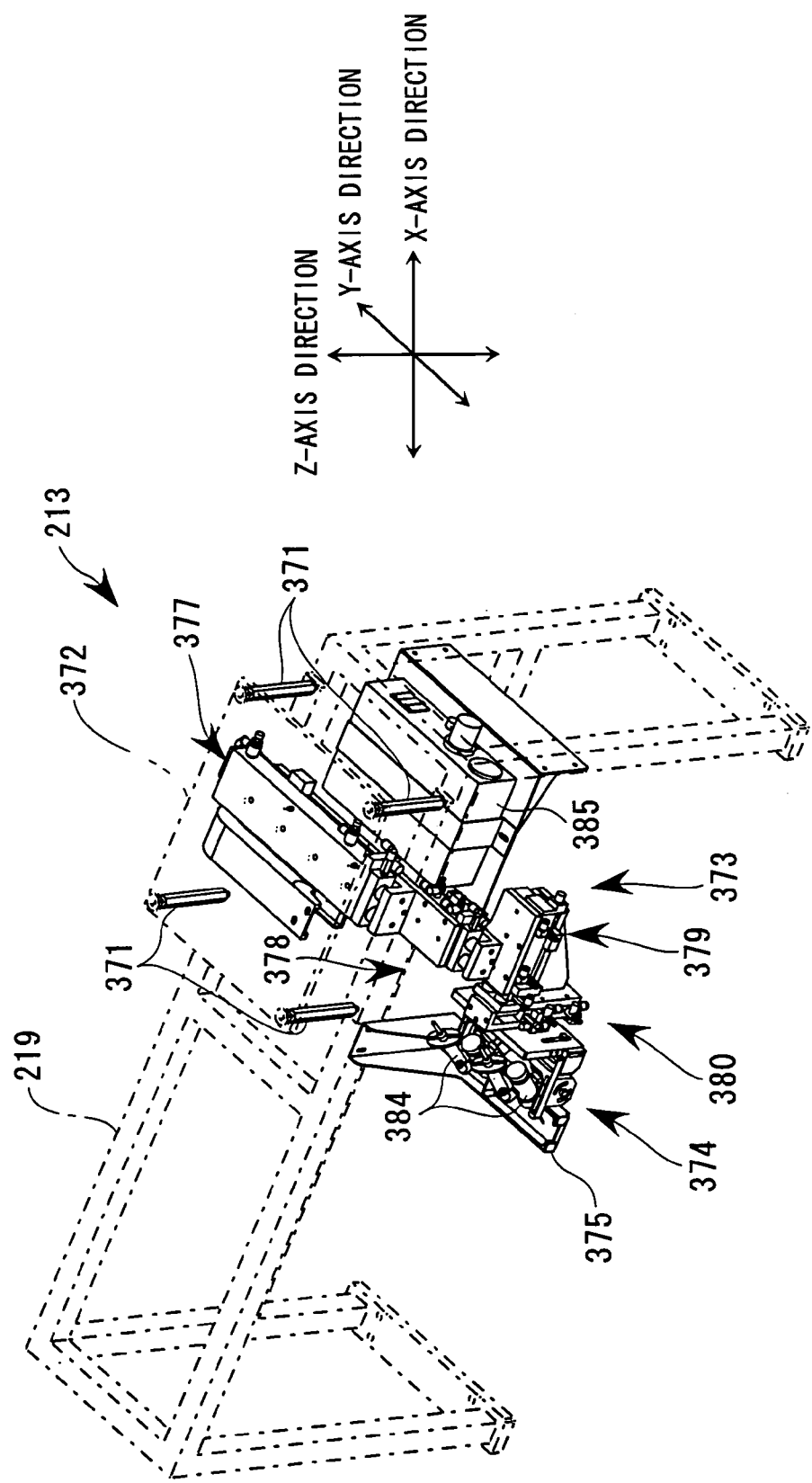
FIG. 45 is an overall perspective view of a provisional fixing apparatus.
Figure 46:
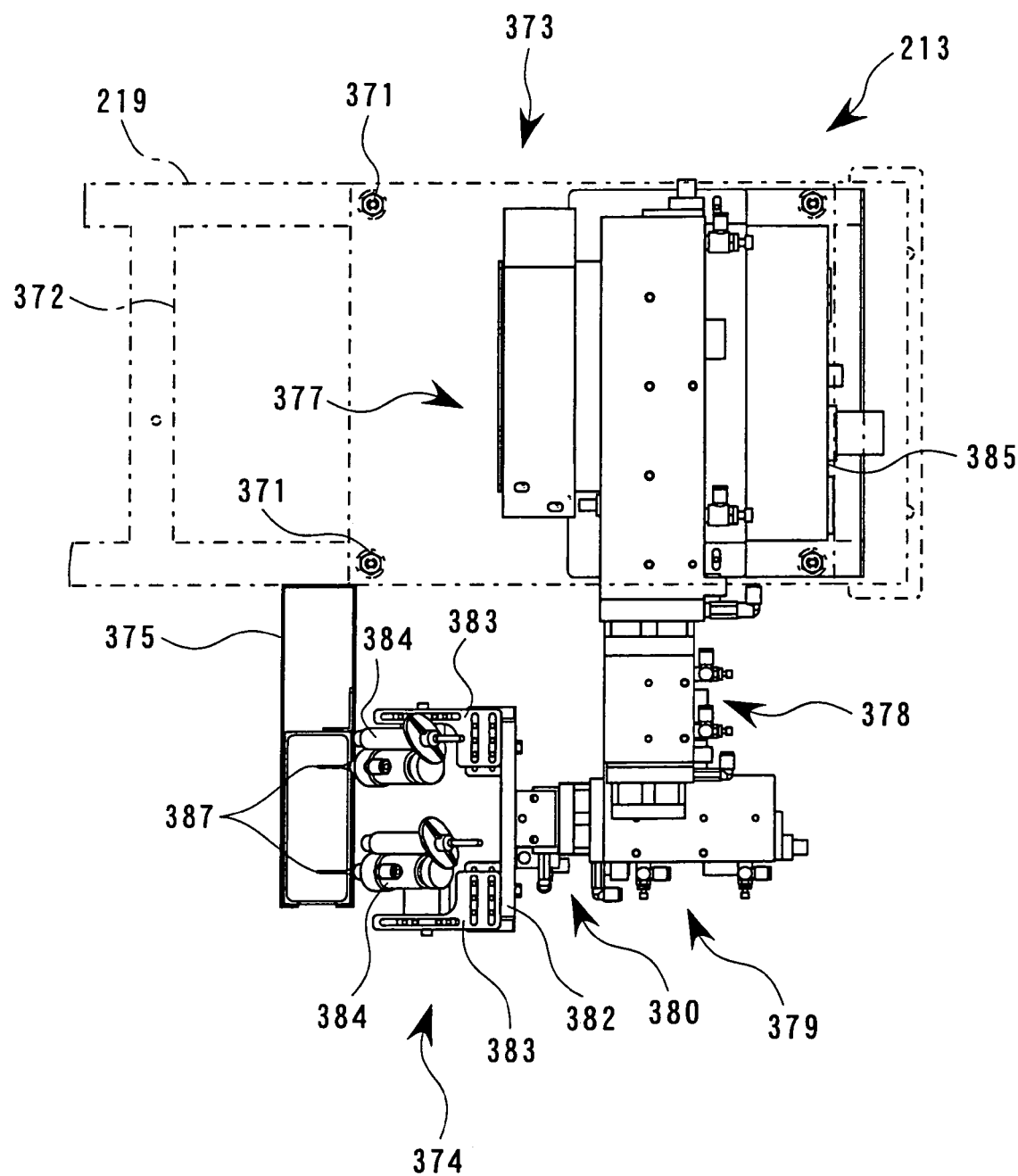
FIG. 46 is a plan view of the provisional fixing apparatus.
Figure 47:
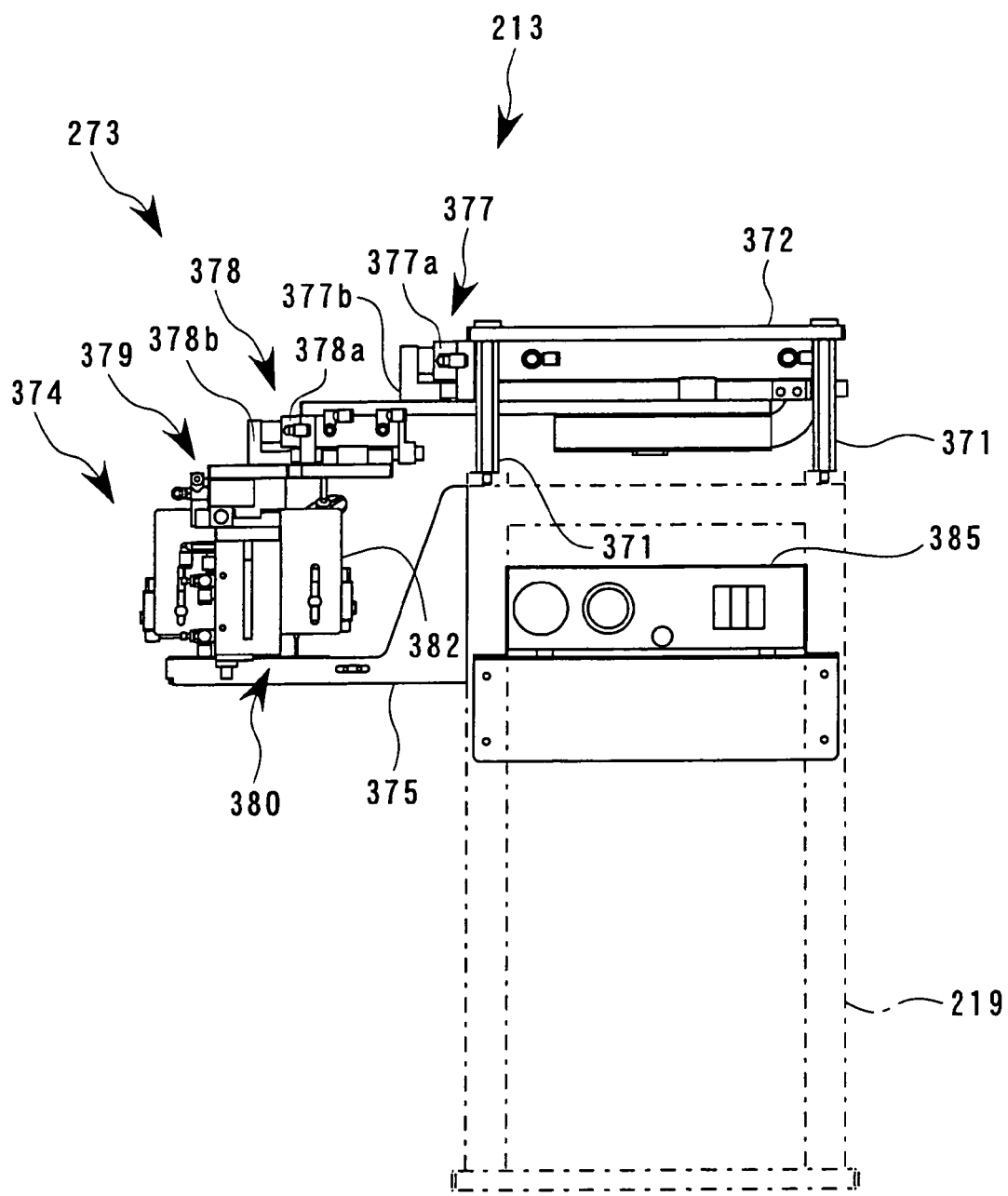
FIG. 47 is a front view of the provisional apparatus.
Figure 49:
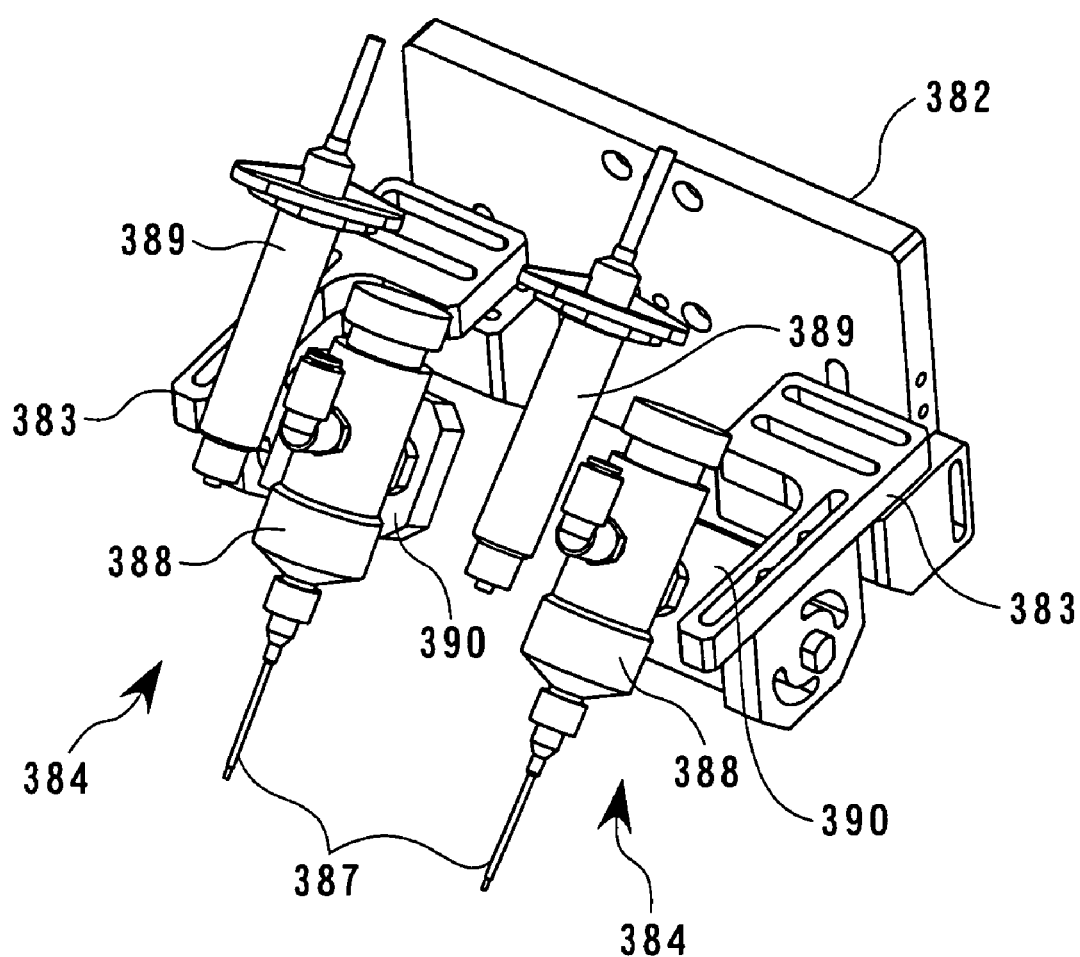
FIG. 49 is a perspective view of an adhesive agent coating apparatus.

A description is made about the provisional fixing apparatus 213. As shown in FIGS. 22 and 45, in the right portion of the apparatus base 204, there is disposed a common stand 219 which extends forward and backward so as to bridge the stand 301 for the correction apparatus 301. The provisional fixing apparatus 213 is disposed in the front portion of this common stand 219. This provisional fixing apparatus 213 is made up of: a rectangular supporting plate 372 which is supported on the common stand 219 by means of four stays 371; an air table 373 which is fixed to the lower surface of the rectangular supporting plate 372; an adhesive agent coating apparatus 374 which is fixed to the front end portion of the air table 373; and an adhesive agent tray 375 which faces, from the lower side, the adhesive agent coating apparatus 374 that has been moved to the home position. The adhesive agent tray 375 is fixed to the common stand 219 so as to receive the adhesive agent dropping from the adhesive agent coating apparatus 374.

As shown in FIGS. 45 through 49, the air table 373 is made up of: a Y-axis air table 377 which is mounted on the rectangular supporting plate 372; a subsidiary Y-axis air table 378 which is mounted on the front end portion of the Y-axis air table 377; an X-axis air table 379 which is mounted on the front end portion of the subsidiary Y-axis air table 378; and a Z-axis air table 380 which is mounted on the front end portion of the X-axis air table 379. These Y-axis air table 377, the subsidiary Y-axis air table 378, the X-axis air table 379, and the Z-axis air table 380 are constituted by air cylinders 377a, 378a, 379a, 380a as well as sliders 377b, 378b, 379b, 380b, respectively, which are connected to the air supply device 203.

The adhesive agent coating apparatus 374 is made up of: a vertical supporting plate 382 which is fixed to the Z-axis table 380; a pair of left and right horizontal supporting blocks 383, 383 which project forward from the lower portion of the vertical supporting plate 382; a pair of dispenser units 384, 384 which are mounted on each of the horizontal supporting blocks 383; and a dispenser controller 385 which is supported by the common stand 219. The pair of dispenser units 384, 384 are disposed so as to lie opposite to the pair of engaging arms 331, 331 or to the pair of recognition cameras 353, 353 from the front side.

Each of the dispenser units 382 is made up of: a dispenser 388 which has mounted at a front end thereof an adhesive agent injection nozzle 387; a cartridge type syringe 388 which supplies the dispenser 388 with the adhesive agent; and a dispenser holder 390 which holds the dispenser 388 and the syringe 389. The dispenser holder 390 is mounted on the front end portion of the horizontal block 383 in a manner to be adjustable in angle. In this embodiment, it is so adjusted that the adhesive agent injection nozzle 387 can be inclined by 45 degrees relative to the horizontal line. Each of the horizontal holding blocks 383 is fixed in a manner to be adjustable in position in the back and forth direction as well as in the left and right direction relative to the vertical supporting plate 382.

As descried above, by using the two adhesive agent injection nozzles 387, 387, the adhesive agent is simultaneously injected (coated) into two adhesive agent injection holes 77a, 77a which are one of pairs to form the head holding member 4. After both the adhesive agent injection nozzles 387, 387 have been moved in the Y-axis direction, the adhesive agent is simultaneously injected (coated) into the other of pairs of the adhesive agent injection holes 77b, 77b. Therefore, the distance between both the adhesive agent injection nozzles 387, 387 corresponds to the distance between both the adhesive agent injection holes 77a (77b), 77a (77b) which make the pairs in the head holding member 4. Each of the adhesive agent injection nozzles 387 having a predetermined inclination angle is plugged or inserted into the adhesive agent injection hole 77 which is a slot so that the adhesive agent is injected in a manner to spray the inner periphery with the adhesive agent.

In a state in which the positioning is finished, the head correction apparatus 212 is held as it is so as to urge the head holding member 4 toward the carriage 2 in an immovable manner. On the other hand, the X-axis air table 379 and the Y-axis air table 377 are driven so as to move the two adhesive agent injection nozzles 387, 387 to the position right above the two adhesive agent injection holes 77a, 77a of the head holding member 4. Then, the Z-axis air table 380 is driven so that the two adhesive agent injection nozzles 387, 387 are simultaneously inserted into the two adhesive agent injection holes 77a, 77a.

Thereafter, a predetermined amount (to be adjusted by the dispenser controller 385) of adhesive agent is injected by the syringe 389 from the two adhesive agent injection nozzles 387, 387. Subsequently, the two adhesive agent injection nozzles 387, 387 are lifted by the Z-axis air table 380, and the subsidiary Y-axis table 378 is driven to thereby move the two adhesive agent injection nozzles 387, 387 to the position right above the other two adhesive agent injection holes 77b, 77b. In this case, since the distance between the two sets of the adhesive agent injection holes 77a (77b), 77a (77b) which make the pairs in the head holding member 4 is constant, the Y-axis air table 377 is stopped so that only the subsidiary Y-axis air table 378 is driven.

Thereafter, the adhesive agent injection nozzles 387, 387 are again lifted and the provisional fixing apparatus 213 is stopped to wait for the adhesive agent to harden. After the hardening time has passed, the head correction apparatus 212 releases the engagement with the head holding member 4, whereby the provisional fixing work of arbitrary one liquid droplet ejection head 3 (provisional positioning and adhering) is finished. Then, the positioning and adhering works of the liquid droplet ejection head 3 by cooperation between the head correction apparatus 212 and the provisional fixing apparatus 213 are repeated twelve times, whereby the provisional fixing of the liquid droplet ejection head 3 is finished. The head correction apparatus 212 and the provisional fixing apparatus 213 return to their respective home positions.

Now, with reference to FIG. 50, a description is made about the control apparatus 215 and a description is also made about a series of assembling procedures of the head unit 1 based on the control apparatus 215. As shown in the block diagram in the figure, the control system in the control apparatus 215 is made up of: an input part 402 which inputs the design data, or the like, of the carriage 2 and the liquid droplet ejection head 3 from the operation panel 401; a driving part 403 which has various drivers, or the like, to drive the constituting apparatuses such as the unit moving apparatus 211, or the like; a detecting part 404 which performs a positional recognition by the recognition camera 353; and a control part 405 which performs an overall control of each of the constituting apparatuses of the assembly apparatus A.

The driving part 403 is made up of: a moving driver 407 which controls the driving of each of the motors of the unit moving apparatus 211; a correction driver 408 which controls the driving of each of the motors of the head correction apparatus 212; an air driver 409 which drives each of the air cylinders of the air table 373 in the provisional fixing apparatus 213; and a dispenser controller 385 which controls the dispenser unit 384 in the provisional fixing apparatus 213.

The control part 405 has a central processing unit (CPU) 411, a read only memory (ROM) 412, a random access memory (RAM) 413 and a processing controller (P-CON) 414. They are connected to one another via a bus 415. The ROM 412 has a control data region for storing therein various control data aside from control programs, or the like, for storing therein control programs to be processed in the CPU 411. The RAM 413 contains therein various register groups aside from the positional data region for storing therein the positional data inputted from outside, master positional data which are obtained by the recognition camera 353 from the alignment mask D, or the like, and are used as working regions for the control processing.

The P-CON 414 has assembled therein logic circuits and timer 416 which supplement the function of the CPU 411 and also handle the interface signals with the peripheral circuits. Therefore, the P-CON 414 is connected to the operation panel 401 to take in various commands from the input part 402 as they are or after due processing. In addition, the P-CON 414 outputs, in cooperation with the CPU 411, the data or the control signals that are outputted from the CPU 411, or the like, to the bus 415 as they are or after due processing.

Due to the above arrangement, the CPU 411 inputs the various detection signals, various commands, various data, or the like, through the P-CON 414 according to the control program inside the ROM 412, and processes various data inside the RAM 413, and outputs the control signals to the driving part 403 through the P-CON 414. According to this arrangement, the entire assembly apparatus A such as the unit movement apparatus 211, the head correction apparatus 212, the provisional fixing apparatus 213, or the like, are controlled.

For example, those master positional data of the alignment mask D which are obtained from the recognition camera 353, and those unit positional data of the head unit 1 which are obtained from the recognition camera 353 are stored in the RAM 413 and, according to the control program inside the ROM 412, the master positional data and the unit positional data are compared with each other. Based on this comparison, the unit movement apparatus 211, the head correction apparatus 212, or the like, is controlled.

A description is made about the method of assembling the head unit 1 by the assembly apparatus A. In this assembly apparatus A, the alignment mask D is first introduced prior to the introduction of the head unit 1. Once the alignment mask D is set in position into the setting table 231, the unit movement apparatus 211 is driven so that one of the carriage standard marks 165 of the alignment mask D is caused to face one of the recognition cameras 353, whereby the position of said one of the carriage standard marks 165 is recognized. Then, the X-axis table 271 of the unit movement apparatus 211 is driven to cause the other of the carriage standard marks 165 to face the recognition camera 353 so that the position of the other of the carriage standard marks 165 is recognized.

Then, the unit movement apparatus 211 is driven to cause the head standard mark 164 which is positioned at an end portion of the alignment mask D to simultaneously face the pair of the recognition cameras 353, 353 so that the positions of the head standard marks 164, 164 at two positions are simultaneously recognized. These steps are sequentially repeated so that the positions of the twelve sets of the head standard marks 164 corresponding to the twelve liquid droplet ejection heads 3 are recognized. Once the positional recognition of the alignment mask D has been finished in this manner, the alignment mask D is returned to the home position, and the head unit 1 is transferred for mounting on the setting table 231.

Here, the head unit 1 is moved in exactly the same procedures as the above, and the positions of a pair of the standard pins 12, 12 of the carriage 2 are recognized. Based on this recognition, the position of the carriage 2 (head unit 1) is corrected by the head movement apparatus 211. Thereafter, in the similar procedures as above, the head main body 50 (head holding member 4) of the first one of the liquid droplet ejection heads 3 is caused to face the pair of the engaging arms 331 of the head correction apparatus 212 so that the engaging arms 331 are engaged with the head holding member 4. The positions of those two ejection nozzles 57a, 57a of the head main body 50 which serve as the positional standards are then recognized by means of the pair of the recognition cameras 353, 353.

Then, the head correction apparatus 212 is driven to thereby set in position the liquid droplet ejection heads 3 through the head holding member 4 based on the above-described recognition result. The provisional fixing apparatus 213 is then driven in this state of being held in position so that the pair of the adhesive agent injection nozzles 387, 387 are caused to face the head holding member 4, whereby the adhesive agent is injected. The injection of the adhesive agent is performed twice by the subsidiary Y-axis air cylinder 378 of the provisional fixing apparatus 213, accompanied by the movement of the adhesive agent injection nozzle 387. Once the injection of the adhesive agent has been finished, the engagement of the head correction apparatus 212 with the head holding member 4 is released by means of timer control subject to the hardening of the adhesive agent.

In this manner, the positioning and provisional fixing of the first of the liquid droplet ejection heads 3 are finished. The above-described work is repeated for the second through the twelfth of the liquid droplet ejection heads 3. Finally, the unit moving apparatus 211, the head correction apparatus 212, and the provisional fixing apparatus 213 are returned to their respective home positions, and the assembled head unit 1 is removed out of the setting table 231. Thereafter, the head unit 1 passes through the cleaning of the liquid droplet ejection heads 3 and the constituting elements such as the handles 14, both the assemblies 15, 16, or the like, are assembled and is transported into the picturing apparatus B.

In this embodiment, an arrangement is made such that the liquid droplet ejection heads 3 are adhered to the carriage 2 through the head holding member 4 so that the adhering portion forms the metal to metal adhesion. It may also be so arranged that the liquid droplet ejection heads 3 are directly adhered to the carriage 2.

It is to be pointed out that the assembly apparatus of the head unit and the head unit 1 to be assembled thereby according to this invention are applicable not only to the above-described picturing apparatus B, but also to a method of manufacturing various flat displays, a method of manufacturing various electronic devices and optical devices, or the like. Therefore, a description will now be made about the manufacturing method using this head unit 1 with reference to an example of a method of manufacturing a liquid crystal display device and a method of manufacturing an organic electroluminescence (EL) device.

Figure 51A:
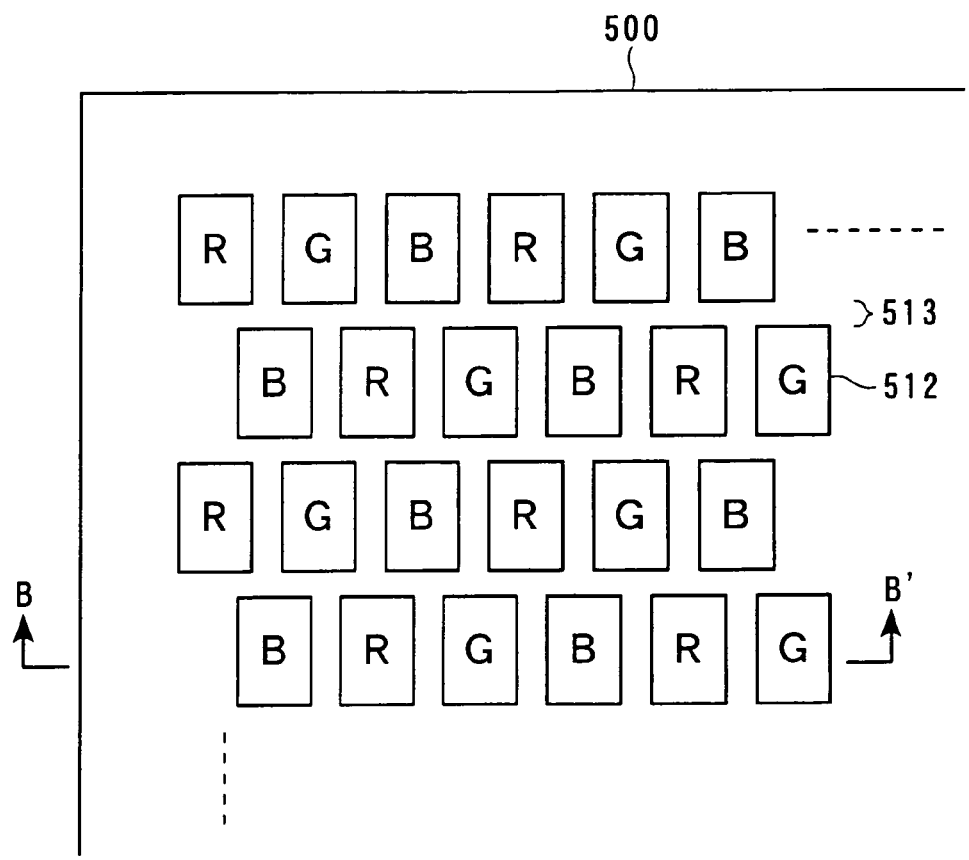
FIGS. 51A and 51B are partial enlarged views of a color filter to be manufactured by the method of manufacturing of this invention.
Figure 51B:
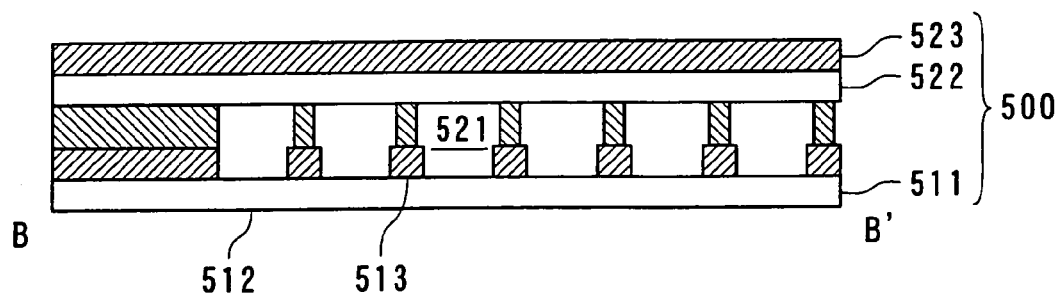

FIGS. 51A and 51B are partially enlarged figures of a color filter in a liquid crystal display device, in which FIG. 51A is a plan view thereof and FIG. 51B is a sectional view taken along the line B–B' in FIG. 51A. Hatched lines in FIG. 51B are partially omitted.

As shown in FIG. 51A, a color filter 500 is provided with pixels (filter elements) 512 arranged in a matrix. The borders between each pixel is separated by partitions 513. Into each of the pixels 512 is introduced any one of red (R), green (G), and blue (B) inks (filter materials). In this example, the arrangement of red, green, and blue is made into a mosaic arrangement; other arrangements such as stripe arrangement, delta arrangement, or the like, may also be employed.

As shown in FIG. 51B, the color filter 500 is provided with a transparent substrate 511 and a light shielding partition 513. Those portions where the shielding partitions are not formed constitute the above-described pixels 512. The inks of respective colors introduced into these pixels 512 constitute a colored layer 521. On upper surfaces of the partition 513 and the colored layer 521, there are formed an overcoat layer 522 and an electrode layer 523.

Figure 52:
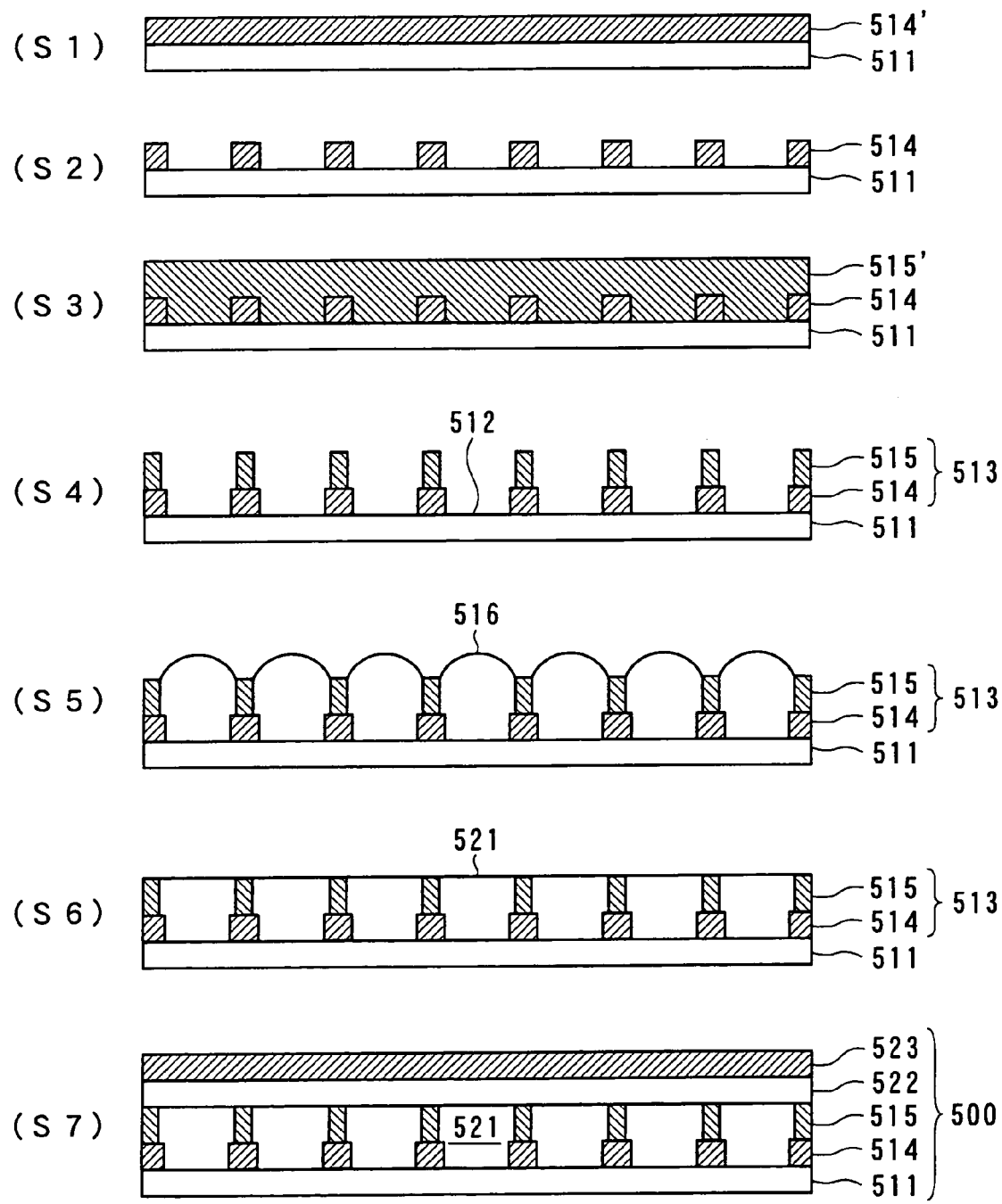
FIG. 52 is a sectional view showing the steps of manufacturing a color filter.

FIG. 52 is a sectional view of manufacturing steps explaining the method of manufacturing the color filter according to the embodiment of this invention. Hatching lines in each part of the figure are partially omitted.

The surface of a substrate 511 made of an alkalifree glass with 0.7 mm film thickness, 38 cm long and 30 cm wide is cleaned with a cleaning liquid made by adding 1% by weight of hydrogen peroxide to concentrated sulfuric acid, is rinsed with pure water, and is air-dried to thereby obtain a cleaned surface. A chromium film of 0.2 µm in average thickness is formed on the surface thus obtained by sputtering method to thereby obtain a metallic layer 514' (FIG. 52, S1).

This substrate is dried on a hot plate at 80° C. for 5 minutes, and then a photoresist layer (not illustrated) is formed on the metallic layer 514' by spin-coating. A mask film having pictured thereon a required matrix pattern is closely adhered to the surface of the substrate, and is exposed by means of ultraviolet rays. Then, the product thus obtained is immersed into an alkaline developing liquid containing 8% by weight of potassium hydroxide to thereby remove the unexposed part of photoresist, whereby patterning of the resist layer is performed. Subsequently, the exposed metallic layer is removed by etching with an etching liquid having a chief ingredient of hydrochloric acid. In this manner, a shielding layer (black matrix) 514 having a predetermined matrix pattern is obtained (FIG. 52, S2). This shielding layer 514 has a film thickness of about 0.2 µm and the width of about 22 µm.

On top of this substrate, a negative type of transparent acrylic photosensitive resin composition 515' is coated also by spin coating method (FIG. 52, S3). The product thus obtained is pre-baked at 100° C. for 20 minutes and is then exposed by ultraviolet rays using a mask film having pictured thereon a predetermined matrix pattern. The resin in an unexposed portion is developed with an alkaline developing liquid, rinsed with pure water, and is spin-dried. After-baking as the last drying is performed at 200° C. for 30 minutes, and the resin part is sufficiently hardened to thereby form a bank layer 515. A partition 513 made up of the shielding layer 514 and the bank layer 515 is thus formed (FIG. 52, S4). This bank layer 515 is about 2.7 µm in average thickness and is about 14 µm in width on an average.

The shielding layer 514 thus obtained is subjected to dry etching, i.e., a plasma processing, to improve the ink-wettability of the colored layer forming region (especially the exposed surface of the glass substrate 511) sectioned by the shielding layer 51 and the bank layer 515. In concrete, a high voltage is applied to a mixture gas obtained by adding 20% of oxygen to helium to thereby form an etching spot in a plasma atmosphere. The substrate is passed through this etching spot to perform etching.

Then, into the pixels 512 formed by being partitioned by the partition 513, each of the red (R), green (G), and blue (B) inks is introduced by ink jet method (FIG. 52, S5). As the liquid droplet ejection head (ink jet head), a precision head applying piezoelectric effect is used. Ten minute ink droplets are selectively ejected for each of the colored layer forming regions. The driving frequency is 14.4 kHz, i.e., the ejection interval between the respective ink droplets is set to be 69.5 microseconds. The distance between the head and the target is set to be 0.3 mm. In order to obtain the flying velocity from the head to the colored layer forming region as the target and in order to prevent the occurrence of the crooked flying, and of divided astray droplets which are called satellites, the physical properties of the ink as well as the wave form (inclusive of voltage) to drive the piezoelectric element are important. Therefore, by programming in advance the wave forms in which predetermined conditions have been set, the ink droplets of three colors of red, green and blue are coated simultaneously to thereby coat the inks in a predetermined coloring pattern.

As the inks (filter materials), there is used, for example, an ink which is prepared by dispersing an inorganic pigment in a polyurethane resin oligomer, then adding thereto cyclohexane and butyl acetate as low-boiling solvents, and butyl carbitol acetate as a high-boiling solvent, and further adding thereto 0.01 wt % of a nonionic surfactant as a dispersant, such that it has a viscosity of 6 to 8 centipoises.

Then, the coated inks are dried. First, after performing the setting of the ink layer 516 by leaving it in the natural atmosphere for 3 hours, it is heated on a hot plate of 80° C. for 40 minutes, and is heated for 30 minutes in the oven at 200° C. to thereby perform the hardening treatment, whereby the colored layer 521 is obtained (FIG. 52, S6).

An overcoat layer 522 having a smooth surface is formed by spin-coating a transparent acrylic resin ink. Further, an electrode layer 523 made of an indium tin oxide (ITO) is formed on top thereof in a required pattern to thereby make it a color filter 500 (FIG. 52, S7).

Figure 53:
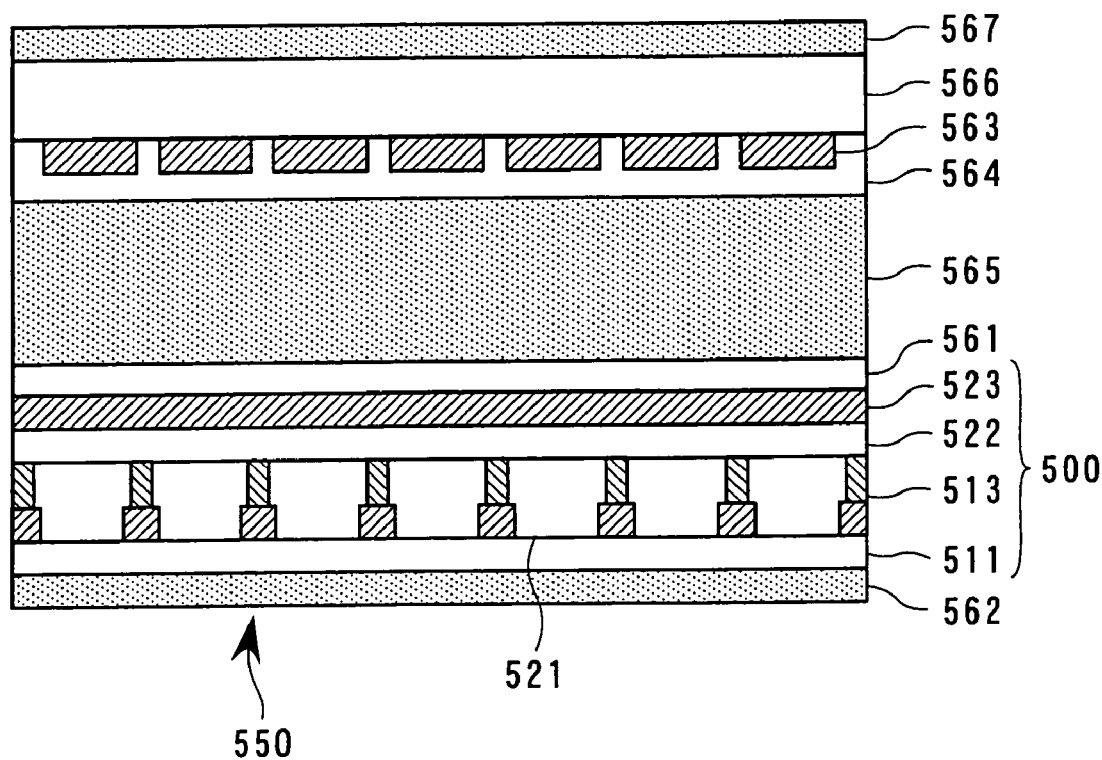
FIG. 53 is a sectional view of a liquid crystal display device.

FIG. 53 is a sectional view of a color liquid crystal display device which is an example of electro-optical device (flat display) to be manufactured by the method of manufacturing according to this invention. Hatching lines in each part of the sectional view are partly omitted.

This color liquid crystal display device 550 is manufactured by combining the color filter 500 and an opposite substrate 566 of the liquid crystal display device 550, and then injecting a liquid crystal composition 565 between the two. On an inner surface of one of the substrate 566, there are formed thin filter transistor (TFT) elements (not illustrated) and pixel electrodes 563 in matrix form. As the other substrate, there is disposed the color filter 500 such that the red, green and blue coloring layers 521 are arrayed in positions to lie opposite to the pixel electrodes 563.

On the respective surfaces which lie opposite to the substrate 566 and the color filter 500, there are formed orientation films 561, 564. These orientation films 561, 564 are subjected to rubbing treatment and can arrange the liquid crystal molecules in a given orientation. In addition, on an outside surface of the substrate 566 and the color filter 500, there are respectively adhered deflecting plates 562, 567. As a backlight, there is generally used a combination of a fluorescent light (not illustrated) and a scattering plate. The display is made by causing the liquid crystal composition 565 to function as an optical shutter to vary the transmittance of the backlight.

The electro-optical device in this invention is not limited to the above-described color liquid crystal display device, but various electro-optical means may be used such as a small-size television set using a thin cathode-ray tube, a liquid crystal shutter, or the like, an EL display device, a plasma display, a CRT display, a field emission display (FED) panel, or the like.

With reference to FIGS. 52 through 66, a description will now be made about the method of manufacturing an organic EL (display device) of an organic EL device.

First Embodiment

FIGS. 54 through 58 show the first embodiment of this invention. In this embodiment, this invention is applied to the active matrix type of display device using EL display elements. In more concrete, there is shown an example in which a light emitting material as an optical material is coated by using scanning lines, signal lines, and common power supply lines as the wiring.

Figure 54:
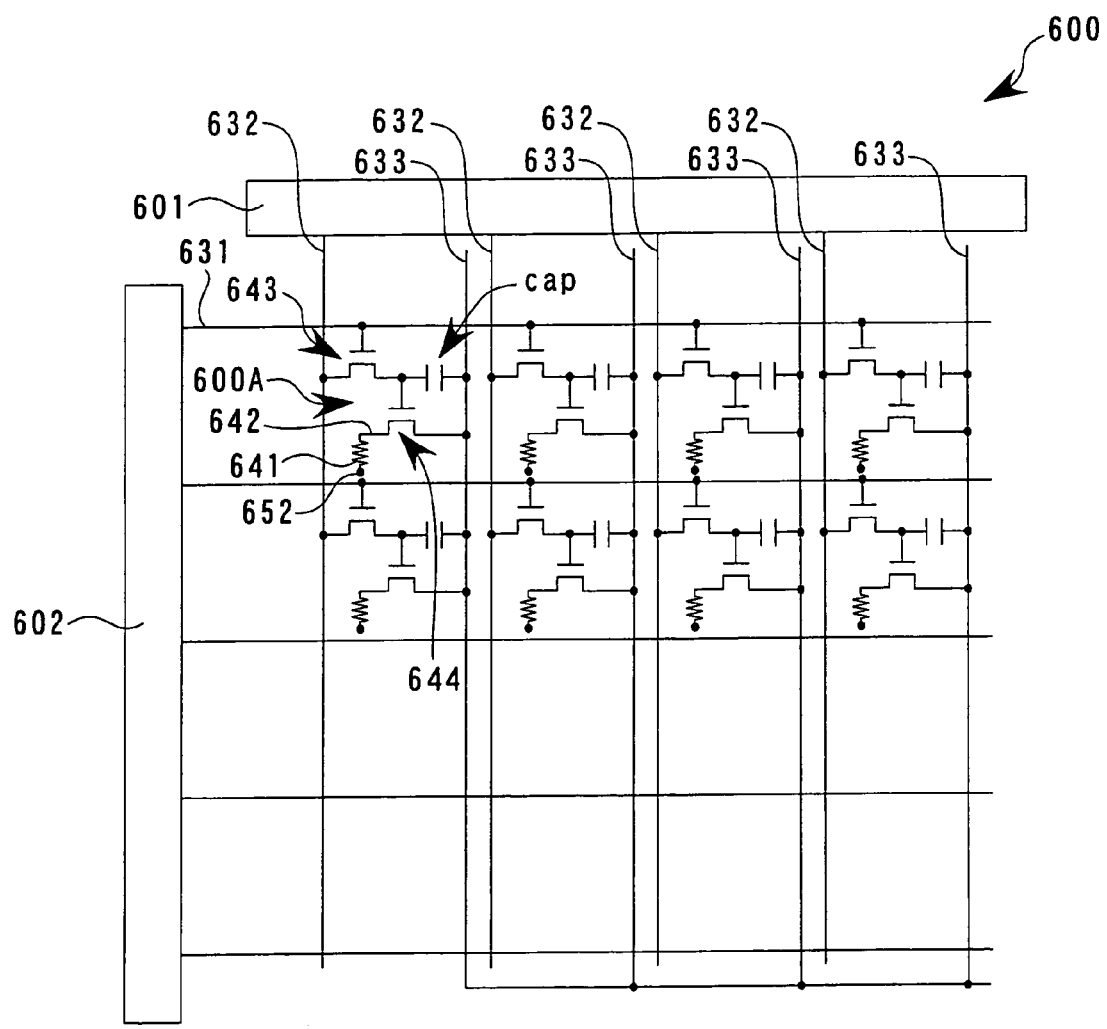
FIG. 54 is a circuit diagram showing a display device to be manufactured by the method of manufacturing organic EL.

FIG. 54 is a circuit diagram showing part of the display device 600 in this embodiment. This display device 600 is made up of: a plurality of scanning lines 631; a plurality of signal lines 632 which extend in a direction crossing the scanning lines 631; and a plurality of common power supply lines 633 which extend in parallel with the signal lines 632, all disposed on a transparent substrate in a wired arrangement. At each of the crossing points between the scanning lines 631 and the signal lines 632, there are disposed pixel regions 600A.

The signal lines 632 are provided with data-side driving circuit 601 having a shift resistor, a level shifter, a video line and an analog switch.

The scanning lines 631 are provided with a scanning-side driving circuit 602 having a shift resistor and a level shifter. Each of the pixel regions 600A is provided with: a thin film transistor 643 in which scanning signal is supplied to the gate electrode through the scanning line 631; a holding capacitor ("cap") for holding the image signals to be supplied from the signal lines through the switching thin film transistor 643; a current thin film transistor 644 in which the image signal held by the holding capacitor "cap" is supplied to the gate electrode; a pixel electrode 642 in which common driving current flows when electrically connected to the common power supply line 633 through the current thin film transistor 644; and a light emitting element 641 which is sandwiched between the pixel electrode 642 and a reflection electrode 652.

According to this arrangement, when the scanning line 631 is driven to thereby switch on the switching thin film transistor 643, the electric potential at that time is held in the holding capacitor "cap" and, depending on the state of the holding capacitor "cap," the ON-OFF state of the current thin transistor 644 is determined. The electric current then flows from the common power supply line 633 to the pixel electrode 642 through the channel of the current thin transistor 644. Further, the electric current flows to the reflection electrode 652 through the light emitting element 641. The light emitting element 641 then emits light depending on the amount of electric current to low therethrough.

Figure 55:
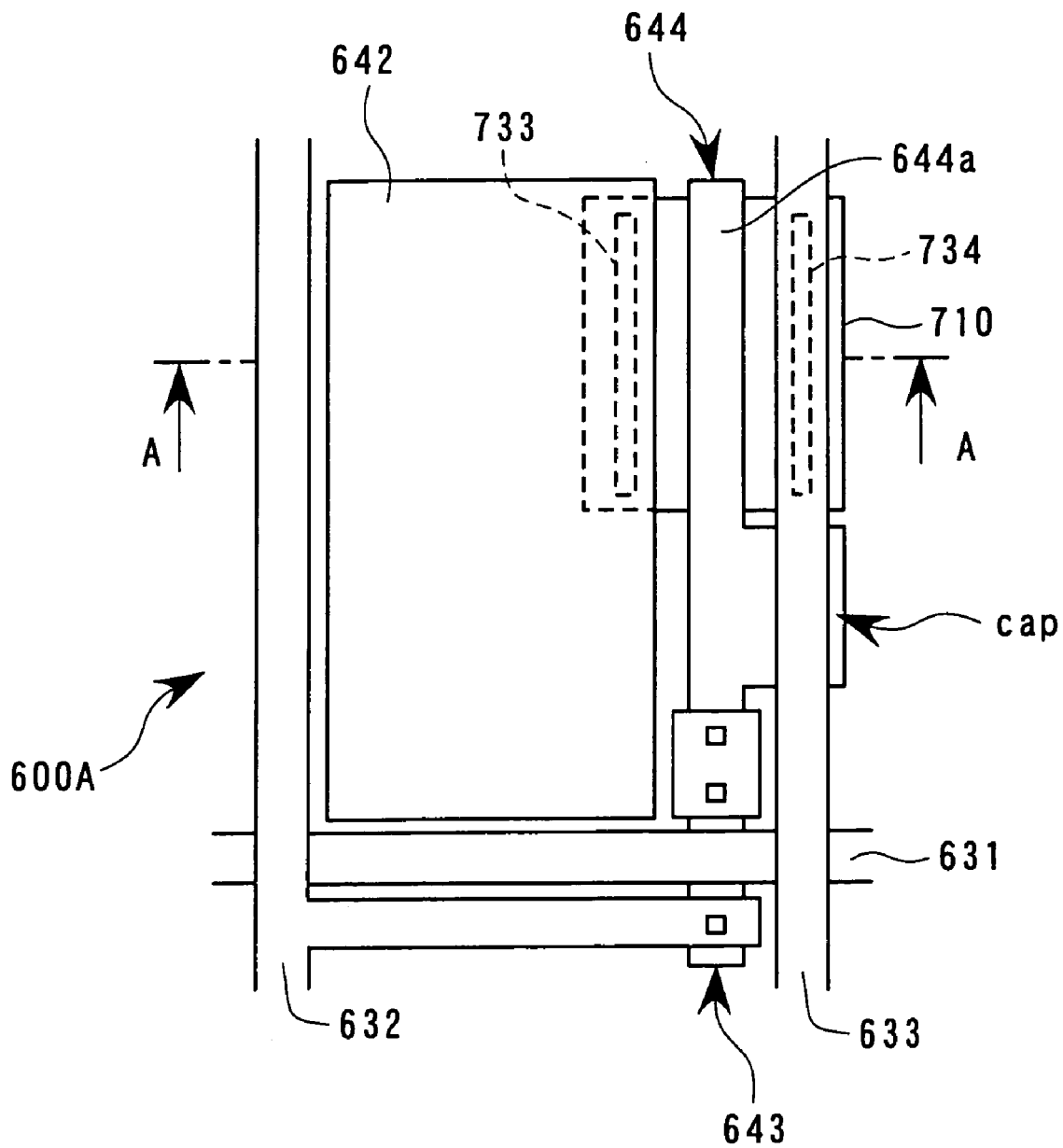
FIG. 55 is an enlarged plan view showing the plan construction of pixel region.

The plan construction of each of the pixel regions 600A is as shown in FIG. 55 which is an enlarged plan view in a state in which the reflection electrode and the light emitting element have been omitted. Namely, the four sides of the pixel electrode 641 which is rectangular in plan shape are enclosed by the signal line 632, the common power supply line 633, the scanning line 631, as well as scanning lines for other pixel electrodes (not illustrated).

FIGS. 56–58A though 58D are sectional views sequentially showing the manufacturing steps of the pixel region 600A and correspond to section A—A in FIG. 55. A description is made about the manufacturing steps with reference to FIGS. 56 through 58D.

First, as shown in FIG. 57A, a base protection film (not illustrated) which is made of a silicon oxide film of about 2000 through 5000 angstroms in thickness is formed on a transparent display substrate 621 by plasma chemical vapor deposition (CVD) method by using a raw gas such as tetraethoxysilane (TEOS), oxygen gas, or the like, depending on necessity. Then, the temperature of the display substrate 621 is set to 350° C. and, on top of the base protection film, a semiconductor film 700 made of an amorphous silicon film of about 300 through 700 angstroms is formed by plasma CVD method. This semiconductor film 700 made of an amorphous silicon film is then subjected to a crystallization step of, e.g., laser annealing method, solid phase developing method, or the like, to thereby crystallize the semiconductor film 700 to a polyslicon film. In the laser annealing method, a line beam of 400 nm in beam length of excimer laser is used, its output strength being, e.g., 200 mJ/cm². The line beam is scanned such that 90% of the peak value of the laser strength in the short-dimension direction overlaps each region.

Then, as shown in FIG. 56B, the semiconductor film 700 is subjected to patterning to make it an island-shaped semiconductor film 710. On the surface thereof there is formed a gate insulating film 720 made of a silicon oxide film or a nitrided film of about 600 through 1500 angstroms thick by plasma CVD method with TEOS, oxygen gas, or the like, as a raw material gas. The semiconductor film 710 becomes a channel region and source·drain region of the current thin film transistor 644. In a different sectional position, there is also formed a semiconductor film which becomes the channel region and source·drain region of the switching thin film transistor 643. In other words, in the manufacturing steps shown in FIGS. 56A through 58D, two kinds of transistors 643, 644 are simultaneously manufactured. Since they are manufactured in the same procedures, a description is made hereinbelow only about the current thin film transistor 644 and the description about the switching thin film transistor 643 is omitted.

Then, as shown in FIG. 56C, a conductor film made of a metallic film such as aluminum, tantalum, molybdenum, titanium, tungsten, or the like, is formed by spattering method. Then, after patterning, a gate electrode 644A is formed.

In this state, a high-temperature phosphor ion is implanted to form in the silicon thin film 710 a source·drain regions 644a, 644b in a self-aligning manner relative to the gate electrode 644A. The portions in which no impurities are introduced become channel regions 644c.

Then, as shown in FIG. 56D, after forming an interlayer dielectric 730, contact holes 731, 732 are formed. Relay electrodes 733, 734 are buried into the contact holes 731, 732.

Then, as shown in FIG. 56E, on top of the interlayer dielectric 730, there are formed a signal line 632, a common power supply line 633 and a scanning line (not illustrated in FIG. 56E). Each of the signal line 632, common power supply line 633, and scanning line is not limited to the required thickness but is formed thick enough. In concrete, each line is formed in a thickness of about 1 to 2 μm. The relay electrode 734 may be formed in the same step as each of the wiring. The relay electrode 734 is formed by an ITO film as described hereinafter.

Then, an interlayer dielectric 740 is formed to coat an upper surface of each wiring. A contact hole 741 is formed in a position corresponding to the relay electrode 733 is formed, and an ITO film is formed in a manner to be buried inside the contact hole 741. The ITO film is subjected to patterning to thereby form, in predetermined positions enclosed by the common power supply line 633 and the scanning line, pixel electrode 642 which is electrically connected to the source·drain region 644a.

In FIG. 56E, the portion enclosed by the signal line 632 and the common power supply line 633 corresponds to the predetermined position in which the optical material is selectively disposed. Between the predetermined position and its surrounding, there is formed a difference in level (also referred to as a "level-difference portion") 611 by the signal line 632 and the common power supply line 633. In concrete, there is formed a recessed level-difference portion 611 which is lower than the surrounding thereof.

As shown in FIG. 57A, in a state in which the upper surface of the display substrate 621 looks upward, a liquid (in a state of a solution held in a solvent) optical material (precursor) 612A for forming a hole injection layer is ejected so as to selectively coat the region (predetermined position) enclosed by the level-difference portion 611 with the optical material.

As a material for forming the hole injection layer, there may be mentioned polyphenylen vinylene whose polymer precursor is polytetrahydrothiophenylphenylene, 1,1-bis-(4-N,N-dinitrylaminophenyl)cyclohexane, Tris(8-hydroxyguinolinol) aluminum, and so forth.

Since the liquid precursor 612A is high in mobility, it tends to spread in the horizontal direction. However, since the level-difference portion 611 is formed so as to enclose the coated position, the precursor 612A is prevented from spreading outside the predetermined position beyond the level-difference portion 611 provided that the amount of coating the precursor 612A per one time is not made extremely large.

Then, as shown in FIG. 57B, the solvent in the liquid precursor 612A is evaporated by heating or by irradiation of light to thereby form on the pixel electrode 642 a solid hole injection layer 641a. Here, although dependent on the concentration of the liquid precursor 612A, only a thin hole injection layer 641A is formed. If a thicker hole injection layer 641a is required, the steps of FIGS. 57A and 57B are repeated for the required times so that the hole injection layer 641A of sufficient thickness is formed as shown in FIG. 57C.

Then, as shown in FIG. 58A, in a state in which the upper surface of the display substrate 621 looks upward, there is ejected a liquid (in a state of a solution held in a solvent) optical material (organic fluorescent material) 612B for forming an organic semiconductor film corresponding to the upper layer portion of the light emitting element 641. The optical material 612B is selectively coated inside the region (predetermined position) enclosed by the level-difference portion 611.

As an organic fluorescent material, there may be mentioned cyano polyphenylene vinylene, polyphenylene vinylene, polyalkyl phenelene, 2,3,6,7-tetrahydro-11-oxo-1H, 5H, 11H-(1)benzopyrano[6,7,8-ij]-quinolizin-10-carboxylic acid, 1, 1-Bis[4-[N,N-di(tolyl)amino]phenyl]cyclohexane, 2-13, 4'-dihydrocyphenyl)-3,5,7-trihydroxy-1-benzopyrilium perchlorate, Tris-(8-hydroxyquinolinol) aluminum, 2,3,6,7-tetrahydro-9-methyl-11-oxo-1H, 5H, 11H(1)benzopyrano[6,7,8-ij]-quinolizin, aromatic diamine derivatives (TDP), oxydiazole dimer (OXD), oxydiazole derivatives (PBD), distyryl-arylene derivatives (DSA), quinolinol-based metal complexes, beryllium-benzoquinolinol complex (Bebq), triphenyl amine derivatives (MT-DATA), distyryl derivatives, pyrazoline dimer, rubrene, quinacridone, triazole derivatives, polyphenylene, polyalkyl fluorene, polyalkyl thiophene, azomethine-zinc complex, porphyrin-complex, benzoxazole-zinc complex, phenanthroline-europium complex, and so forth.

At this time, since the organic fluorescent material 612B is high in mobility, it also tends to spread in the horizontal direction. However, since there is formed the level-difference portion 611 so as to enclose the coated position, the liquid organic fluorescent material 612B is prevented from spreading outside the predetermined position beyond the level-difference portion 611 provided that the amount of coating the organic fluorescent material 612B per one time is not made extremely large.

Then, as shown in FIG. 58B, the solvent in the organic fluorescent material is evaporated by heating or by irradiation of light so as to form on the hole injection layer 641A a solid organic semiconductor film 641b. Depending on the concentration of the liquid fluorescent material 612B, only a thin organic semiconductor film 641b is formed here. If a thicker organic semiconductor film 641b is required, the steps of FIGS. 58A and 58B are repeated for the required times so that the organic semiconductor film 641B of sufficient thickness is formed as shown in FIG. 58C. Finally, as shown in FIG. 58D, a reflection electrode 652 is formed over the entire surface of the display substrate 621 or in the form of stripes.

In this embodiment, since wiring such as the signal line 632, the common wiring 632, or the like, is formed so as to enclose the processing position in which the light emitting element 641 is disposed, and further since such wiring is made thicker than an ordinary thickness to thereby form the level-difference portion 611 and, still furthermore, since the liquid precursor 612A or the liquid organic fluorescent material 612B is selectively coated, there is an advantage in that the patterning accuracy of the light emitting element 641 is high.

Once the level-difference portion 611 has been formed, the reflecting electrode 652 will be formed in a surface of relatively large recession and projection. If the thickness of the reflecting electrode 652 is made thick to a certain degree, there is extremely a small possibility of the occurrence of problems such as failure (cutting) of wiring, or the like.

In addition, since the level-difference portion 611 is formed by utilizing the wiring such as the signal line 632, the common wiring 633, or the like, there is no increase in the new manufacturing step; the manufacturing step is not largely complicated.

The optical material to form the upper layer of the light emitting element 641 is not limited to the organic fluorescent material 612B, but may be other inorganic fluorescent materials.

Each of the transistors 643, 644 as the switching element shall preferably be formed by polycrystalline silicon formed by a low-temperature process below 600° C. As a result, it is possible to attain both the reduction in cost by the use of a glass substrate and the high performance by a high mobility. The switching element may also be formed of an amorphous silicon or a poly-crystal line silicon formed at a high-temperature process above 600° C.

The embodiment may be of a type in which, aside from the switching thin film transistor 643 and the current thin film transistor 644, other transistors are provided. Or else, it may also be of a type to be driven by a single transistor.

The level-difference portion 611 may also be formed by a first bus wire of a passive matrix type of display element, a scanning wire 631 of an active matrix type of display element, or by a shielding layer.

As the light emitting element 641, the hole injection layer 641A may be omitted although the light emitting efficiency (hole injection ratio) becomes slightly smaller. Further, in place of the hole injection layer 641A, the electron injection layer may be formed between the organic semiconductor film 641B and the reflection electrode 652. Or else, both the hole injection layer and the electron injection layer may be formed.

Figure 59:
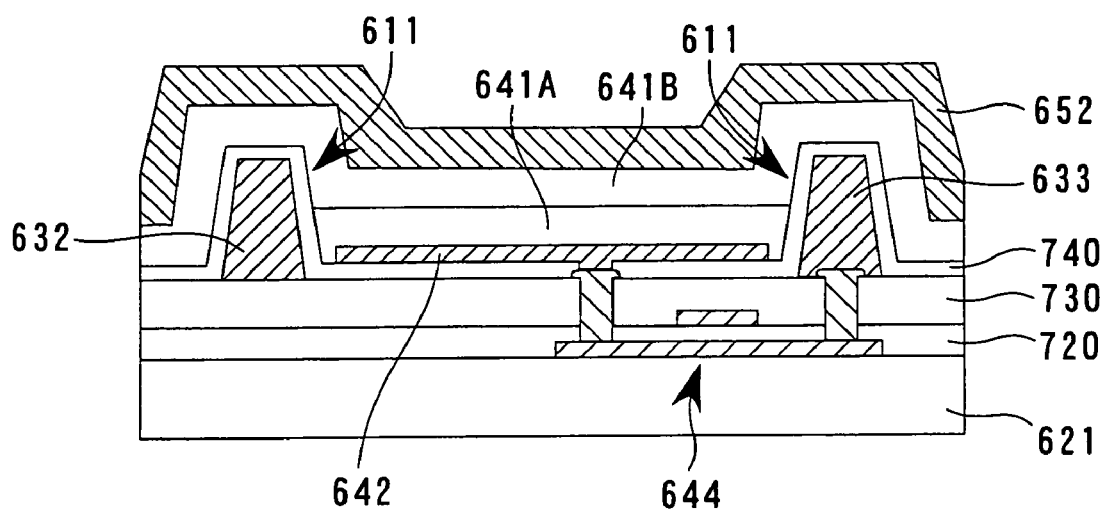
FIG. 59 is a sectional view schematically showing the manufacturing method of the organic EL according to a first embodiment according to first embodiment.

In the above-described embodiment, a description was made about the case in which all of the respective light emitting elements 641 are selectively disposed having in mind, particularly, the color display. However, in case of the display device 600 of a single-color display, the organic semiconductor film 641 B may be formed uniformly over the entire surface of the display substrate 621 as shown in FIG. 59. In this case, too, since the hole injection layer 641A must be selectively disposed for each of the predetermined points, the coating utilizing the level-difference portion 611 is extremely effective.

(2) Second Embodiment

Figure 60A:
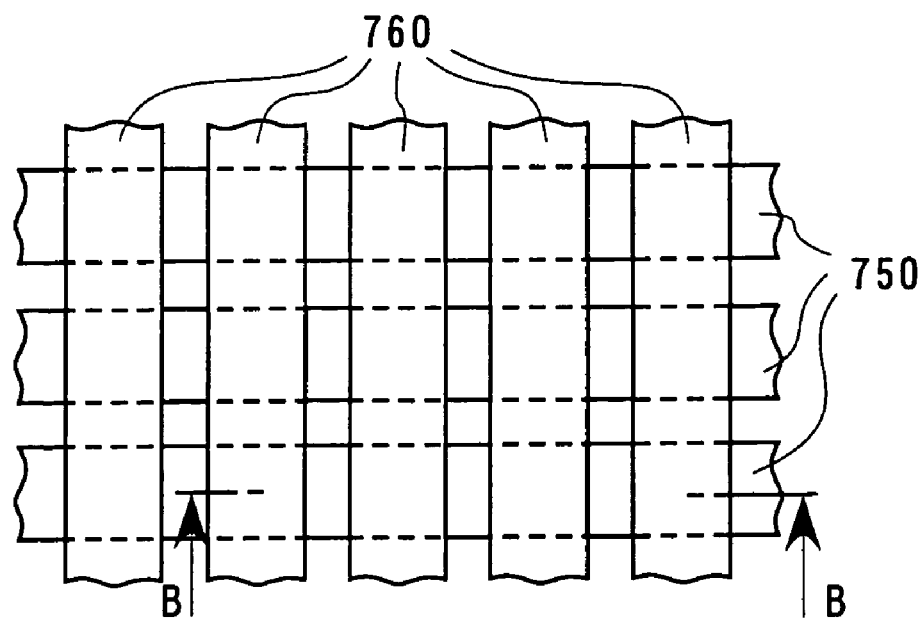
FIGS. 60A and 60B are plan view and sectional view schematically showing the manufacturing method of an organic EL according to second embodiment.
Figure 60B:
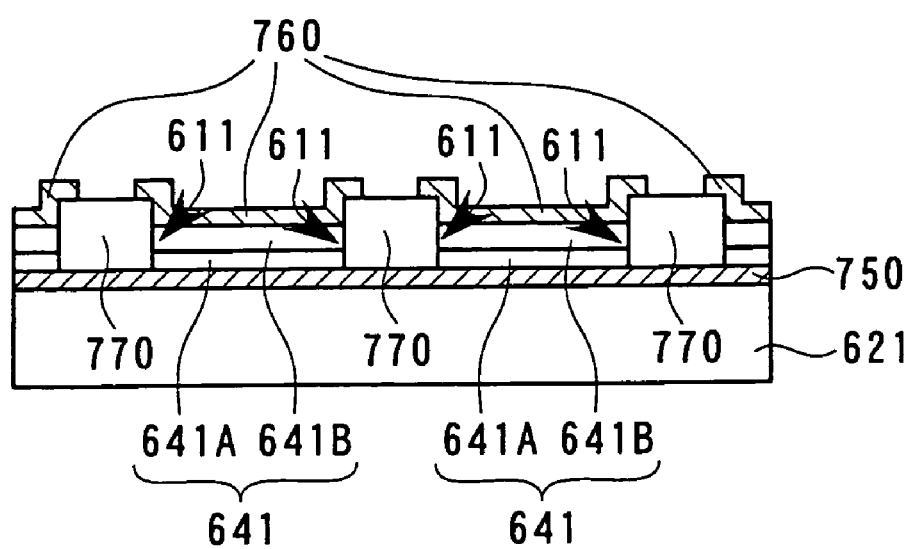

FIGS. 60A and 60B show a second embodiment of this invention. This embodiment is one in which this invention is applied to a passive matrix type of display device using EL display elements.

FIG. 60A is a plan view showing the disposing relationship between a plurality of first bus wires 750 and a plurality of second bus wires 760 which are disposed at right angles thereto. FIG. 60B is a sectional view taken along the line B—B in FIG. 60A.

The same reference numerals are given to the same construction as that in the first embodiment, and the duplicated description is omitted. The detailed manufacturing steps are also the same as those of embodiment 1. Therefore, their illustration and description are omitted.

In this embodiment, an insulating film 770 of, e.g., SiO$_2$, or the like, is disposed so as to enclose the predetermined position in which the light emitting element 641 is disposed. As a result, a level-difference portion 611 is formed between the predetermined position and the circumference.

In this kind of arrangement, like in the above-described embodiment 1, when the liquid precursor 621A or the liquid organic fluorescent material 612B is selectively coated, it can be prevented from flowing out to the circumference and there is an advantage in that a highly accurate patterning can be performed.

(3) Third Embodiment

Figure 61:
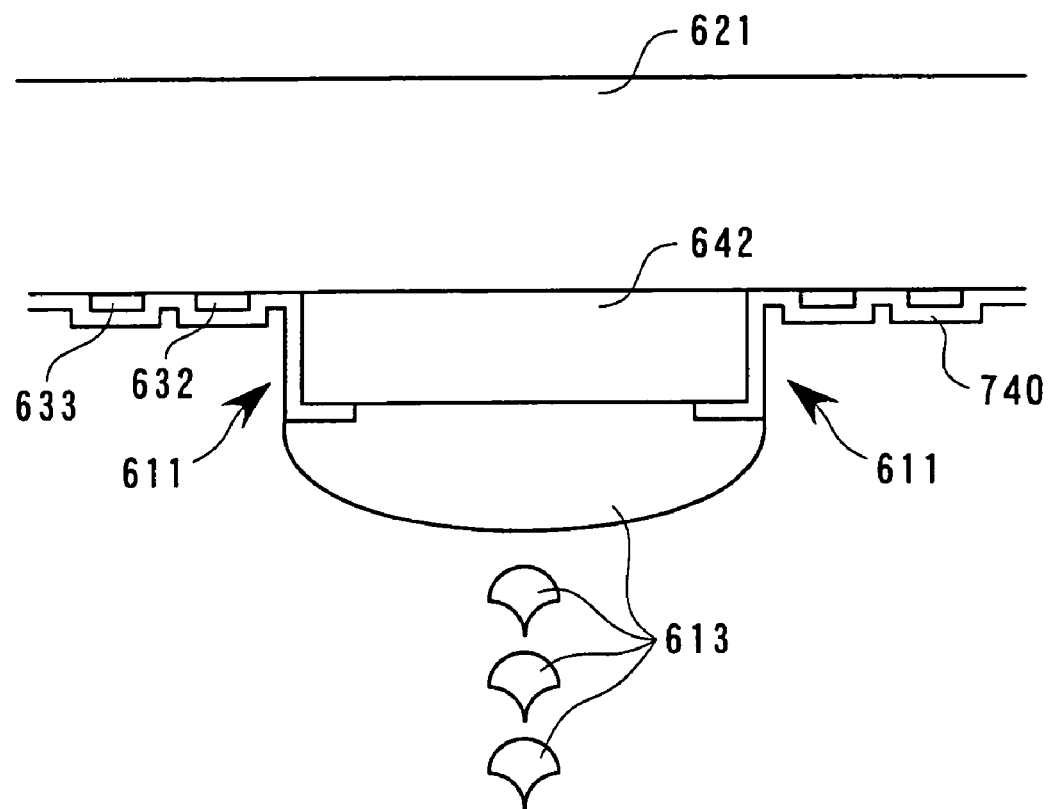
FIG. 61 is a sectional view schematically showing the manufacturing method of an organic EL according to a third embodiment.

FIG. 61 shows a third embodiment of this invention.

In this embodiment, this invention is applied, in the same manner as in the first embodiment, to an active matrix type of display device using an EL display element. In particular, it is so arranged that a high accuracy patterning can be performed by forming the level-difference portion 611 utilizing the pixel electrode 642.

The same reference numerals are given to the same construction as above. FIG. 61 is a sectional view showing an intermediate state of the manufacturing step. Since the steps before and after the above are the same as those in embodiment 1, their illustration and description are omitted.

In this embodiment, the pixel electrode 642 is formed thicker than the ordinary one and the level-difference portion 611 is thereby formed. In other words, in this embodiment, there is formed a projected level-difference portion whose pixel electrode to which the optical material is coated afterwards is formed higher than the surrounding.

In a similar manner as in the first embodiment, a liquid (in a state of a solution held in a solvent) optical material (precursor) for forming a hole injection layer which corresponds to the lower layer of the light emitting element 641 is ejected by the ink jet system to thereby coat the upper surface of the pixel electrode 642.

Unlike the above-described first embodiment, the coating of the liquid precursor 612A is performed in a state in which the display substrate 621 is placed upside down, i.e., in a state in which the upper surface of the pixel electrode to which the liquid precursor 612A is applied looks downward.

Then, the liquid precursor 612A stays on an upper surface of the pixel electrode 642 due to gravity and surface tension, and does not spread into the periphery. Therefore, if the hardening is performed by heating or irradiation of light, a thin hole injection layer which is similarly thin like the one in FIG. 57B can be obtained. By repeating these steps, a hole injection layer can be formed. In a similar procedure, an organic semiconductor film can be formed.

As described above, in this embodiment, by coating the liquid optical material by utilizing the projected level-difference portion 611, the patterning accuracy of the light emitting element can be improved.

It may also be arranged that the amount of optical material which stays on the upper surface of the pixel electrode 642 is adjusted by utilizing the inertia force such as a centrifugal force, or the like.

(4) Fourth Embodiment

Figure 62:
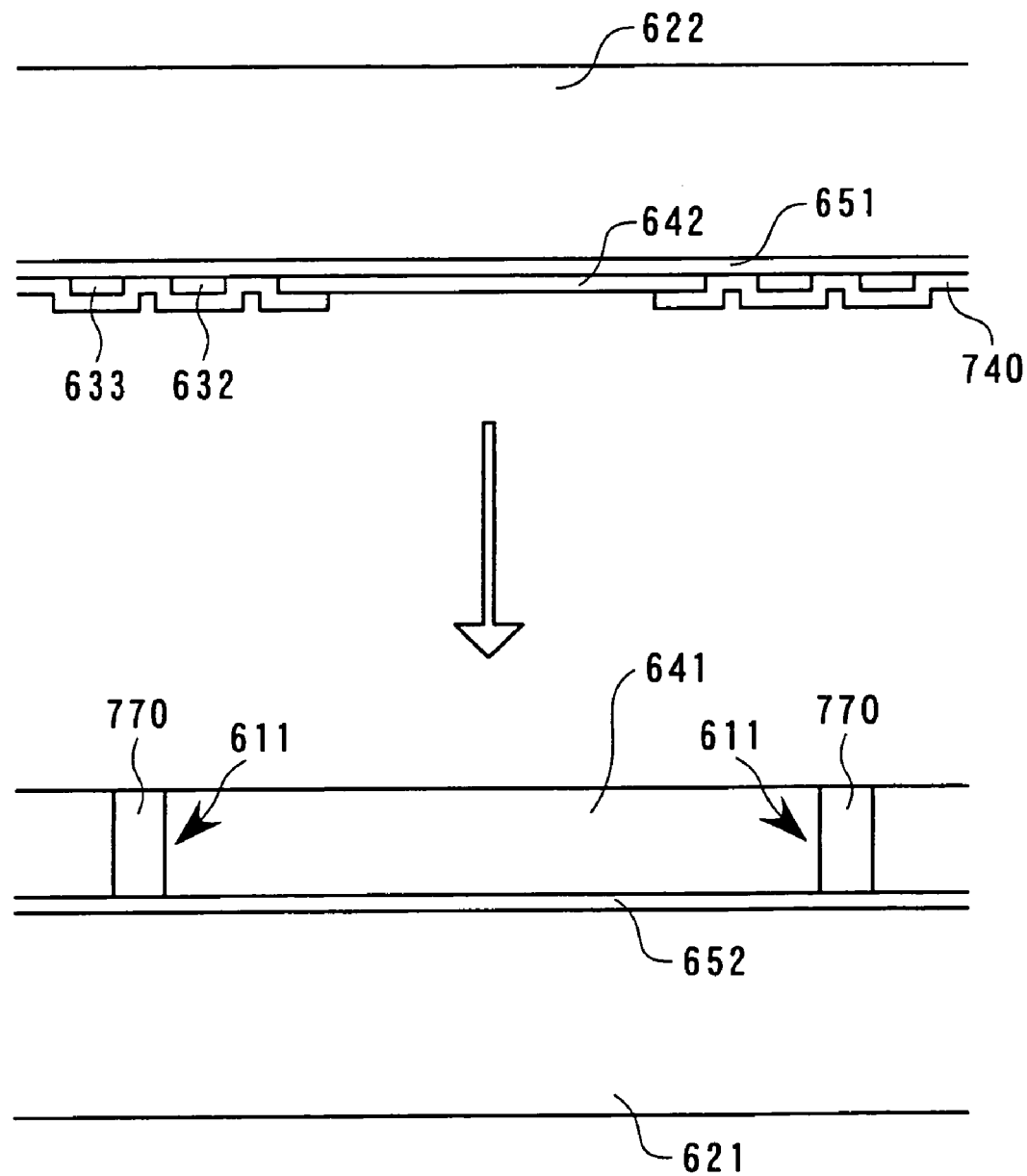
FIG. 62 is a sectional view schematically showing the manufacturing method of an organic EL according to a fourth embodiment.

FIG. 62 shows a fourth embodiment of this invention. In this embodiment, this invention is also applied, in the same manner as in the first embodiment, to an active matrix type of display device using an EL display element. The same reference numerals are given to the same construction as above. FIG. 62 is a sectional view showing an intermediate state of the manufacturing step. Since the steps before and after the above are the same as those in embodiment 1, their illustration and description are omitted.

In this embodiment, first, the reflection electrode 652 is formed on the display substrate 621. Then, on top of the reflection electrode 652, an insulating film 770 is formed so as to enclose the predetermined position in which the light emitting element 641 is subsequently disposed. As a result, a depressed level-difference portion 611 in which the predetermined position is lower than the surrounding is formed.

Then, in a similar manner as in the above embodiment 1, a light emitting element 641 is formed by selectively coating the liquid optical material by the inkjet system in the region enclosed by the level-difference portion 611.

On the other hand, on top of a peeling substrate 622, there are formed through a peeling layer 651 a scanning wire 631, a signal wire 632, a pixel electrode 642, a switching thin film transistor 643, a current thin transistor 644, and insulating film 740.

Finally, the structure peeled off from the peeling layer 622 on the peeling substrate 622 is transferred to the top of the display substrate 621.

In this embodiment, since the liquid optical material is coated by utilizing the level-difference portion 611, a highly accurate patterning can be performed. Further, in this embodiment, it becomes possible to reduce the damages to the subsidiary material such as the light emitting element 641, or the like, by the subsequent steps, or the damages, by the coating of optical material, to the scanning line 631, the signal line 632, the pixel electrode 642, the switching thin film transistor 643, the current thin film transistor 644, or the insulating film 740.

In this embodiment, the description was made about an active matrix type of display element, but it may be passive matrix type of display element.

(5) Fifth Embodiment

Figure 63:
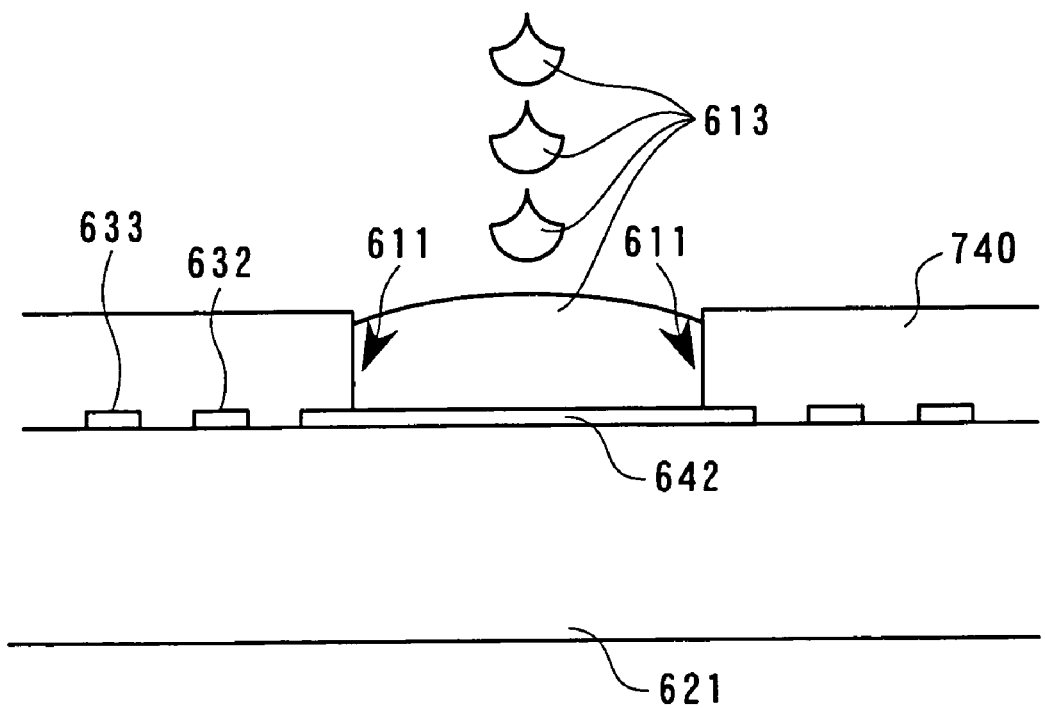
FIG. 63 is a sectional view schematically showing the manufacturing method of an organic EL according to a fifth embodiment.

FIG. 63 shows a fifth embodiment of this invention, In this embodiment, this invention is also applied, in the same manner as in the first embodiment, to an active matrix type of display device using an EL display element. The same reference numerals are given to the same construction as above. FIG. 63 is a sectional view showing an intermediate state of the manufacturing step. Since the steps before and after the above are the same as those in embodiment 1, their illustration and description are omitted.

In this embodiment, the concave or depressed level-difference portion 611 is formed by utilizing the interlayer dielectric film 740. As a result, the similar effect is obtained as in the above-described embodiment 1.

No new step increases to form the level-difference portion 611 by utilizing interlayer dielectric film 740. Therefore, there is no possibility of making the manufacturing processes largely complicated.

(6) Sixth Embodiment

Figure 64:
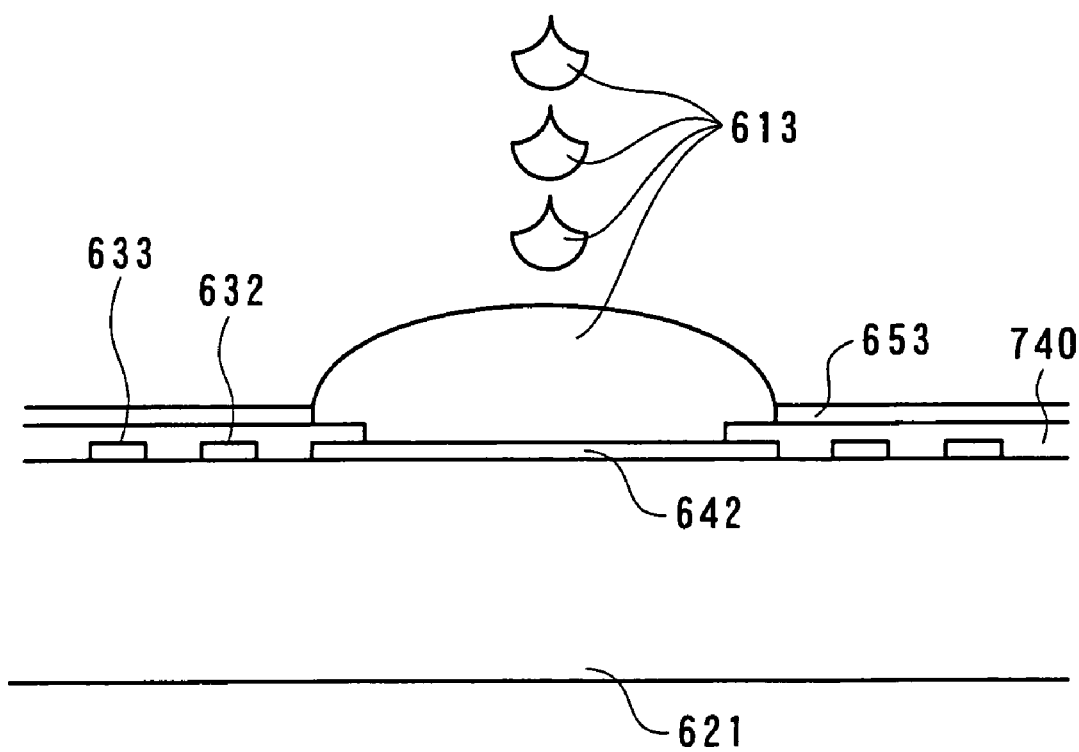
FIG. 64 is a sectional view schematically showing the manufacturing method of an organic EL according to a sixth embodiment.

FIG. 64 shows a sixth embodiment of this invention. In this embodiment, this invention is also applied, in the same manner as in the first embodiment, to an active matrix type of display device using an EL display element. The same reference numerals are given to the same construction as above. FIG. 64 is a sectional view showing an intermediate state of the manufacturing step. Since the steps before and after the above are the same as those in embodiment 1, their illustration and description are omitted.

This embodiment is not intended to improve the patterning accuracy by utilizing the level-difference portion, but is intended to relatively increase the hydrophilic property at the predetermined position to which the liquid optical material is coated so that the coated liquid optical material does not extend outward.

In concrete, as shown in FIG. 64, after forming the interlayer dielectric film 740, an amorphous silicon layer 653 is formed on top thereof. Since the amorphous silicon layer 653 has a relatively stronger water repellency than ITO which forms the pixel electrode 642, there will be formed therein a distribution of water repellency·hydrophilic property which is relatively stronger than the surrounding hydrophilic property.

As in the above-described embodiment 1, by selectively coating the liquid optical material toward the upper surface of the pixel electrode 642 by ink jet system, the light emitting element 641 is formed and finally the reflection electrode is formed.

In this manner, also in this embodiment, since the liquid optical material is coated after the formation of the distribution of the desired water repellency·lyophilic property, the patterning accuracy can be improved.

It is needless to say that this embodiment can also be applied to the passive matrix type of display device.

Further, there may be included the step of transferring to the display substrate 621 the structure which is formed on the releasing substrate 621 through the releasing layer 651.

Still furthermore, the desired water repellency·hydrophilic property was formed by the amorphous silicon layer 653 in this embodiment, the distribution of the water repellency·hydrophilic property may be formed by a metal, an anodic oxide film, an insulating film of polyimide, silicon oxide, or the like, or other materials. The passive matrix type of display element may be formed by the first bus wiring, and the active matrix type of display device may be formed by the scanning line 631, the signal line 632, the pixel electrode 642, the insulating film 740, or the light shielding layer.

In this embodiment, a description was made on the premise that the liquid optical material is an aqueous solution. The optical material may be other liquid optical materials using other liquid solutions. In such a case, there may be arranged that the liquid repellency·hydrophilic property is obtained with the solution in question.

(7) Seventh Embodiment

The seventh embodiment is similar in cross-section to that shown in FIG. 63 used with reference to the fifth embodiment. Therefore, a description will be made by using FIG. 63.

In this embodiment, the interlayer dielectric 740 is formed by $SiO_2$, and ultraviolet rays are irradiated upon the surface. Thereafter, the surface of the pixel electrode 642 is exposed and the liquid optical material is selectively coated.

In this kind of manufacturing steps, not only is the level-difference portion 611 formed, but also is formed a distribution of strong liquid repellency along the surface of the interlayer dielectric 740. The coated liquid optical material thus becomes likely to stay in the predetermined position due to the function of both the level difference portion 611 and the liquid repellency of the interlayer dielectric 740. In other words, since the functions of both the fifth embodiment and the sixth embodiment are performed, the patterning accuracy of the light emitting element 641 can further be improved.

The timing of irradiating the ultraviolet rays may be either before or after the surface of the pixel electrode 642 is exposed and may be arbitrarily selected depending on the material to form the interlayer dielectric 740, the material to form the pixel electrode 642, or the like. In case the ultraviolet rays are irradiated to expose the surface of the pixel electrode 642, the liquid repellency on the inner wall surface of the pixel electrode 642 is not strong. Therefore, it is advantageous in causing the liquid optical material to stay within the region enclosed by the level-difference portion 611. On the contrary, in case the ultraviolet rays are irradiated after the surface of the pixel electrode 642 is exposed, it is necessary to vertically irradiate the ultraviolet rays so that the liquid repellency on the inner wall surface of the level-difference portion 611 does not become strong. However, since the ultraviolet rays are irradiated after the etching step at the time of exposing the surface of the pixel electrode 642, there is an advantage in that the liquid repellency will not be weakened.

As the material for forming the interlayer dielectric 740, photo-resist may be used, or polyimide may also be used. There is an advantage in that a film can be formed with these materials by spin coating.

Depending on the material to form the interlayer dielectric 740, instead of irradiation of the ultraviolet rays, plasma of $O_2$, $CF_3$, Ar, or the like, may be irradiated to strengthen the liquid repellency.

(8) Eighth Embodiment

Figure 65:
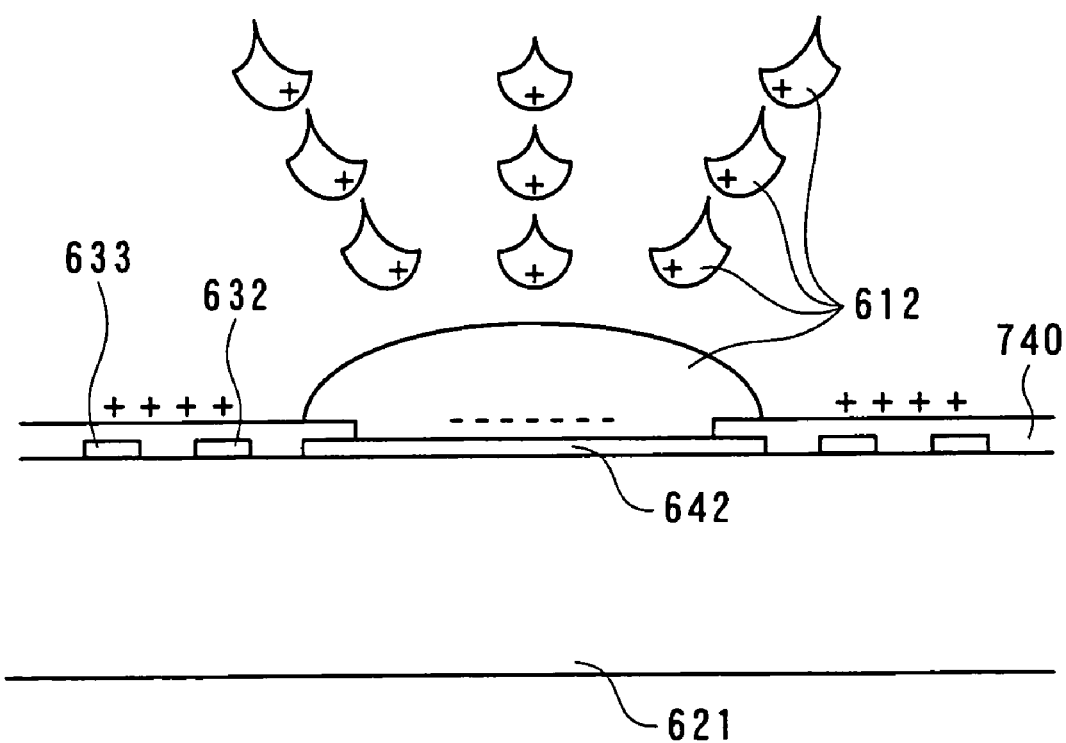
FIG. 65 is a sectional view schematically showing the manufacturing method of an organic EL according to an eighth embodiment.

FIG. 65 shows an eighth embodiment of this invention. In this embodiment, like in the first embodiment, this invention is applied to the active matrix type of display device using an EL display element. The same reference numerals are given to the same construction as above. FIG. 65 is a sectional view showing an intermediate state of the manufacturing step. Since the steps before and after the above are substantially the same as those in embodiment 1, their illustration and description are omitted.

In other words, instead of improving the patterning accuracy by utilizing the level-difference portion and the distribution of the liquid repellency.hydrophilic property, this embodiment intends to improve the patterning accuracy by utilizing the gravity and repellant force due to potential.

In concrete, as shown in FIG. 65, by driving the signal line 62 and the common power supply line 633 as well as by switching on and off transistors (not illustrated), the potential distribution is formed such that the pixel electrode 642 becomes the negative potential and the interlayer dielectric film 740 becomes positive potential. By means of ink jet system, the positively charged liquid optical material 612 is selectively coated to the predetermined position.

In this manner, according to this arrangement, the desired potential distribution is formed on the display substrate 621, and by utilizing the gravity and repellant force between the potential distribution and the positively charged liquid optical material 612, the liquid optical material is selectively coated. Therefore, the patterning accuracy can be improved.

Particularly, in this embodiment, since the liquid optical material 612 is electrically charged, the effect of improving the patterning accuracy can further be enhanced by utilizing not only the spontaneous polarization but also the electric charge.

In this embodiment, an example was shown in which this invention is applied to the active matrix type of display device. It can also be applicable to the passive matrix type of display element.

There may also be included a step in which the structure formed on the releasing substrate 621 through the releasing layer 651 is transferred to the display substrate 621.

In this embodiment, the desired electric potential distribution is formed by: sequentially charging the electric potential to the scanning line 631; simultaneously charging the electric potential to the signal line 632 and the common power supply line 633; and charging the electric potential to the pixel electrode 644 through the switching thin film transistor 643 and the current thin transistor 644. By forming the electric potential distribution by the scanning line 631, the signal line 632, the common line 633 and the pixel electrode 642, the increase in the manufacturing steps can be restricted. With the passive matrix type of display device, the electric potential distribution may also be formed by the first bus wire and the light shielding layer.

Figure 66:
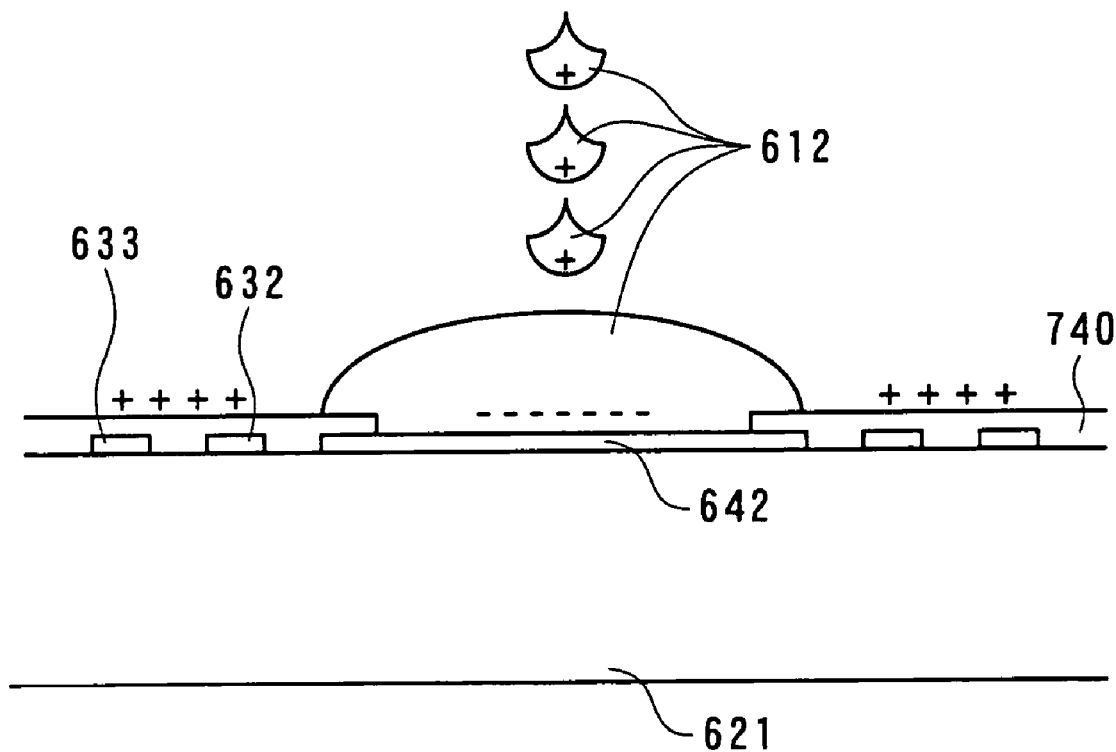
FIG. 66 is a sectional view schematically showing the manufacturing method of the organic EL according to the eighth embodiment.

Further, according to this embodiment, electric potential is given to both the pixel electrode 642 and the interlayer dielectric film 740. It is not necessary to limit it but, as shown in FIG. 66, the electric potential is not given to the pixel electrode 642. Only the positive electric potential is given to the interlayer dielectric 740 so that the liquid optical material may be coated after positively charging it. According to this arrangement, since the liquid optical material 612 can surely be maintained to the positively charged state, the liquid optical material 612 can surely be prevented, due to the repellant force between the surrounding interlayer dielectric layer 740, from flowing outward into the surrounding.

Similarly, the head unit of this embodiment can be applied to the method of manufacturing an electron emission device, the method of manufacturing a PDP device, the method of electrophoretic display device, or the like.

In the method of manufacturing an electron emission device, fluorescent materials of each of the R, G, B colors are introduced into a plurality of liquid droplet ejection heads. The plurality of liquid droplet ejection heads are subjected to the main scanning and the subsidiary scanning. The fluorescent material is selectively ejected to thereby form a multiplicity of florescent members on the electrode. The electron emission device is a generic idea inclusive of FED.

In the method of manufacturing a PDP device, fluorescent materials of each of the R, G, B colors are introduced into a plurality of liquid droplet ejection heads. The plurality of liquid droplet ejection heads are subjected to the main scanned and the subsidiary scanning. The fluorescent material is selectively ejected to thereby form fluorescent bodies in each of a multiplicity of depressed portions on a back substrate.

In the method of manufacturing an electrophoretic display device, electrophoretic materials of each color are introduced into a plurality of liquid droplet ejection heads. The plurality of liquid droplet ejection heads are subjected to the main scanning and the subsidiary scanning. The ink material is selectively ejected to thereby form electrophoretic members in each of a multiplicity of recessed portions on an electrode. The elecrophoretic member which is made up of electrically charged particles and pigments is preferably sealed inside micro-capsules.

The head unit of this embodiment is also applicable to the method of forming a spacer, the method of forming a metallic wire, the method of forming a lens, the method of forming a resist, the method of forming a light diffusion member, or the like.

The method of forming a spacer is to form a large number of particulate spacers between two substrates so as to form a minute cell gap. A particulate material constituting the spacers is introduced into a plurality of liquid droplet ejection heads, the plurality of droplet ejection heads are subjected to the main scanning and the subsidiary scanning through the head unit, and the particulate material is selectively ejected to thereby form the spacers on at least one of the substrates. For example, this method is useful in forming a cell gap between two substrates in the above-descried liquid crystal display device or the electrophoretic display device. It is needless to say that this method is applicable to a method of manufacturing a semiconductor device which requires this kind of minute gap.

In the method of forming a metallic wire, a liquid metallic material is introduced into a plurality of liquid droplet ejection heads. The plurality of liquid droplet ejection heads are subjected to the main scanning and the subsidiary scanning. The metallic material is selectively ejected to thereby form a metallic wire on a substrate. For example, this method is applicable to the metallic wiring to connect the driver and each of the electrodes on the substrate, or to the metallic wiring to connect thin film transistors (TFTs) in the above-described organic EL device. Further, it is needless to say that this metallic wiring is applicable to a general method of manufacturing semiconductor devices, aside from this kind of flat display devices.

In the method of forming a lens, a lens material is introduced into a plurality of liquid droplet ejection heads. The plurality of liquid droplet ejection heads are subjected to the main scanning and the subsidiary scanning. The lens material is selectively ejected to thereby form a micro-lens on a transparent substrate. For example, this micro-lens is applicable as a beam focusing device in the above-described FED device. Further, it is needless to say that this micro-lens is applicable to various kinds of optical devices.

In the method of forming a resist, a resist material is introduced into a plurality of liquid droplet ejection heads. The plurality of liquid droplet ejection heads are subjected to the main scanning and the subsidiary scanning. The resist material is selectively ejected to thereby form a resist of an arbitrary shape on a substrate. For example, this resist is widely applicable to the coating of a photoresist in the photolithography which constitutes the main current in the method of manufacturing a semiconductor, aside from the method of forming a bank in various kinds of display methods.

In the method of forming a light diffusion member, the head unit assembled by the head unit assembly apparatus is used to thereby form a multiplicity of light diffusion members on a substrate. An light diffusion material is introduced into a plurality of liquid droplet ejection heads. The plurality of liquid droplet ejection heads are subjected to the main scanning and the subsidiary scanning. The light diffusion material is selectively ejected to thereby form a multiplicity of light diffusion members. It is needless to say that this light diffusion member is applicable to various kinds of optical devices.

As described above, according to the member to be recognized for alignment of this invention, the image-wise recognition can be performed by a clear contrast. Therefore, the wrong recognition or the incapability of recognition can be effectively prevented. In addition, since the member main body is formed into a columnar shape, it can be formed easily and its interference with the other parts can be omitted.

According to the head unit and the electronic device provided therewith, the positional recognition of the head unit itself can be performed at a high accuracy, resulting in an improved apparatus reliability.

On the other hand, according to the method of manufacturing a liquid display device, the method of manufacturing an organic EL device, the method of manufacturing an electron emission device, the method of manufacturing a PDP device, and the method of manufacturing an electrophoretic display device of this invention, there can be used a head unit which is suitable to the filter material, the luminescent material, or the like. Therefore, the manufacturing efficiency can be improved.

Still furthermore, according to the method of manufacturing a color filter, the method of manufacturing an organic EL, the method of forming a spacer, the method of forming a metallic wire, the method of forming a lens, the method of forming a resist, and the method of forming a light diffusion member of this invention, there can be used a head unit suitable for the filter material, the luminescent material, or the like, in each of the electronic devices and optical devices, thereby improving the manufacturing efficiency.

What is claimed is:

1. A method of manufacturing a device, the method comprising the steps of:
   introducing each color of material into a plurality of liquid droplet ejection heads; and
   scanning the plurality of liquid droplet ejection heads relative to a substrate through a ahead unit to selectively eject the material, wherein the head unit includes a carriage with two members recognized for alignment, each member being disposed in an object set in position and having formed therein a mark for image-wise recognition, each member comprising a member main body formed substantially in a columnar shape and having a mirror-finished front end surface, wherein the marks are formed into a depressed shape in a substantially central part of the front end surface of each member main body and the marks are disposed at a distance from each other; and the plurality of liquid droplet ejection heads mounted on the carriage.

2. The method according to claim 1, wherein the device is a liquid crystal display device in which a multiplicity of filter elements are formed on the substrate by using the head unit and the material is filter material.

3. The method according to claim 1, wherein the device is an organic EL device in which an EL light emitting layer is respectively formed on a multiplicity of pixels on the substrate by using the head unit and the material is light emitting material.

4. The method according to claim 1, wherein the device is an electronic emission device in which a multiplicity of fluorescent members are formed on the substrate by using the head unit and the material is a fluorescent material.

5. The method according to claim 1, wherein the device is a PDP device in which fluorescent members are formed in a multiplicity of depressed portions on the substrate by using the head unit and the material is a fluorescent material.

6. The method according to claim 1, wherein the device is an electrophoretic display device in which electrophoretic members are formed in a multiplicity of depressed portions on the substrate by using the head unit and the material is an electrophoretic material.

7. The method according to claim 1, wherein the device is a color filter in which a multiplicity of filter elements are arrayed on the substrate by using the head unit and the material is a filter material.

8. The method according to claim 7, wherein the multiplicity of filter elements are contained in a depressed portion formed by projected banks provided on the substrate, further comprising the steps of:
   introducing a bank material into the plurality of liquid droplet ejection heads before forming the filter elements; and
   scanning the plurality of liquid droplet ejection heads relative to the substrate through the head unit to selectively eject the bank material.

9. The method according to claim 8, wherein an overcoat film is formed to coat the multiplicity of filter elements and the banks, further comprising the steps of:
   introducing a translucent coating material into the plurality of liquid droplet ejection heads after forming the filter elements; and
   scanning the plurality of liquid droplet ejection heads relative to the substrate through the head unit to selectively eject the coating material.

10. The method according to claim 1, wherein the device is an organic EL in which a multiplicity of pixels inclusive of EL light emitting layers are arrayed on the substrate by using the head unit and the material is a light emitting material.

11. The method according to claim 10, wherein the multiplicity of EL light emitting layers are contained in a depressed portion formed by projecting banks provided on the substrate, further comprising the steps of:
introducing a bank material into the plurality of liquid droplet ejection head before forming said EL light emitting layers; and
scanning the plurality of liquid droplet ejection heads relative to the substrate through the head unit to selectively eject the bank material.

12. The method according to claim 11, wherein a multiplicity of pixel electrodes are formed corresponding to the EL light emitting layers between the multiplicity of EL light emitting layers and the substrate, further comprising the steps of:
introducing a liquid electrode material into the plurality of liquid droplet ejection head before forming the banks;
scanning the plurality of liquid droplet ejection heads relative to the substrate through the head unit to selectively eject the liquid electrode material.

13. The method according to claim 12, wherein opposite electrodes are formed so as to cover the multiplicity of EL light emitting layers and the banks, further comprising the steps of:
introducing a liquid electrode material into the plurality of liquid droplet ejection heads after forming the light emitting layers; and
scanning the plurality of liquid droplet ejection heads relative to the substrate through the head unit to selectively eject the liquid electrode material.

14. A method of forming a device, the method comprising the steps of:
introducing a material into a plurality of liquid droplet ejection heads; and
scanning the plurality of liquid droplet ejections heads relative to the substrate through a head unit to selectively eject the material, wherein the head unit includes a carriage with two members recognized for alignment, each member being disposed in an object set in position and having formed therein a mark for image-wise recognition, each member comprising a member main body formed substantially in a columnar shape and having a mirror-finished front end surface, wherein the marks are formed into a depressed shape in a substantially central part of the front end surface of each member main body and the marks are disposed at a distance from each other; and the plurality of liquid droplet ejection heads mounted on the carriage.

15. The method according to claim 14, wherein the device is a spacer in which a multiplicity of particulate spacers are formed to constitute minute cell gaps between two substrates by using the head unit, the material is a particulate material constituting the spacers and the plurality of liquid droplet ejection heads are scanned relative to at least one of the substrates through the head unit to selectively eject the particulate material.

16. The method according to claim 14, wherein the device is a metallic wire formed on the substrate by using the head unit and the material is a liquid metallic material.

17. The method according to claim 14, wherein the device is a multiplicity of microlenses formed on the substrate by using the head unit and the material is a lens material.

18. The method according to claim 14, wherein the device is a resist of an arbitrary shape formed on the substrate by using the head unit and the material is a resist material.

19. The method according to claim 14, wherein the device is a multiplicity of light diffusion members formed on a substrate by using the head unit and the material is a light diffusion material.

* * * * *